(12) United States Patent
Kanzawa et al.

(10) Patent No.: US 8,179,713 B2
(45) Date of Patent: May 15, 2012

(54) NONVOLATILE MEMORY ELEMENT, NONVOLATILE MEMORY DEVICE, AND NONVOLATILE SEMICONDUCTOR DEVICE

(75) Inventors: Yoshihiko Kanzawa, Osaka (JP); Satoru Mitani, Osaka (JP); Zhiqiang Wei, Osaka (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 326 days.

(21) Appl. No.: 12/671,162

(22) PCT Filed: May 18, 2009

(86) PCT No.: PCT/JP2009/002186
§ 371 (c)(1),
(2), (4) Date: Jan. 28, 2010

(87) PCT Pub. No.: WO2009/147790
PCT Pub. Date: Dec. 10, 2009

(65) Prior Publication Data
US 2010/0259966 A1    Oct. 14, 2010

(30) Foreign Application Priority Data
Jun. 3, 2008    (JP) ................. 2008-145415

(51) Int. Cl.
*G11C 11/00*    (2006.01)

(52) U.S. Cl. ...................... 365/148; 365/163

(58) Field of Classification Search .......... 365/148, 365/163
See application file for complete search history.

(56) References Cited

U.S. PATENT DOCUMENTS

| | | |
|---|---|---|
| 6,473,332 B1 | 10/2002 | Ignatiev et al. |
| 7,525,832 B2 | 4/2009 | Muraoka et al. |
| 2004/0114429 A1 | 6/2004 | Ehiro et al. |

(Continued)

FOREIGN PATENT DOCUMENTS

EP    1 643 508 A2    4/2006
(Continued)

OTHER PUBLICATIONS

I.G. Baek, "Highly Scalable Non-volatile Resistive Memory using Simple Binary Oxide Driven by Asymmetric Unipolar Voltage Pulses," 2004, IEEE.

(Continued)

*Primary Examiner* — Huan Hoang
(74) *Attorney, Agent, or Firm* — McDermott Will & Emery LLP

(57) ABSTRACT

A nonvolatile memory element comprises a first electrode (103), a second electrode (105), and a resistance variable layer (104) which is provided between the first electrode and the second electrode, and is configured to reversibly switch an interelectrode resistance value which is a resistance value between the first electrode and the second electrode, in response to an interelectrode voltage which is an electric potential of the second electrode on the basis of the first electrode, the resistance variable layer includes an oxygen-deficient transition metal oxide, the first electrode side and the second electrode side have an asymmetric structure, a portion of the resistance variable layer which is located at the first electrode side and a portion of the resistance variable layer which is located at the second electrode side are each configured to be selectively placed into one of a low-resistance state and a high-resistance state, so as to attain a stable state in three or more different interelectrode resistance values, the stable state being a state in which the interelectrode resistance value is invariable regardless of a change in the interelectrode voltage within a specified range.

44 Claims, 33 Drawing Sheets

U.S. PATENT DOCUMENTS

| | | |
|---|---|---|
| 2006/0071272 A1 | 4/2006 | Alvarado et al. |
| 2006/0097288 A1 | 5/2006 | Baek et al. |
| 2006/0160304 A1 | 7/2006 | Hsu et al. |
| 2008/0111245 A1 | 5/2008 | Osano et al. |
| 2008/0164455 A1 | 7/2008 | Alvarado et al. |
| 2008/0212359 A1 | 9/2008 | Muraoka et al. |
| 2009/0067215 A1 | 3/2009 | Muraoka et al. |
| 2009/0121823 A1 | 5/2009 | Kawano et al. |

FOREIGN PATENT DOCUMENTS

| | | |
|---|---|---|
| EP | 2 077 580 A1 | 7/2009 |
| JP | 2004-185756 | 2/2004 |
| JP | 2006-108670 | 4/2006 |
| JP | 2006-140464 | 6/2006 |
| JP | 2006-203178 | 8/2006 |
| JP | 2006-344876 | 12/2006 |
| JP | 2007-173515 | 7/2007 |
| JP | 2008-198275 | 8/2008 |
| WO | WO 2006/115208 A1 | 11/2006 |
| WO | WO 2008/038365 A1 | 4/2008 |
| WO | WO 2008/059701 A1 | 5/2008 |
| WO | WO 2009/041041 A1 | 4/2009 |
| WO | WO 2009/050833 A1 | 4/2009 |

OTHER PUBLICATIONS

Masayuki Fujimoto, "High-Speed Resistive Switching of $TiO_2$/TiN Nano-Crystalline Thin Film," Japanese Journal of Applied Physics, vol. 45, No. 11, 2006, pp. L310-L312.

An Chen, "Non-Volatile Resistive Switching for Advances Memory Applications," 2005, IEEE.

X Chen, "A study of the symmetry properties and multi-state nature of perovskite oxide-based electrical pulse induced resistance-change devices," New Journal of Physics 8, 2006, 229.

(a)

(b)

(c)

(d)

(e)

(f)

(g)

(h)

(a)

(b)

NONVOLATILE MEMORY ELEMENT, NONVOLATILE MEMORY DEVICE, AND NONVOLATILE SEMICONDUCTOR DEVICE

RELATED APPLICATIONS

This application is the U.S. National Phase under 35 U.S.C. §371 of International Application No. PCT/JP2009/002186, filed on May 18, 2009, which in turn claims the benefit of Japanese Application No. 2008-145415, filed on Jun. 3, 2008, the disclosures of which Applications are incorporated by reference herein.

TECHNICAL FIELD

The present invention relates to a nonvolatile memory element, a nonvolatile memory device, and a nonvolatile semiconductor device. The present invention relates to a resistance variable nonvolatile memory element which switches a resistance value in response to an electric signal applied, and a nonvolatile memory device and nonvolatile semiconductor device incorporating the nonvolatile memory element.

BACKGROUND ART

With recent advancement of digital technologies, electronic hardware such as portable information devices and home information appliances have been developed to provide higher functionality. For this reason, demands for an increase in a capacity of a nonvolatile memory element, reduction in a write electric power in the memory element, reduction in write/read time in the memory element, and longer life of the memory element have been increasing.

Under the circumstances in which there are such demands, it is said that there is a limitation on miniaturization of an existing flash memory using a floating gate. Accordingly, in recent years, a novel nonvolatile memory element (resistance variable memory) using a resistance variable layer as a material of a memory section has attracted an attention.

The resistance variable memory includes a memory element having a very simple structure in which a resistance variable layer is sandwiched between electrodes. The resistance variable layer switches reversibly among plural resistance states having different resistance values in response to a predetermined electric pulse applied between electrodes. The plural resistance states are used to store numeric value data. Because of the simplicity in structure and operation, it is expected that the resistance variable memory can achieve further miniaturization, a higher speed and lower electric power consumption.

The materials used as the resistance variable layer are roughly classified into two kinds. One kind of materials are oxides of transition metals (Ni, Nb, Ti, Zr, Hf, Co, Fe, Cu, Cr, etc) disclosed in Patent document 1 and Non-patent documents 1 to 3. In particular, they are oxides (hereinafter referred to as oxygen-deficient oxides) which are deficient in oxygen content in terms of a stoichiometric composition. The other kind of materials are perovskite materials ($Pr_{(1-x)}CaXMnO_3$ (PCMO), $LaSR_{Mn}O_3$ (LSMO), $GdBaCo_xO_y$ (GBCO). Patent documents 2 and 3 and Non-patent document 4, and the like disclose techniques for using the latter materials as elements capable of storing binary data (two states of low-resistance state and high-resistance states) and as elements capable of storing multi-valued data of three or more values.

FIG. 35 is a view showing an example of resistance switching of an element comprising PCMO in response to electric pulses, which is disclosed in Patent document 2. As can be seen from FIG. 35, by applying an electric pulse with a predetermined polarity, voltage and pulse width, a predetermined number of times, to an element being in an initial state and having a resistance value of about 500Ω, the resistance value increases or decreases. The resistance value switches such that substantially continuous values are attainable. It is disclosed that by selectively using the three or more states having different resistance values and corresponding three or more different numeric values to the associated resistance values, it is possible to attain a multi-valued memory element.

FIG. 36 is a view showing the relationship between the resistance value of the nonvolatile memory element using the PCMO or the like, applied voltage and resistance value which is disclosed in Patent document 3. In the example shown in FIG. 36, each electric pulse is applied once. As can be seen from FIG. 36, the resistance value of the element switches substantially continuously according to the voltage value of the electric pulse applied. As in the configuration disclosed in Patent document 2, Patent document 3 discloses that it is possible to attain a multi-valued memory element.

PRIOR ART DOCUMENTS

Patent Documents

Patent document 1: Japanese Laid-Open Patent Application Publication No. 2006-140464
Patent document 2: U.S. Pat. No. 6,473,332 specification
Patent document 3: Japanese Laid-Open Patent Application Publication No. 2004-185756

Non-Patent Documents

Non-patent document 1: I. G. Beak et al., Tech. Digest IEDM 2004, page 587
Non-patent document 2: Japanese Journal of Applied Physics Vol. 45, 2006, page L310
Non-patent document 3: A. Chen et al., Tech. Digest IEDM 2005, page 746
Non-patent document 4: X. Chen et al., New Journal of Physics Vol. 8. 2006, page 229

SUMMARY OF THE INVENTION

Problems to be Solved by the Invention

In a multi-valued memory element using three or more resistance states, which of the resistance states the element is placed in is determined by reading the resistance value of the element. In order to prevent an incorrect operation, it is required that there be a certain difference between the resistance values corresponding to the respective resistance states. However, in the elements disclosed in Patent document 2 and Patent document 3, the resistance value switches continuously, depending on the voltage, pulse width, and the number of times of the electric pulse applied. For this reason, the attained resistance values are inconstant and unstable, due to unevenness of the elements, electric pulse voltages, pulse widths and the number of application, even though the same electric pulse is applied. In addition, the resistance values of the memory elements are not always sufficiently stable. For these reasons, when a difference between the resistance values corresponding to the respective resistance states is small, the set resistance values sometimes switch to ones which could be regarded as other states due to a change in a temperature or the like of the states. As should be appreciated, it is difficult to operate the conventional memory elements stably as the nonvolatile memory element for storing multi-valued data.

Non-patent document 4 discloses a potential to achieve a four-valued memory element which is different in concept from those disclosed in the above identified two documents. This document discloses a nonvolatile memory element having a structure in which PCMO is sandwiched between electrodes. FIG. 37 is a view showing the relationship between the voltages and resistances associated with the element of Non-patent document 4. As shown in FIG. 37, this element has four stable states which are LL+, HL+, HL−, and HH−. FIG. 37 shows a technique for achieving a four-valued memory using these stable states. In this case, the stable states are allowed to correspond to the respective memory states. For this reason, the attained resistance values may be relatively stable, and it may be easy to enable this nonvolatile memory element to operate stably as a nonvolatile memory element. However, Non-patent document 4 merely discloses a concept of the four-valued memory but fails to explicitly disclose a method for manufacturing the memory element having a characteristic in which the voltages and the resistance values are illustrated in FIG. 37.

The present invention is directed to solving the above mentioned problem and an object of the present invention is to provide a nonvolatile memory element capable of stably writing and reading multi-valued data, a nonvolatile memory device and nonvolatile semiconductor device incorporating the nonvolatile memory element.

Means for Solving the Problem

To solve the above described problem, a nonvolatile memory element of the present invention comprises a first electrode; a second electrode; and a resistance variable layer which is provided between the first electrode and the second electrode, and is configured to reversibly switch an interelectrode resistance value which is a resistance value between the first electrode and the second electrode, in response to an interelectrode voltage which is an electric potential of the second electrode on the basis of the first electrode; wherein the resistance variable layer includes an oxygen-deficient transition metal oxide; wherein the first electrode side and the second electrode side have an asymmetric structure; wherein a portion of the resistance variable layer which is located at the first electrode side and a portion of the resistance variable layer which is located at the second electrode side are each configured to be selectively placed into one of a low-resistance state and a high-resistance state, so as to attain a stable state in three or more different interelectrode resistance values, the stable state being a state in which the interelectrode resistance value is invariable regardless of a change in the interelectrode voltage within a specified range.

In such a configuration, it is possible to attain a nonvolatile memory element capable of stably writing and reading multi-valued data.

In the nonvolatile memory element, the oxygen-deficient transition metal oxide may have an amorphous structure.

The first electrode side and the second electrode side may have an asymmetric structure such that the first electrode and the second electrode are made of different materials. The first electrode side and the second electrode side may have an asymmetric structure such that an oxygen content of a portion of the resistance variable layer which is located in the vicinity of the first electrode is different from an oxygen content of a portion of the resistance variable layer which is located in the vicinity of the second electrode. The first electrode side and the second electrode side may have an asymmetric structure such that an area of a portion of the resistance variable layer which is in contact with the first electrode is different from an area of a portion of the resistance variable layer which is in contact with the second electrode.

In such a configuration, it is possible to attain a nonvolatile memory element capable of stably writing and reading multi-valued data, by utilizing the electrode material, the oxygen content of the resistance variable layer and the area of the portion of the resistance variable layer which is in contact with the electrode.

A nonvolatile memory device of the present invention comprises the above described nonvolatile memory element; and a controller configured to control the interelectrode voltage. The controller may be configured to make the interelectrode voltage different based on the interelectrode resistance value such that the interelectrode resistance value conforms to one of at least three resistance values, to store data more than binary data in a single nonvolatile memory element.

In such a configuration, it is possible to attain a nonvolatile memory device capable of stably writing and reading multi-valued data.

In the nonvolatile memory element, the first electrode and the second electrode may include a material selected from a group consisting of Pt, Ir, Au, Ag, Cu, W, Ni, and TaN.

In the nonvolatile memory element, one of the first electrode and the second electrode may include W and the other of the first electrode and the second electrode may include Pt.

In such a configuration, it is possible to attain a nonvolatile memory element capable of stably writing and reading multi-valued data, by selecting an appropriate electrode material.

In the nonvolatile memory element, preferably, the oxygen-deficient transition metal oxide is a tantalum oxide. More preferably, the oxygen-deficient transition metal oxide is configured to satisfy $0<x<2.5$ when the tantalum oxide is expressed as TaOx. More preferably, the oxygen-deficient transition metal oxide is configured to satisfy $0.8 \leq x \leq 1.9$ when the tantalum oxide is expressed as TaOx.

In such a configuration, it is possible to attain a nonvolatile memory element having very good characteristics, which are high-speed operability, a reversible and stable rewrite characteristic, a good resistance value retention characteristic, and high compatibility with a semiconductor manufacturing step, and is capable of stably writing and reading multi-valued data.

The nonvolatile memory element may be configured such that in $V_\alpha$, $V_\beta$, $V_\gamma$, $R_L$, $R_M$, and $R_H$ satisfying $V_\alpha<V_\beta<V_\gamma$, $V_\alpha<0$, $V_\gamma>0$, and $R_L<R_M<R_H$, the interelectrode resistance value becomes $R_L$ or $R_M$ when the interelectrode voltage is set to $V_\alpha$, the interelectrode resistance value becomes $R_M$ or $R_H$ when the interelectrode voltage is set to $V_\beta$, and the interelectrode resistance value becomes $R_L$ or $R_H$ when the interelectrode voltage is set to $V_\gamma$.

The nonvolatile memory element may be configured such that in $V_1, V_2, V_3, V_4, V_5, V_6, V_7, V_8, V_9, V_{10}, R_L, R_M,$ and $R_H$ satisfying $V_1<V_2<V_3<V_4<V_5<0<V_6<V_7<V_8<V_9<V_{10}$ and $R_L<R_M<R_H$, the interelectrode resistance value becomes $R_M$ when the interelectrode voltage is set to $V_1$, then, the interelectrode resistance value decreases when the interelectrode voltage is set higher than $V_6$ and lower than $V_7$, then, the interelectrode resistance value becomes $R_L$ when the interelectrode voltage is set to $V_8$, then, the interelectrode resistance value increases when the interelectrode voltage is set higher than $V_9$ and lower than $V_{10}$, then, the interelectrode resistance value becomes $R_H$ when the interelectrode voltage is set to $V_{10}$, then, the interelectrode resistance value decreases when the interelectrode voltage is set lower than $V_5$ and higher than $V_4$, then, the interelectrode resistance value becomes $R_L$ when the interelectrode voltage is set to $V_3$, and then, the interelectrode resistance value increases when the interelectrode voltage is set lower than $V_2$ and higher than $V_1$.

The nonvolatile memory element may be configured such that in $V_\alpha$, $V_\beta$, $V_\gamma$, $R_L$, $R_M$, and $R_H$ satisfying $V_\alpha < V_\beta < V_\gamma$, $V_\alpha < 0$, $V_\gamma > 0$, and $R_L < R_M < R_H$, the interelectrode resistance value becomes $R_L$ or $R_H$ when the interelectrode voltage is set to $V_\alpha$, the interelectrode resistance value becomes $R_M$ or $R_H$ when the interelectrode voltage is set to $V_\beta$, and the interelectrode resistance value becomes $R_L$ or $R_M$ when the interelectrode voltage is set to $V_\gamma$.

The nonvolatile memory element may be configured such that in $V_1$, $V_2$, $V_3$, $V_4$, $V_5$, $V_6$, $V_7$, $V_8$, $V_9$, $V_{10}$, $R_L$, $R_M$, and $R_H$ satisfying $V_1 < V_2 < V_3 < V_4 < V_5 < 0 < V_6 < V_7 < V_8 < V_9 < V_{10}$, and $R_L < R_M < R_H$, the interelectrode resistance value becomes $R_H$ when the interelectrode voltage is set to $V_1$, then, the interelectrode resistance value decreases when the interelectrode voltage is set higher than $V_6$ and lower than $V_7$, then, the interelectrode resistance value becomes $R_L$ when the interelectrode voltage is set to $V_8$, then, the interelectrode resistance value increases when the interelectrode voltage is set higher than $V_9$ and lower than $V_{10}$, then, the interelectrode resistance value becomes $R_M$ when the interelectrode voltage is set to $V_{10}$, then, the interelectrode resistance value decreases when the interelectrode voltage is set lower than $V_5$ and higher than $V_4$, then, the interelectrode resistance value becomes $R_L$ when the interelectrode voltage is set to $V_3$, and then, the interelectrode resistance value increases when the interelectrode voltage is set lower than $V_2$ and higher than $V_1$.

In the nonvolatile memory element, the first electrode and the second electrode are made of different materials.

In the nonvolatile memory element, an oxygen content of a portion of the resistance variable layer which is located in the vicinity of the first electrode may be different from an oxygen content of a portion of the resistance variable layer which is located in the vicinity of the second electrode.

The nonvolatile memory element may be configured such that in $V_\alpha$, $V_\beta$, $V_\gamma$, $R_L$, $R_M$, and $R_H$ satisfying $V_\alpha < V_\beta < V_\gamma$, $V_\alpha < 0$, $V_\gamma > 0$, and $R_L < R_M < R_H$, the interelectrode resistance value becomes $R_L$ or $R_M$ when the interelectrode voltage is set to $V_\alpha$, the interelectrode resistance value becomes $R_M$ when the interelectrode voltage is set to $V_\beta$, and the interelectrode resistance value becomes $R_M$ or $R_H$ when the interelectrode voltage is set to $V_\gamma$.

The nonvolatile memory element may be configured such that in $V_1$, $V_2$, $V_3$, $V_4$, $V_5$, $V_6$, $V_7$, $V_8$, $V_9$, $V_{10}$, $R_L$, $R_M$, and $R_H$ satisfying $V_1 < V_2 < V_3 < V_4 < V_5 < 0 < V_6 < V_7 < V_8 < V_9 < V_{10}$, and $R_L < R_M < R_H$, the interelectrode resistance value becomes $R_M$ when the interelectrode voltage is set to $V_1$, then, the interelectrode resistance value increases when the interelectrode voltage is set higher than $V_6$ and lower than $V_7$, then, the interelectrode resistance value becomes $R_H$ when the interelectrode voltage is set to $V_8$, then, the interelectrode resistance value decreases when the interelectrode voltage is set higher than $V_9$ and lower than $V_{10}$, then, the interelectrode resistance value becomes $R_M$ when the interelectrode voltage is set to $V_{10}$, then, the interelectrode resistance value decreases when the interelectrode voltage is set lower than $V_5$ and higher than $V_4$, then, the interelectrode resistance value becomes $R_L$ when the interelectrode voltage is set to $V_3$, and then, the interelectrode resistance value increases when the interelectrode voltage is set lower than $V_2$ and higher than $V_1$.

The nonvolatile memory element may be configured such that in $V_\alpha$, $V_\beta$, $V_\gamma$, $R_L$, $R_M$, and $R_H$ satisfying $V_\alpha < V_\beta < V_\gamma$, $V_\alpha < 0$, $V_\gamma > 0$, and $R_L < R_M < R_H$, the interelectrode resistance value becomes $R_M$ or $R_H$ when the interelectrode voltage is set to $V_\alpha$, the interelectrode resistance value becomes $R_M$ when the interelectrode voltage is set to $V_\beta$, and the interelectrode resistance value becomes $R_L$ or $R_M$ when the interelectrode voltage is set to $V_\gamma$.

The nonvolatile memory element may be configured such that in $V_1$, $V_2$, $V_3$, $V_4$, $V_5$, $V_6$, $V_7$, $V_8$, $V_9$, $V_{10}$, $R_L$, $R_M$, and $R_H$ satisfying $V_1 < V_2 < V_3 < V_4 < V_5 < 0 < V_6 < V_7 < V_8 < V_9 < V_{10}$, and $R_L < R_M < R_H$, the interelectrode resistance value becomes $R_M$ when the interelectrode voltage is set to $V_1$, then, the interelectrode resistance value decreases when the interelectrode voltage is set higher than $V_6$ and lower than $V_7$, then, the interelectrode resistance value becomes $R_L$ when the interelectrode voltage is set to $V_8$, then, the interelectrode resistance value increases when the interelectrode voltage is set higher than $V_9$ and lower than $V_{10}$, then, the interelectrode resistance value becomes $R_M$ when the interelectrode voltage is set to $V_{10}$, then, the interelectrode resistance value increases when the interelectrode voltage is set lower than $V_5$ and higher than $V_4$, then, the interelectrode resistance value becomes $R_H$ when the interelectrode voltage is set to $V_3$, and then, the interelectrode resistance value decreases when the interelectrode voltage is set lower than $V_2$ and higher than $V_1$.

In the nonvolatile memory element, an area of a portion of the resistance variable layer which is in contact with the first electrode may be different from an area of a portion of the resistance variable layer which is in contact with the second electrode.

The nonvolatile memory element may be configured such that in $V_\alpha$, $V_\beta$, $V_\gamma$, $R_L$, $R_{M1}$, $R_{M2}$ and $R_H$ satisfying $V_\alpha < V_\beta < V_\gamma$, $V_\alpha < 0$, $V_\gamma > 0$, and $R_L < R_{M1} < R_{M2} < R_H$, the interelectrode resistance value becomes $R_L$ or $R_{M1}$ when the interelectrode voltage is set to $V_\alpha$, the interelectrode resistance value becomes $R_{M1}$ or $R_{M2}$ when the interelectrode voltage is set to $V_\beta$, and the interelectrode resistance value becomes $R_{M2}$ or $R_H$ when the interelectrode voltage is set to $V_\gamma$.

The nonvolatile memory element may be configured such that in $V_1$, $V_2$, $V_3$, $V_4$, $V_5$, $V_6$, $V_7$, $V_8$, $V_9$, $V_{10}$, $R_L$, $R_{M1}$, $R_{M2}$, and $R_H$ satisfying $V_1 < V_2 < V_3 < V_4 < V_5 < 0 < V_6 < V_7 < V_8 < V_9 < V_{10}$, and $R_L < R_{M1} < R_{M2} < R_H$, the interelectrode resistance value becomes $R_{M1}$ when the interelectrode voltage is set to $V_1$, then, the interelectrode resistance value increases when the interelectrode voltage is set higher than $V_6$ and lower than $V_7$, then, the interelectrode resistance value becomes $R_H$ when the interelectrode voltage is set to $V_8$, then, the interelectrode resistance value decreases when the interelectrode voltage is set higher than $V_9$ and lower than $V_{10}$, then, the interelectrode resistance value becomes $R_{M2}$ when the interelectrode voltage is set to $V_{10}$, then, the interelectrode resistance value decreases when the interelectrode voltage is set lower than $V_5$ and higher than $V_4$, then, the interelectrode resistance value becomes $R_L$ when the interelectrode voltage is set to $V_3$, and then, the interelectrode resistance value increases when the interelectrode voltage is set lower than $V_2$ and higher than $V_1$.

The nonvolatile memory element may be configured such that in $V_\alpha$, $V_\beta$, $V_\gamma$, $R_L$, $R_{M1}$, $R_{M2}$ and $R_H$ satisfying $V_\alpha < V_\beta < V_\gamma$, $V_\alpha < 0$, $V_\gamma > 0$, and $R_L < R_{M1} < R_{M2} < R_H$, the interelectrode resistance value becomes $R_{M2}$ or $R_H$ when the interelectrode voltage is set to $V_\alpha$, the interelectrode resistance value becomes $R_{M1}$ or $R_{M2}$ when the interelectrode voltage is set to $V_\beta$, and the interelectrode resistance value becomes $R_L$ or $R_{M1}$ when the interelectrode voltage is set to $V_\gamma$.

The nonvolatile memory element may be configured such that in $V_1$, $V_2$, $V_3$, $V_4$, $V_5$, $V_6$, $V_7$, $V_8$, $V_9$, $V_{10}$, $R_L$, $R_{M1}$, $R_{M2}$ and $R_H$ satisfying $V_1 < V_2 < V_3 < V_4 < V_5 < 0 < V_6 < V_7 < V_8 < V_9 < V_{10}$, and $R_L < R_{M1} < R_{M2} < R_H$, the interelectrode resistance value becomes $R_{M2}$ when the interelectrode voltage is set to $V_1$, then, the interelectrode resistance value decreases when the interelectrode voltage is set higher than $V_6$ and lower than $V_7$, then, the interelectrode resistance value becomes $R_L$ when the interelectrode voltage is set to $V_8$, then, the interelectrode resistance value increases when the interelectrode voltage is set higher than $V_9$ and lower than $V_{10}$, then, the interelectrode resistance value becomes $R_{M1}$ when the interelectrode voltage is set to $V_{10}$, then, the interelectrode resistance value increases when the interelectrode voltage is set lower than $V_5$ and higher than $V_4$, then, the interelectrode resistance value becomes $R_H$ when the interelectrode voltage is set to $V_3$, and then, the interelectrode resistance value decreases when the interelectrode voltage is set lower than $V_2$ and higher than $V_1$.

In the nonvolatile memory element, the first electrode and the second electrode are made of different materials, and an area of a portion of the resistance variable layer which is in contact with the first electrode may be different from an area of a portion of the resistance variable layer which is in contact with the second electrode.

In the nonvolatile memory element, an oxygen content of a portion of the resistance variable layer which is located in the vicinity of the first electrode is different from an oxygen content of a portion of the resistance variable layer which is located in the vicinity of the second electrode, and an area of a portion of the resistance variable layer which is in contact with the first electrode is different from an area of a portion of the resistance variable layer which is in contact with the second electrode.

In the nonvolatile memory element, the oxygen-deficient transition metal oxide may be tantalum oxide.

A nonvolatile memory device of the present invention comprises a memory array including plural first electrode wires formed so as to extend in parallel with each other on a first plane, plural second electrode wires formed so as to extend in parallel with each other on a second plane parallel to the first plane and so as to three-dimensionally cross the plural first electrode wires, and nonvolatile memory elements arranged so as to respectively correspond to three-dimensional cross points between the plural first electrode wires and the plural second electrode wires; wherein each of the nonvolatile memory elements includes a resistance variable layer which is provided between the first electrode wire and the second electrode wire, and is configured to reversibly switch an inter-electrode-wire resistance value which is a resistance value between the first electrode wire and the second electrode wire, in response to an inter-electrode-wire voltage which is an electric potential of the second electrode wire on the basis of the first electrode wire; wherein the resistance variable layer includes an oxygen-deficient transition metal oxide; wherein the nonvolatile memory element has an asymmetric structure at the first electrode wire side and at the second electrode wire side; and wherein the nonvolatile memory element may be configured to attain a stable state in three or more different inter-electrode-wire resistance values, the stable state being a state in which the inter-electrode-wire resistance value is invariable regardless of a change in the inter-electrode-wire voltage within a specified range.

In the nonvolatile memory device, each of the nonvolatile memory elements may include a first electrode connected to the first electrode wire and a second electrode connected to the second electrode wire; and the resistance variable layer may be provided between the first electrode and the second electrode and may be configured to reversibly switch an interelectrode resistance value which is a resistance value between the first electrode and the second electrode, in response to an interelectrode voltage which is an electric potential of the second electrode on the basis of the first electrode.

In the nonvolatile memory device, each of the nonvolatile memory elements may include a current suppressing element between the first electrode wire and the second electrode wire; and the current suppressing element may be electrically connected to the resistance variable layer.

The nonvolatile memory device may comprise a multi-layer memory array in which plural layers of the memory array are stacked.

The nonvolatile memory device comprises a semiconductor substrate; plural word lines and plural bit lines which are provided on the semiconductor substrate and are arranged on the semiconductor substrate such that the plural word lines and the plural bit lines cross each other; plural transistors provided to respectively correspond to cross points between the plural word lines and the plural bit lines; and plural nonvolatile memory elements provided to respectively correspond to the plural transistors such that one nonvolatile memory element corresponds to one transistor. Each of the nonvolatile memory elements may include a first electrode, a second electrode, and a resistance variable layer which is provided between the first electrode and the second electrode and is configured to reversibly switch an interelectrode resistance value which is a resistance value between the first electrode and the second electrode, in response to an interelectrode voltage which is an electric potential of the second electrode on the basis of the first electrode. The resistance variable layer may comprise an oxygen-deficient transition metal oxide. The nonvolatile memory element may have an asymmetric structure at the first electrode wire side and at the second electrode wire side. The nonvolatile memory element may be configured to attain a stable state in three or more different interelectrode resistance values, the stable state being a state in which the interelectrode resistance value is invariable regardless of a change in the interelectrode voltage within a specified range.

A nonvolatile semiconductor device of the present invention comprises a semiconductor substrate; a logic circuit provided on the semiconductor substrate, for executing predetermined calculation; and a nonvolatile memory element provided on the semiconductor substrate and having a programming function; wherein the nonvolatile memory element includes a first electrode, a second electrode, and a resistance variable layer which is provided between the first electrode and the second electrode and is configured to reversibly switch an interelectrode resistance value which is a resistance value between the first electrode and the second electrode, in response to an interelectrode voltage which is an electric potential of the second electrode on the basis of the first electrode; wherein the resistance variable layer comprises an oxygen-deficient transition metal oxide; wherein the nonvolatile memory element has an asymmetric structure at the first electrode wire side and at the second electrode wire side; and wherein the nonvolatile memory element is configured to attain a stable state in three or more different interelectrode resistance values, the stable state being a state in which the interelectrode resistance value is invariable regardless of a change in the interelectrode voltage within a specified range.

A nonvolatile semiconductor device of the present invention may comprise the above mentioned nonvolatile semiconductor device; and the above mentioned nonvolatile memory device.

In the nonvolatile memory element and the nonvolatile memory device, the oxygen-deficient transition metal oxide is preferably a tantalum oxide, the oxygen-deficient transition metal oxide is configured to satisfy more preferably 0<x<2.5 and most preferably $0.8 \leq x \leq 1.9$ when the tantalum oxide is expressed as TaOx.

In such a configuration, it is possible to attain a nonvolatile memory element having very good characteristics, which are high-speed operability, a reversible and stable rewrite characteristic, a good resistance value retention characteristic, and high compatibility with a semiconductor manufacturing step, and is capable of stably writing and reading multi-valued data.

Effects of the Invention

The present invention has the above described configuration and achieves the advantages below. That is, it is possible to provide a nonvolatile memory element which is capable of stably writing and reading multi-valued data, and a nonvolatile memory device and nonvolatile semiconductor device incorporating the nonvolatile memory element.

BRIEF DESCRIPTION OF THE DRAWINGS

FIG. 3 is a schematic view showing an example of a characteristic of the nonvolatile memory element according to Embodiment 1 of the present invention, in which FIG. 3(a) is a view showing switching of a resistance value occurring when the voltage of an upper electrode with respect to a lower electrode is changed continuously between $V_{A1}$ and $V_{A4}$, and FIG. 3(b) is a view showing switching of a resistance value occurring when the voltage of the upper electrode with respect to the lower electrode is changed continuously between $V_{B1}$ and $V_{B4}$, and FIG. 3(c) is a view showing switching of a resistance value occurring when the voltage of the upper electrode with respect to the lower electrode is changed continuously between $V_{A1}$ and $V_{B4}$.

FIG. 4 is a schematic view showing an example of a characteristic of the nonvolatile memory element in which a lower electrode and an upper electrode are made of the same material and are formed to be symmetric at the lower electrode side and at the upper electrode side, in which FIG. 4(a) is a view showing switching of a resistance value occurring when the voltage of the upper electrode with respect to the lower electrode is changed continuously between $V_{A1}$ and $V_{A4}$, and FIG. 4(b) is a view showing switching of a resistance value occurring when the voltage of the upper electrode with respect to the lower electrode is changed continuously between $V_{B1}$ and $V_{B4}$, and FIG. 4(c) is a view showing switching of a resistance value occurring when the voltage of the upper electrode with respect to the lower electrode is changed continuously between $V_{A1}$ and $V_{B4}$.

FIG. 5 is a view showing a characteristic of a nonvolatile memory element of example 1 of the present invention, in which FIG. 5(a) is a view showing switching of a resistance value occurring when the voltage of an upper electrode with respect to a lower electrode is changed continuously between −3V and +2V, FIG. 5(b) is a view showing switching of a resistance value occurring when the voltage of the upper electrode with respect to the lower electrode is changed continuously between −2V and +3V, and FIG. 5(c) is a view showing switching of a resistance value occurring when the voltage of the upper electrode with respect to the lower electrode is changed continuously between −3V and +3V.

FIG. 8 is a view showing switching of the resistance values of nonvolatile memory elements, in which FIG. 8(a) shows switching of the resistance value of an element having an upper electrode made of platinum (Pt), FIG. 8(b) shows switching of the resistance value of an element having an upper electrode made of iridium (Ir), FIG. 8(c) shows switching of the resistance value of an element having an upper electrode made of gold (Au), FIG. 8(d) shows switching of the resistance value of an element having an upper electrode made of silver (Ag), FIG. 8(e) shows switching of the resistance value of an element having an upper electrode made of copper (Cu), FIG. 8(f) shows switching of the resistance value of the element having an upper electrode made of tungsten (W), FIG. 8(g) shows switching of the resistance value of an element having an upper electrode made of nickel (Ni), and FIG. 8(h) shows switching of the resistance value of an element having an upper electrode made of tantalum nitride (TaN).

FIG. 14 is a view showing a resistance variable characteristic in a case where an oxygen content of a resistance variable layer is in a content range of 45~65 atm %, in which FIG. 14(a) is a view showing the relationship between the oxygen content and the resistivity, FIG. 14(b) is a view showing the relationship between the number of pulse application and the resistance value in a case where the oxygen content is 45 atm %, and FIG. 14(c) is a view showing the relationship between the number of pulse application and the resistance value in a case where the oxygen content is 65 atm %.

FIG. 19 is a schematic view showing an example of a characteristic of the nonvolatile memory element according to Embodiment 3 of the present invention, in which FIG. 19(a) is a view showing switching of a resistance value occurring assuming that the upper electrode side retains a low-resistance state and does not switch when the voltage of an upper electrode with respect to a lower electrode is changed continuously between $V_{A1}$ and $V_{A4}$, FIG. 19(b) is a view showing switching of a resistance value occurring assuming that the lower electrode side retains a low-resistance state and does not switch when the voltage of the upper electrode with respect to the lower electrode is changed continuously between $V_{B1}$ and $V_{B4}$, and FIG. 19(c) is a view showing switching of a resistance value of the whole nonvolatile memory element occurring when the voltage of the upper electrode with respect to the lower electrode is changed continuously between $V_{A1}$ and $V_{A4}$.

FIG. 20 is a view showing a characteristic of a nonvolatile memory element of experiment example 2 of the present invention, in which FIG. 20(a) is a view showing switching of a resistance value occurring when the voltage of an upper electrode with respect to a lower electrode is changed continuously between −1.4V and +1.4V, in a nonvolatile memory element in which a contact area of a resistance variable layer and the upper electrode is 0.25 µm², and FIG. 20(b) is a view showing switching of a resistance value occurring when the voltage of the upper electrode with respect to the lower electrode is changed continuously between −2V and +3V, in a nonvolatile memory element in which a contact area of a resistance variable layer and the upper electrode is 1.25 µm². The voltage application method is identical to that of example 1. FIGS. 20(a) and 20(b) show cases (cases where the resistance state at the upper electrode side switches), where the element switches to a high-resistance state in response to a plus voltage.

FIG. 22 is a view showing an example of a characteristic of the nonvolatile memory element according to Embodiment 4 of the present invention, in which FIG. 22(a) is a conceptual view showing switching of a resistance value occurring assuming that an upper electrode side retains a low-resistance state and does not switch when the voltage of an upper electrode with respect to a lower electrode is changed continuously between $V_{A1}$ and $V_{A4}$, FIG. 22(b) is a conceptual view showing switching of a resistance value occurring assuming that the lower electrode side retains a low-resistance state and does not switch when the voltage of the upper electrode with respect to the lower electrode is changed continuously between $V_{B1}$ and $V_{134}$, and FIG. 22(c) is a view showing switching of a resistance value of the whole nonvolatile memory element occurring when the voltage of the upper electrode with respect to the lower electrode is changed continuously between $V_{A1}$ and $V_{A4}$. Hereinafter, the electric characteristic of a nonvolatile memory element 150 will be described with reference to FIG. 22.

EMBODIMENTS FOR CARRYING OUT THE INVENTION

Hereinafter, embodiments of the present invention will be described with reference to the drawings.

Experiment Example 1

Experiment for Specifying a Portion of an Element in Which Resistance State Switches Initially, description will be given of a result of an experiment conducted to confirm a portion of a nonvolatile memory element in which resistance state switches, in response to an electric pulse applied between an upper electrode and a lower electrode of the nonvolatile memory element.

Figure 1:
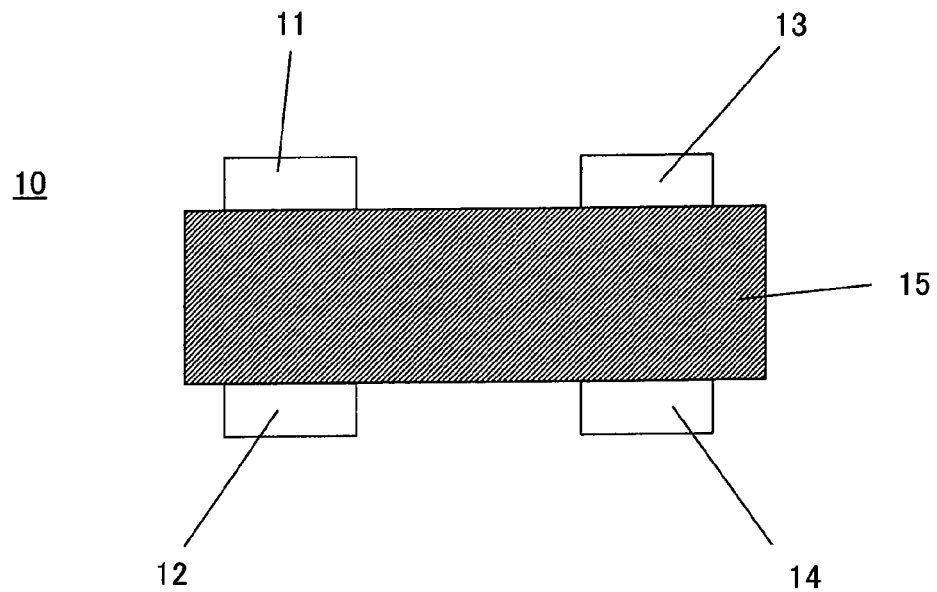
FIG. 1 is a schematic view of an element 10 manufactured for an experiment example 1.

FIG. 1 is a schematic view of an element 10 manufactured for the experiment example 1. The element 10 had a configuration in which a resistance variable layer 15 was sandwiched between two upper electrodes 11 and 13 which were isolated from each other and two lower electrodes 12 and 14 which were isolated from each other. The resistance variable layer 15 was a 100 nm-thick oxygen-deficient tantalum (Ta) oxide layer. The electrodes were made of Pt. The electrode 11 and the electrode 12 were disposed opposite to each other via the resistance variable layer 15, while the electrode 13 and the electrode 14 were disposed opposite to each other via the resistance variable layer 15. The manufacturing method of the element is substantially identical to that of the Embodiment 1 (as described later) except for the electrode material and shape of the element.

Electric pulses with voltages of +2.2V and −1.8V and a pulse width of 100 nsec were applied alternately to the electrode 11 on the basis of the electrode 12 in the element 10 configured as described above. After every application, the resistance value between the electrodes was measured for electrode pairs (between the electrode 11 and the electrode 12, between the electrode 11 and the electrode 13, between the electrode 11 and the electrode 14, between the electrode 12 and the electrode 13, between the electrode 12 and the electrode 14, and between the electrode 13 and the electrode 14) which are two electrodes selected from among the four electrodes. Average values of the resistance values are illustrated in table 1.

TABLE 1

| | Resistance value(Ω) generated by applying +2.2 V to electrode 11 on the basis of electrode 12 | Resistance value(Ω) generated by applying −1.8 V to electrode 11 on the basis of electrode 12 |
|---|---|---|
| Between electrodes 11 and 12 | 546 | 262 |
| Between electrodes 11 and 13 | 1351 | 1276 |
| Between electrodes 11 and 14 | 1075 | 828 |
| Between electrodes 12 and 13 | 1153 | 1153 |
| Between electrodes 12 and 14 | 704 | 704 |
| Between electrodes 13 and 14 | 698 | 698 |

As can be seen from the results illustrated in the table, switching of the resistance value occurred only in the electrode pairs including the electrode 11 and the resistance value did not substantially switch in the electrode pairs which did not include the electrode 11. From this fact, it was found that resistance state switched only in the region in the vicinity of the electrode 11 in response to the voltages applied between the electrode 11 and the electrode 12 and the resistance value between the electrodes of the electrode pairs including the electrode 11 switched.

From the above result, it should be understood that in the nonvolatile memory element including the resistance variable layer made of the oxygen-deficient Ta oxide, resistance state switches only in a region in the vicinity of the electrode in the resistance variable layer. Also, it can be seen that the element 10 switches to a high-resistance state in response to a high voltage applied to the electrode 11 on the basis of the electrode 12. Therefore, it should be understood that the resistance state switches in the region in the vicinity of the electrode (electrode at a higher electric potential side) placed at a higher electric potential when the element switches to a high-resistance state.

By utilizing the fact that the resistance state switches only in the region in the vicinity of the electrode at the higher electric potential side and the fact that the region in the vicinity of each electrode has two stable states which are a high-resistance state and a low-resistance state, there are theoretically four resistance values between the electrodes (interelectrode resistance values) in the nonvolatile memory elements in which the Ta oxide is sandwiched between a pair of electrodes. The first resistance state is defined as the state where the upper electrode side and the lower electrode side are in the low-resistance state. The second resistance state is defined as the state where the lower electrode side is in the high-resistance state and the upper electrode side is in the low-resistance state. The third resistance state is defined as the state where the lower electrode side is in the low-resistance state and the upper electrode side is in the high-resistance state. The fourth resistance state is defined as the state where the upper electrode side and the lower electrode side are in the high-resistance state. Therefore, the nonvolatile memory element including the resistance variable layer made of the oxygen-deficient transition metal oxide has a potential ability to achieve stable write and read of four-valued data.

In other words, the nonvolatile memory element including the resistance variable layer made of the oxygen-deficient transition metal oxide has a potential ability to achieve stable write and read four-valued data, by enabling each of the upper electrode side of the resistance variable layer and the lower electrode side of the resistance variable layer to be selectively placed in the low-resistance state or the high-resistance state.

However, in a structure in which the upper electrode side and the lower electrode side are symmetric (vertically symmetric), since a switching magnitude of the interelectrode resistance value occurring when the resistance state switches is equal at the upper electrode side and at the lower electrode side, the interelectrode resistance value corresponding to the second resistance state is equal to the interelectrode resistance value corresponding to the third resistance state. In addition, in the structure in which the upper electrode side and the lower electrode side are symmetric, the voltages for causing the resistance state switching are also symmetric (absolute values are equal and polarity is reversed). When one electrode side is placed at a relatively high voltage, the other electrode side is placed at a relatively low voltage. Therefore, for example, if the one electrode side is placed in the high-resistance state, then the other electrode side is inevitably placed in the low-resistance state. Thus, both electrode sides cannot be placed in the high-resistance state. Because of the above explained limitation, when using the vertically symmetric structure, there are virtually only two values as the interelectrode resistance values, and the multi-valued memory is not attained.

In a structure in which the upper electrode side and the lower electrode side are asymmetric (vertically asymmetric), it is possible to make a difference between the interelectrode resistance value corresponding to the second resistance state and the interelectrode resistance value corresponding to the third resistance state, to place the both electrode sides in the high-resistance state simultaneously, or to place the both electrode sides in the low-resistance state simultaneously. Thus, the multi-valued memory is attainable.

In other words, by enabling each of the upper electrode side of the resistance variable layer and the lower electrode side of the resistance variable layer to be placed selectively in one of the low-resistance state and the high-resistance state, the memory element is capable of attaining stable states in which each of three or more interelectrode resistance values which are different from each other does not switch even when the interelectrode voltage changes within a specified range. Therefore, it is possible to attain a multi-valued memory which is stably capable of achieving write and read of data of three or more values and is operable stably.

As used herein, the term "asymmetric" means that the electrode material, the electrode area, the oxygen content and thickness of the resistance variable layer, the shape of the electrode, the thickness of the electrode, and the like are made different between the upper electrode side and the lower electrode side so that the absolute value of the interelectrode voltage for causing resistance switching and the switching magnitude (difference in resistance value between the high-resistance state and the low-resistance state) of the interelectrode resistance value occurring when the resistance state switches. The resistance variable layer may be directly or indirectly in contact with the electrodes.

Embodiment 1

In this embodiment, a three-valued memory is attained in such a manner that the material of the upper electrode and the material of the lower electrode are made different so that the resistance value in the state where the upper electrode side is in the high-resistance state and the lower electrode side is in the low-resistance state is made different from the resistance value in the state where the upper electrode side is in the low-resistance state and the lower electrode side is in the high-resistance state.

[Configuration of Element]

Figure 2:
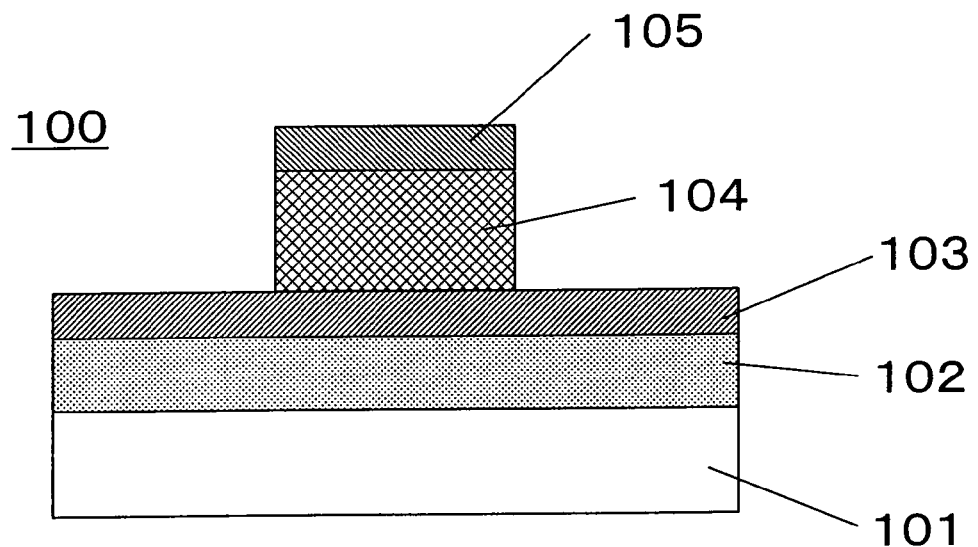
FIG. 2 is a schematic view showing an example of a cross section of a nonvolatile memory element according to Embodiment 1 of the present invention.

FIG. 2 is a schematic view showing an example of a cross section of a nonvolatile memory element (resistance variable element) according to Embodiment 1 of the present invention. As shown in FIG. 2, a nonvolatile memory element 100 of this embodiment includes a substrate 101, an oxide layer 102 formed over the substrate 101, a lower electrode layer 103 (first electrode) formed over the oxide layer 102, a resistance variable layer 104 formed over the lower electrode layer 103, and an upper electrode layer 105 (second electrode) formed over the resistance variable layer 104.

In this embodiment, the lower electrode layer 103 and the upper electrode layer 105 are made of different materials. For example, tungsten (W) may be used as the lower electrode layer 103, and platinum (Pt) may be used as the upper electrode layer 105. As the electrode materials, for example, platinum (Pt), Iridium (Ir), gold (Au), silver (Ag), copper (Cu), tungsten (W), nickel (Ni), and tantalum nitride (TaN) may be used.

The resistance variable layer 104 includes an oxygen-deficient transition metal oxide (preferably oxygen-deficient Ta oxide). As used herein, the oxygen-deficient transition metal oxide refers to an oxide in which an oxygen content (atom ratio: ratio of oxygen atoms to total atoms) is less as compared to stoichiometric oxides. For example, when the transition metal is Ta, the composition of the stoichiometric oxide is $Ta_2O_5$, and the ratio of O atoms to Ta atoms (O/Ta) is 2.5. Therefore, in the oxygen-deficient Ta oxide, the ratio of O atoms to Ta atoms is larger than 0 and smaller than 2.5. In this embodiment, the oxygen-deficient transition metal oxide is preferably the oxygen-deficient Ta oxide. The oxygen-deficient Ta oxide satisfies preferably $0<x<2.5$ and more preferably $0.8 \leq x \leq 1.9$, when the Ta oxide is expressed as TaOx. The oxygen-deficient transition metal oxide or the oxygen-deficient Ta oxide preferably has an amorphous structure.

The resistance variable layer 104 is configured to reversibly switch a resistance value (interelectrode resistance value, hereinafter simply referred to as "resistance value") between the lower electrode layer 103 and the upper electrode layer 105 in response to a voltage (hereinafter an interelectrode voltage) of the upper electrode layer 105 on the basis of the lower electrode layer 103. When writing data to the nonvolatile memory element 100, voltages with predetermined conditions are applied from an external electric power supply between the lower electrode layer 103 and the upper electrode layer 105. The voltages may be applied in the form of, for example, electric pulses (pulse voltages having predetermined voltages and time widths).

The resistance variable layer 104 preferably has a characteristic (high imprinting resistance) in which the resistance value does not switch so long as the voltages of the electric pulses are the same, even when the electric pulses are applied many times.

In this embodiment, each of the lower electrode layer 103 and the upper electrode layer 105 is directly in contact with the resistance variable layer 104. In this embodiment, the area of the portion of the resistance variable layer 104 which is in contact with the lower electrode layer 103 is equal to the area of the portion of the resistance variable layer 104 which is in contact with the upper electrode layer 105. In other words, in this embodiment, the lower electrode side and the upper electrode side are symmetric in structure except that the electrode material is different between the upper electrode layer 103 and the lower electrode layer 105.

[Manufacturing Method of Element]

The nonvolatile memory element 100 can be manufactured in, for example, the manufacturing method as described below.

Initially, over the substrate 101 which is made of a single crystal silicon, the oxide layer 102 is formed by thermal oxidation process. A metal thin layer is deposited over the oxide layer 102 by a sputtering process to form the lower electrode layer 103. In this embodiment, tungsten (W) may be used as the material of the lower electrode layer 103, for example.

Then, a layer of the oxygen-deficient transition metal oxide is deposited over the lower electrode layer 103 to form the resistance variable layer 104. The oxygen-deficient transition metal oxide may be formed by sputtering a transition metal target in Ar and $O_2$ gases, for example (specific sputtering condition is illustrated in example 1).

Further, over the resistance variable layer 104, a metal thin layer is deposited by a sputtering process to form the upper electrode layer 105. In this embodiment, for example, platinum (Pt) may be used as the material of the upper electrode layer 105.

Through the above described process, it is possible to manufacture the nonvolatile memory element 100 in which the oxygen-deficient transition metal oxide is sandwiched between metal thin layers from above and from below.

In deposition of the resistance variable layer 104, a sputtering process using the tantalum oxide as a target may be used without using the reactant gases such as $O_2$. Instead of the sputtering process, a chemical vapor deposition process may be used.

[Electric Characteristic]

Figure 3:
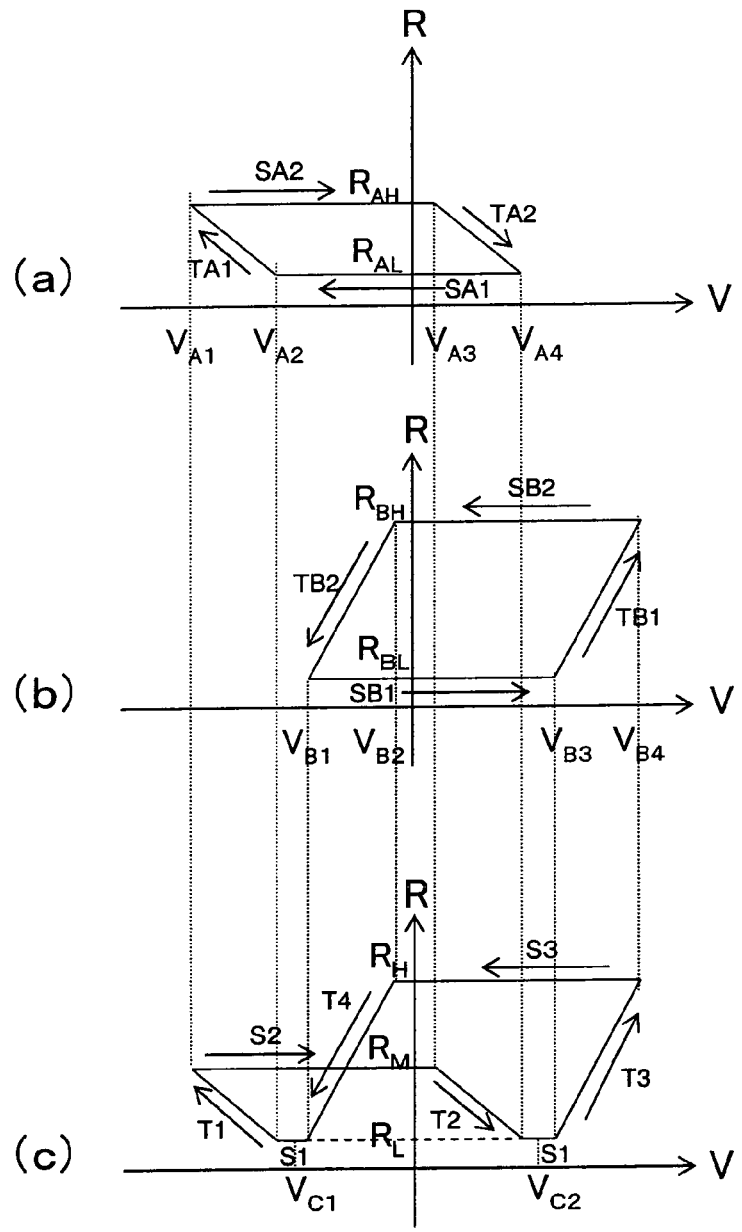

FIG. 3 is a schematic view showing an example of a characteristic of the nonvolatile memory element according to Embodiment 1 of the present invention, in which FIG. 3(a) is a view showing switching of the resistance value occurring when the voltage of the upper electrode with respect to the lower electrode is changed continuously between $V_{A1}$ (e.g., −3V) and $V_{A4}$ (e.g., +2V), and FIG. 3(b) is a view showing switching of the resistance value occurring when the voltage of the upper electrode with respect to the lower electrode is changed continuously between $V_{B1}$ (e.g., −2V) and $V_{B4}$(e.g., +3V), and FIG. 3(c) is a view showing switching of the resistance value occurring when the voltage of the upper electrode with respect to the lower electrode is changed continuously between $V_{A1}$ (e.g., −3V) and $V_{B4}$ (e.g., +3V). Hereinafter, the electric characteristic of the nonvolatile memory element 100 will be described with reference to FIG. 3 (also with reference to example 1 and FIG. 5).

Hereinafter, the electric potential of the upper electrode layer 105 on the basis of the lower electrode layer 103 is referred to as an interelectrode voltage. The interelectrode voltage in the state where the electric potential of the upper electrode layer 105 is higher than the electric potential of the lower electrode layer 103 is positive, while the interelectrode voltage in the state where the electric potential of the upper electrode layer 105 is lower than the lower electrode layer 103 is negative. For example, electric pulses with predetermined voltage value and a pulse width of 100 nsec are applied between the upper electrode layer 105 and the lower electrode layer 103. It should be noted that the voltages need not be applied in the form of the electric pulses. The voltages may be applied with any other method as long as predetermined voltages are applied between the lower electrode layer 103 and the upper electrode layer 105. The resistance value is found by applying a voltage (e.g., 50 mV) with a small absolute value between the upper electrode layer 105 and the lower electrode layer 103 and by measuring a current flowing therethrough. It is supposed that the voltages are applied between the electrodes as the electric pulses and the voltages of the electric pulses are referred to as "voltages". It is supposed that the voltages of the electric pulses are equal to the interelectrode voltages generated when the voltages of the electric pulses are applied. These apply to the other embodiments.

As indicated by arrows in FIG. 3(a), when the resistance value is $R_{AL}$ (e.g., about 50Ω), the resistance value retains $R_{AL}$ and does not switch even though the voltage is decreased from $V_{A4}$ to $V_{A2}$ (SA1). Thereafter, when the voltage is further decreased from $V_{A2}$ to $V_{A1}$, the resistance value increases from $R_{AL}$ to $R_{AH}$ (e.g., about 100Ω) (TA1). Thereafter, the resistance value retains $R_{AH}$ and does not switch even though the voltage is increased from $V_{A1}$ to $V_{A3}$ (SA2). Thereafter, when the voltage is further increased from $V_{A3}$ to $V_{A4}$, the resistance value decreases from $R_{AH}$ to $R_{AL}$ (TA2). In the example shown in FIG. 3(a), the element is placed in the high-resistance state when a minus voltage is applied (lower electrode side is at a higher electric potential). Therefore, with reference to the result of experiment example 1, the resistance state switches at the lower electrode side. To be specific, in SA1, both of the lower electrode side and the upper electrode side are in the low-resistance state, while in SA2, the lower electrode side is in the high-resistance state and the upper electrode side is in the low-resistance state.

As indicated by arrows in FIG. 3(b), when the resistance value is $R_{BL}$ (e.g., about 50Ω), the resistance value retains $R_{BL}$ and does not switch even though the voltage is increased from $V_{B1}$ to $V_{B3}$ (SB1). When the voltage is further increased from $V_{B3}$ to $V_{B4}$, the resistance value increases from $R_{BL}$ to $R_{BH}$ (e.g., about 600Ω) (TB1). Thereafter, the resistance value retains $R_{BH}$ and does not switch even though the voltage is decreased from $V_{B4}$ to $V_{B2}$ (SB2). Thereafter, when the voltage is further decreased from $V_{B2}$ to $V_{B1}$, the resistance value decreases from $R_{BH}$ to $R_{BL}$ (TB2). In the example shown in FIG. 3(b), the element is placed in the high-resistance state when a plus voltage is applied (upper electrode side is at a higher electric potential). Therefore, with reference to the result of experiment example 1, the resistance state switches at the upper electrode side. To be specific, in SB1, both of the lower electrode side and the upper electrode side are placed in the low-resistance state, while in SB2, the lower electrode side is in the low-resistance state and the upper electrode side is in the high-resistance state.

As indicated by arrows in FIG. 3(c), when the resistance value is $R_L$ (=$R_{AL}$=$R_{BL}$), the resistance value retains $R_L$ and does not switch even though the voltage is changed between $V_{B3}$ and $V_{A2}$ (S1). When the voltage is decreased from $V_{A2}$ to $V_{A1}$, the resistance value increases from $R_L$ to $R_M$ (=$R_{AH}$) (T1). Thereafter, the resistance value retains $R_M$ and does not switch even though the voltage is increased from $V_{A1}$ to $V_{A3}$ (S2). Thereafter, when the voltage is further increased from $V_{A3}$ to $V_{A4}$, the resistance value decreases from $R_M$ to $R_L$ (T2). Thereafter, when the voltage is increased from $V_{A4}$ to $V_{B4}$ by way of $V_{B3}$, the resistance value increases from $R_L$ to $R_H$ (=$R_{BH}$) (T3). Thereafter, the resistance value retains $R_H$ and does not switch even though the voltage is decreased from $V_{B4}$ to $V_{B2}$ (S3). Thereafter, when the voltage is further decreased from $V_{B2}$ to $V_{B1}$, the resistance value decreases from $R_H$ to $R_L$ (T4). With reference to the result of experiment example 1 and FIGS. 3(a) and 3(b), in S1, both of the lower electrode side and the upper electrode side are in the low-resistance state, in S2, the lower electrode side is in the high-resistance state and the upper electrode side is in the low-resistance state, and in S3, the lower electrode side is in the low-resistance state and the upper electrode side is in the high-resistance state. FIG. 3(c) shows a characteristic which is a composition of the characteristic of FIG. 3(a) and the characteristic of FIG. 3(b). When the relationship of $R_L < R_M < R_H$ is satisfied and the interelectrode voltage is $V_{C1}$ (=$V_\alpha$) satisfying the relationship of $V_{A2} < V_{C1} < V_{B1}$, the resistance value becomes $R_L$ or $R_M$. When the relationship of $R_L < R_M < R_H$ is satisfied and the interelectrode voltage is $V_\beta$ satisfying the relationship of $V_{B2} < V_\beta < V_{A3}$, the resistance value becomes $R_M$ or $R_H$. When the relationship of $R_L < R_M < R_H$ is satisfied and the interelectrode voltage is $V_{C2}$ (=$V_\gamma$) satisfying the relationship of $V_{A4} < V_{C2} < V_{B3}$, the resistance value becomes $R_L$ or $R_H$. In addition, when $V_{A1}$ is expressed as $V_1$, $V_{A2}$ is expressed as $V_2$, $V_{C1}$ is expressed as $V_3$, $V_{B1}$ is expressed as $V_4$, $V_{B2}$ is expressed as $V_5$, $V_{A3}$ is expressed as $V_6$, $V_{A4}$ is expressed as $V_7$, $V_{C2}$ is expressed as $V_8$, $V_{B3}$ is expressed as $V_9$, and $V_{B4}$ is expressed as $V_{10}$, the relationship of $V_1 < V_2 < V_3 < V_4 < V_5 < 0 < V_6 < V_7 < V_8 < V_9 < V_{10}$ is satisfied. In this embodiment, the material of the lower electrode and the material of the upper electrode are made different so as to satisfy the above described condition, forming a vertically asymmetric configuration of the nonvolatile memory element.

The upper electrode and the lower electrode may be inverted. In this case, the nonvolatile memory element has a characteristic obtained by inverting the characteristic shown in FIG. 3(c) in a rightward and leftward direction.

[Method of Using Nonvolatile Memory Element 100 as Three-Valued Memory]

In the example shown in FIG. 3(c), if the voltage is set lower than $V_{A1}$, the nonvolatile memory element 100 in any of the resistance states switches to the state of S2 and its resistance value becomes $R_M$. If the voltage is set higher than $V_{B4}$, the nonvolatile memory element 100 in any of the resistance states switches to the state of S3 and its resistance value becomes $R_H$. To enable the element to switch to the state of S1, the voltage of $V_{C2}$ ($V_{A4} < V_{C2} < V_{B3}$) is applied to the element in the state of S2, while the voltage of $V_{C1}$ ($V_{A2} < V_{C1} < V_{B1}$) is applied to the element in the state of S3. These three states (S1, S2, S3) are states (stable states) in which the resistance values do not substantially switch regardless of a change in a voltage within a specified range. To be specific, when the element 100 is in the state of S1, the resistance value does not substantially switch when the voltage is higher than $V_{A2}$ and lower than $V_{B3}$. When the element 100 is in the state of S2, the resistance value does not substantially switch when the voltage is lower than $V_{A3}$. When the element is in the state of S3, the resistance value does not substantially switch if the voltage is higher than $V_{B2}$. By utilizing the three stable states, the nonvolatile memory element 100 can be used as the nonvolatile memory element capable of stably writing and reading three-valued data.

As described previously, the nonvolatile memory element for the multi-valued memory utilizing the conventional resistance variable phenomenon, the resistance value is switched by increasing or decreasing the voltage to be applied to the element in regions where the resistance value continuously switches. In this case, since transient regions are used, the reproducibility of the resistance values is low and it is difficult to operate this nonvolatile memory element stably as the memory. On the other hand, since the nonvolatile memory element proposed in this embodiment uses the resistance values in stable regions as memory states, it can be used as the nonvolatile memory element for the multi-valued memory which is operable stably.

[Configuration in Which Lower Electrode Side and Upper Electrode Side are Symmetric]

Figure 4:
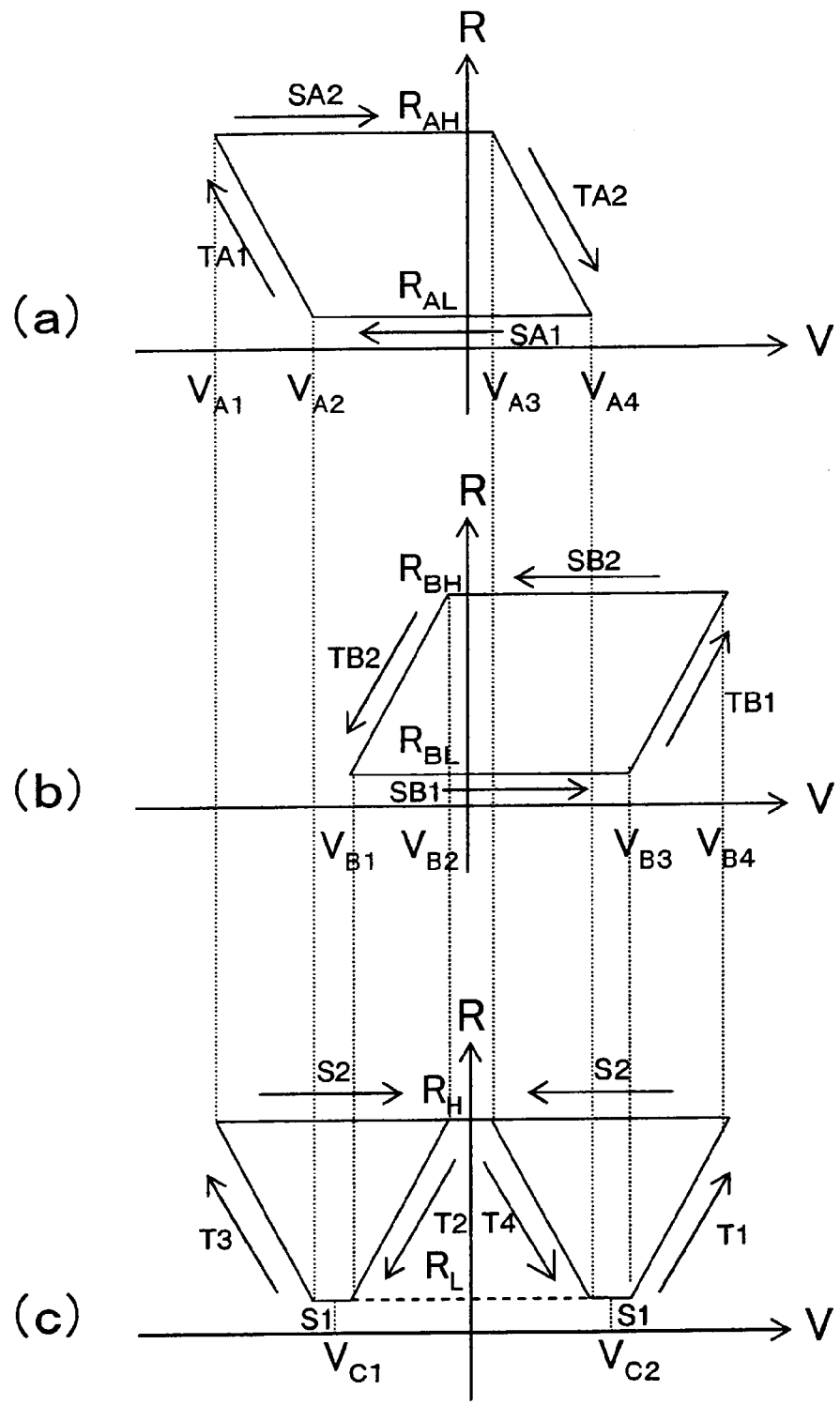

FIG. 4 is a schematic view showing an example of a characteristic of the nonvolatile memory element in which the lower electrode and the upper electrode are made of the same material and the lower electrode side and the upper electrode side are formed to be symmetric, in which FIG. 4(a) is a view showing switching of a resistance value occurring when the voltage of the upper electrode with respect to the lower electrode is changed continuously between $V_{A1}$ and $V_{A4}$, and FIG. 4(b) is a view showing switching of the resistance value occurring when the voltage of the upper electrode with respect to the lower electrode is changed continuously between $V_{B1}$ and $V_{B4}$, and FIG. 4(c) is a view showing switching of the resistance value occurring when the voltage of the upper electrode with respect to the lower electrode is changed continuously between $V_{A1}$ and $V_{B4}$. Hereinafter, the electric characteristic of the nonvolatile memory element 100 will be described with reference to FIG. 4 (also see Comparative example and FIG. 7).

As indicated by arrows in FIG. 4(a), when the resistance value is $R_{AL}$, the resistance value retains $R_{AL}$ and does not switch even though the voltage is decreased from $V_{A4}$ to $V_{A2}$ (SA1). Thereafter, when the voltage is further decreased from $V_{A2}$ to $V_{A1}$, the resistance value increases from $R_{AL}$ to $R_{AH}$ (TA1). Thereafter, the resistance value retains $R_{AH}$ and does not switch even though the voltage is increased from $V_{A1}$ to $V_{A3}$ (SA2). Thereafter, when the voltage is further increased from $V_{A3}$ to $V_{A4}$, the resistance value decreases from $R_{AH}$ to $R_{AL}$ (TA2). In the example shown in FIG. 4(a), the element is placed into the high-resistance state when a minus voltage is applied (lower electrode side is at a higher electric potential). Therefore, the resistance state switches at the lower electrode side. With reference to the result of experiment example 1, in SA1, both of the lower electrode side and the upper electrode side are in the low-resistance state, while in SA2, the lower electrode side is in the high-resistance state and the upper electrode side is in the low resistance state.

As indicated by arrows in FIG. 4(b), when the resistance value is $R_{BL}$, the resistance value retains $R_{BL}$ and does not switch even though the voltage is increased from $V_{B1}$ to $V_{B3}$ (SB1). When the voltage is further increased from $V_{B3}$ to $V_{B4}$, the resistance value increases from $R_{BL}$ to $R_{BH}$ (TB1). Thereafter, the resistance value retains $R_{BH}$ and does not switch even though the voltage is decreased from $V_{B4}$ to $V_{B2}$ (SB2). Thereafter, when the voltage is further decreased from $V_{B2}$ to $V_{B1}$, the resistance value decreases from $R_{BH}$ to $R_{BL}$ (TB2). In the example shown in FIG. 4(b), the element is placed into the high-resistance state when a plus voltage is applied (upper electrode side is at a higher electric potential). Therefore, the resistance state switches at the upper electrode side. With reference to the result of experiment example 1, in SB1, both of the lower electrode side and the upper electrode side are placed in the low-resistance state, while in SB2, the lower electrode side is in the low-resistance state and the upper electrode side is in the high-resistance state.

In the nonvolatile memory element of FIG. 4, the lower electrode layer 103 and the upper electrode layer 105 are made of the same material and the lower electrode side and the upper electrode side are symmetric in structure. The resistance values are equal ($R_{AH}=R_{BH}$) in the case where the lower electrode side is in the high-resistance state and in the case where the upper electrode side is in the high-resistance state. The voltages for switching the resistance states are reversed in polarity and are equal in absolute value ($|V_{A1}|=|V_{B4}|$, $|V_{A2}|=|V_{B3}|$, $|V_{A3}|=|V_{B2}|$, $|V_{A4}|=|V_{B1}|$), and the relationship $V_{A1}=-V_{B4}$, $V_{A2}=-V_{B3}$, $V_{A3}=-V_{B2}$, and $V_{A4}=-V_{B1}$ is satisfied. As a result, the characteristics of the nonvolatile memory element shown in FIG. 4(a) and FIG. 4(b) are laterally symmetric with respect to V=0 as a center.

As indicated by arrows in FIG. 4(c), when the resistance value is $R_L$ (=$R_{AL}=R_{BL}$), the resistance value retains $R_L$ and does not switch even though the voltage is changed between $V_{B3}$ and $V_{A2}$ (S1). When the voltage is decreased from $V_{A2}$ to $V_{A1}$, the resistance value increases from $R_L$ to $R_H$ (=$R_{AH}$) (T3). Thereafter, the resistance value retains $R_H$ and does not switch even though the voltage is increased from $V_{A1}$ to $V_{A3}$ (S2). Thereafter, when the voltage is further increased from $V_{A3}$ to $V_{A4}$, the resistance value decreases from $R_H$ to $R_L$ (T4). Thereafter, when the voltage is increased from $V_{A4}$ to $V_{B4}$ by way of $V_{B3}$, the resistance value increases from $R_L$ to $R_H$ (=$R_{BH}$) (T1). Thereafter, the resistance value retains $R_H$ and does not switch even though the voltage is decreased from $V_{B4}$ to $V_{B2}$ (S2). Thereafter, when the voltage is further decreased from $V_{B2}$ to $V_{B1}$, the resistance value decreases from $R_H$ to $R_L$ (T2). With reference to the result of experiment example 1 and FIGS. 4(a) and 4(b), in S1, both of the lower electrode side and the upper electrode side are in the low-resistance state, in S2 after T3, the lower electrode side is in the high-resistance state and the upper electrode side is in the low-resistance state, and in S2 after T1, the lower electrode side is in the low-resistance state and the upper electrode side is in the high-resistance state. FIG. 3(c) shows a characteristic which is a composition of the characteristic of FIG. 3(a) and the characteristic of FIG. 3(b).

In the nonvolatile memory element of FIG. 4, the resistance value ($R_{AH}$) in SA2 and the resistance value ($R_{BH}$) in SB2 are equal. With the voltage for placing the lower electrode side into the high-resistance state, the upper electrode side is always placed into the low-resistance state. With the voltage for placing the upper electrode side into the high-resistance state, the lower electrode side is always placed into the low-resistance state. Therefore, both of the upper electrode side and the lower electrode side cannot be placed into the high-resistance state simultaneously. As a result, the nonvolatile memory element of FIG. 4 can have only two resistance values ($R_L=R_{AL}=R_{BL}$, and $R_H=R_{AH}=R_{BH}$). That is, the nonvolatile memory element of FIG. 4 can be placed in only the two resistance states (S1, S2). Therefore, the nonvolatile memory element of FIG. 4 is unable to operate as the multi-valued memory.

As can be understood from the above, it is necessary to form a configuration in which the lower electrode side and the upper electrode are asymmetric to enable the nonvolatile memory element to operate as the multi-valued memory.

Example 1

In example 1, the nonvolatile memory element having a configuration shown in FIG. 2 was manufactured by the following method.

Initially, over a single crystal silicon substrate, a 200 nm-thick oxide layer was formed by thermal oxidation. A 200 nm-thick metal thin layer was deposited over the oxide layer by a sputtering process to form a lower electrode layer. In this example, tungsten (W) was used as the material of the lower electrode layer.

Then, an oxygen-deficient Ta oxide was deposited over the lower electrode layer to form a 30 nm-thick layer as a resistance variable layer. The oxygen-deficient Ta oxide was deposited by sputtering a Ta target in $A_r$ and $O_2$ gases. The specific sputtering condition for depositing the resistance variable layer was such that the vacuum of degree (back pressure) within a sputtering device before starting the sputtering was set to about $7 \times 10^{-4}$ Pa, the power for sputtering was set to 250 W, the total gas pressure of argon gas and oxygen gas was set to 3.3 Pa, the partial pressure ratio of oxygen gas was set to 3.8%, the temperature of the substrate was set to 30 degrees centigrade, and the layer deposition time was set to seven minutes. Under the condition, the resistance variable layer being 30 nm-thick, made of oxygen-deficient Ta oxide and having an oxygen content of 58 atm % was deposited. When the oxygen-deficient Ta oxide is expressed as $TaO_x$, x is 1.38 in the Ta oxide with an oxygen content of 58 atm %.

Then, over the resistance variable layer, a 100 nm-thick metal thin layer was deposited by the sputtering process to form an upper electrode layer. In this embodiment, platinum (Pt) was used as the material of the upper electrode layer.

Through the above described process, the nonvolatile memory element in which the oxygen-deficient Ta oxide was sandwiched between metal thin layers from above and from below, was manufactured.

Figure 5:
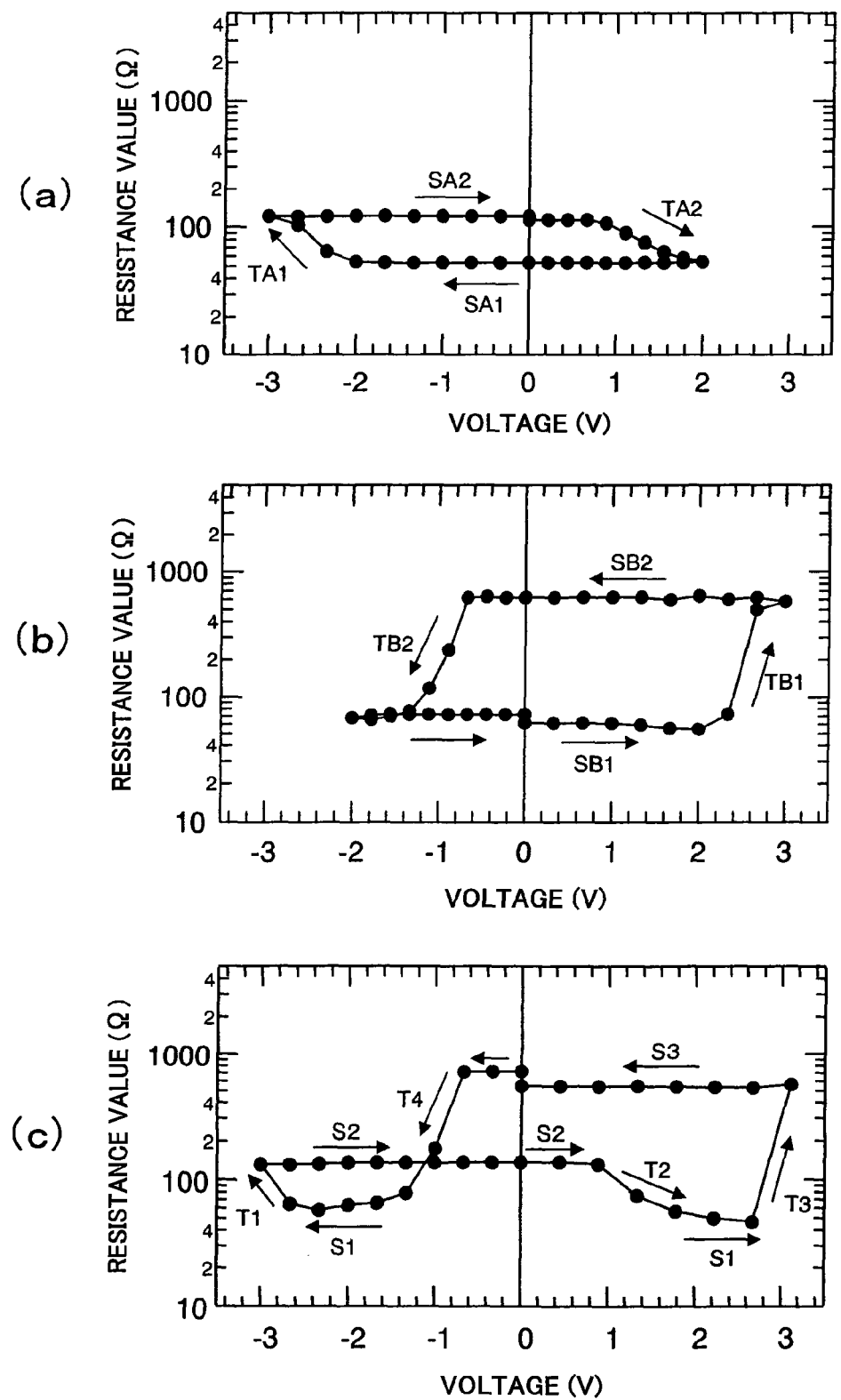

FIG. 5 is a view showing a characteristic of a nonvolatile memory element of example 1 of the present invention, in which FIG. 5(a) is a view showing switching of a resistance value occurring when the voltage of the upper electrode with respect to the lower electrode is changed continuously between −3V and +2V, FIG. 5(b) is a view showing switching of a resistance value occurring when the voltage of the upper electrode with respect to the lower electrode is changed continuously between −2V and +3V, and FIG. 5(c) is a view showing switching of a resistance value occurring when the voltage of the upper electrode with respect to the lower electrode is changed continuously between −3V and +3V. Hereinafter, the electric characteristic of the nonvolatile memory element in example 1 will be described with reference to FIG. 5.

In this example, electric pulses with predetermined voltage values (pulse voltages) and a pulse width of 100 nsec are applied between the upper electrode layer and the lower electrode layer. After every application, the resistance value was measured. The resistance value was measured by applying a voltage of 50 mV between the upper electrode layer and the lower electrode layer and by measuring a current flowing therethrough.

In the example shown in FIG. 5(a), the initial value of the resistance value was about 100Ω. As indicated by arrows in FIG. 5(a), the pulse voltage was gradually increased from 0V to +2V, was gradually decreased from +2V to −3V, and was finally gradually increased from −3V to 0V. The resistance value was about 100Ω and constant when the voltage was from 0V to about +1V (SA2). The resistance value decreased to about 50Ω when the voltage was increased from +1V to +2V (TA2). Thereafter, until the voltage was decreased from +2V to −2V, the resistance value was about 50Ω and constant (SA1). When the voltage was decreased from −2V to −3V, the resistance value increased to about 100Ω (TA1). Thereafter, the resistance value was about 100Ω and constant, even though the voltage was increased from −3V to 0V (SA2).

In the example shown in FIG. 5(a), the element is placed into the high-resistance state when a minus voltage is applied (lower electrode side is at a higher electric potential). Therefore, with reference to the result of experiment example 1, the resistance state switches at the lower electrode side. To be specific, in SA1, both of the lower electrode side and the upper electrode side are in the low-resistance state, while in SA2, the lower electrode side is in the high-resistance state and the upper electrode side is in the low resistance state.

In the example shown in FIG. 5(b), the initial value of the resistance value was about 50Ω (state of SA1 in FIG. 5(a)). As indicated by arrows in FIG. 5(b), the pulse voltage was gradually increased from 0V to +3V, was then gradually decreased from +3V to −2V, and was finally gradually increased from −2V to 0V. The resistance value was about 50Ω and constant when the voltage was from 0V to about +2V (SB1). When the voltage was increased from +2V to +3V, the resistance value increased to about 600Ω (TB1). Thereafter, the resistance value was about 600Ω and constant until the voltage was decreased from +3V to −1V (SB2). When the voltage was decreased from −1V to −2V, the resistance value decreased to about 50Ω (TB2). Thereafter, the resistance value was about 50Ω and constant even though the voltage was increased from −2V to 0V (SB1).

In the example shown in FIG. 5(b), the element is placed into the high-resistance state when a plus voltage is applied (upper electrode side is at a higher electric potential). Therefore, with reference to the result of experiment example 1, the resistance state switches at the upper electrode side. To be specific, in SB1, both of the lower electrode side and the upper electrode side are in the low-resistance state, while in SB2, the lower electrode side is in the low-resistance state and the upper electrode side is in the high resistance state.

In the example shown in FIG. 5(c), the initial value of the resistance value was about 600Ω (state of SB2 in FIG. 5(b)). As indicated by arrows in FIG. 5(c), the pulse voltage was gradually decreased from 0V to −3V, was then gradually increased from −3V to +3V, and was finally gradually decreased from +3V to 0V. The resistance value was about 600Ω and constant when the voltage was from 0V to about −1V (S3). When the voltage was decreased from −1V to −2V, the resistance value decreased to about 50Ω (T4). For some moment, the resistance value was substantially constant (S1). Thereafter, when the voltage was further decreased, the resistance value increased to about 100Ω when the voltage was about −3V (T1). Thereafter, the resistance value was about 100Ω and constant even though the voltage was increased from −3V to +1V (S2). When the voltage was further increased to +2.5V, the resistance value decreased to about 50Ω (T2), and for some time, the resistance value was substantially constant (S1). Thereafter, when the voltage was further increased, the resistance value increased to about 600Ω when the voltage was about +3V (T3). Thereafter, the resistance value was about 600Ω and constant even though the voltage was decreased from +3V to 0V (S3).

As can be seen from FIG. 5(c), the resistance value switches according to the complicated characteristic which is a composition of the characteristic of FIG. 5(a) and the characteristic of FIG. 5(b). With reference to the result of experiment example 1 and FIGS. 5(a) and 5(b), in S1, both of the lower electrode side and the upper electrode side are in the low-resistance state, in S2, the lower electrode side is in the high-resistance state and the upper electrode side is in the low resistance state, and in S3, the lower electrode side is in the low-resistance state and the upper electrode side is in the high-resistance state.

As should be appreciated from the above, the nonvolatile memory element of example 1 has three stable states. The states are the state S1 (about 50Ω) in which the resistance value is smallest when the voltage is about +2V and about −2V, the state S2 (about 100Ω) in which the resistance value is intermediate in magnitude when the voltage is from about −3V to about +1V, and the state S3 (about 600Ω) in which the resistance value is largest when the voltage is from −1V to 3V. When the state is S1, the resistance value (resistance state) does not switch when the voltage is higher than −2V and lower than +2V. When the state is S2, the resistance value (resistance state) does not switch when the voltage is lower than +1V. When the state is S3, the resistance value (resistance state) does not switch when the voltage is higher than about −1V. The nonvolatile memory element of example 1 is able to store three-valued data utilizing these three stable states.

Although the resistance variable layer is made of the oxygen-deficient Ta oxide in example 1, the material of the resistance variable layer is not limited to this. As described in the background art, it is reported that the transition metal oxides which are similar to Ta switch resistance in response to electric pulses. It is presumed that resistance switching phenomenon similar to that of this embodiment is observed in these materials. That is, it may be considered that using the oxygen-deficient oxides of transition metal such as Ni, Nb, Ti, Zr, Hf, Co, Fe, Cu, and Cr, a three-valued nonvolatile memory element is attained by forming the upper electrode and the lower electrode with different materials.

Example 2

Figure 6:
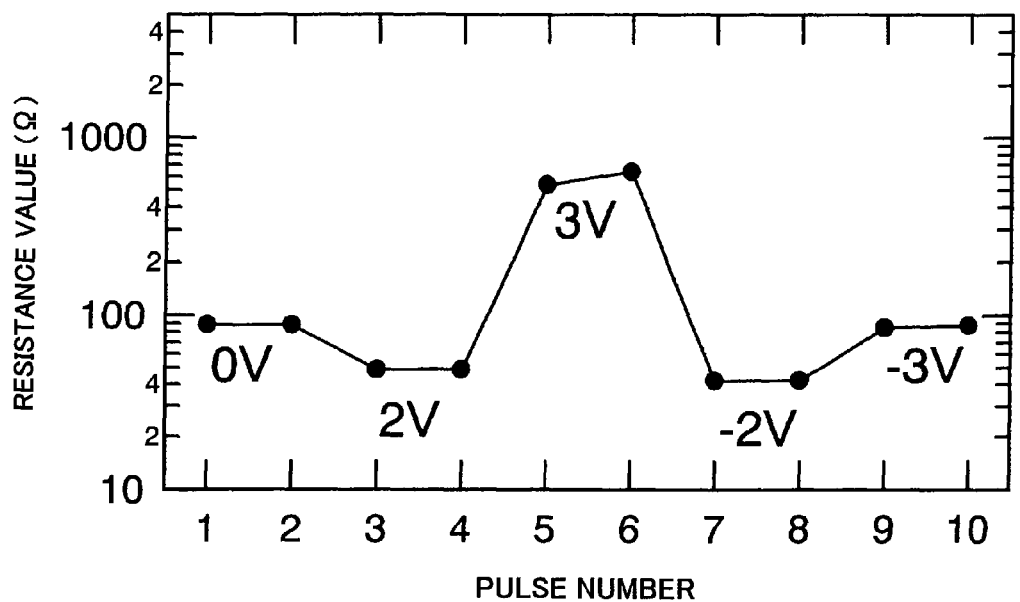
FIG. 6 is view showing switching in a resistance value occurring when a voltage of an electric pulse applied between two electrodes of a nonvolatile memory element in example 2 of the present invention is changed discretely.

FIG. 6 is a view showing switching in a resistance value occurring when the voltage of the electric pulse applied between two electrodes of the nonvolatile memory element in example 2 of the present invention is changed discretely. In example 2, the nonvolatile element identical to that of example 1 was used. The voltages shown in FIG. 6 indicate the voltages of the electric pulses applied. Each electric pulse was applied twice.

Initially, the state of the nonvolatile memory element was set to S2 and measurement was conducted twice (Figure expresses that 0V is applied). In this case, the resistance value was about 100Ω. When the voltage of +2V was applied to the nonvolatile memory element in this state, the state of the nonvolatile memory element switched to S1 and its resistance value became about 50Ω. Then, when the voltage of +3V was applied, the state of the nonvolatile memory element switched to S3 and its resistance value became about 600Ω. Then, when the voltage of −2V was applied, the state of the nonvolatile memory element switched to S1 and its resistance value became about 50Ω. Finally, when the voltage of −3V was applied, the state of the nonvolatile memory element switched to S2, and its resistance value became about 100 Ω.

From the result of FIG. 6, it can be seen that the nonvolatile memory element is switchable as desired among the states S1, S2, and S3 by applying once separate electric pulses which are discrete and have predetermined voltages to the upper and lower electrodes of the nonvolatile memory element. By respectively allocating data to the resistance values corresponding to S1, S2, and S3, the nonvolatile memory element may be used as a nonvolatile memory element which is capable of writing three-valued data.

Comparative Example

In a comparative example, a nonvolatile memory element which has a configuration shown in FIG. 2 and whose upper electrode and lower electrode are made of platinum (Pt) was manufactured with a method similar to that of example 1.

Figure 7:
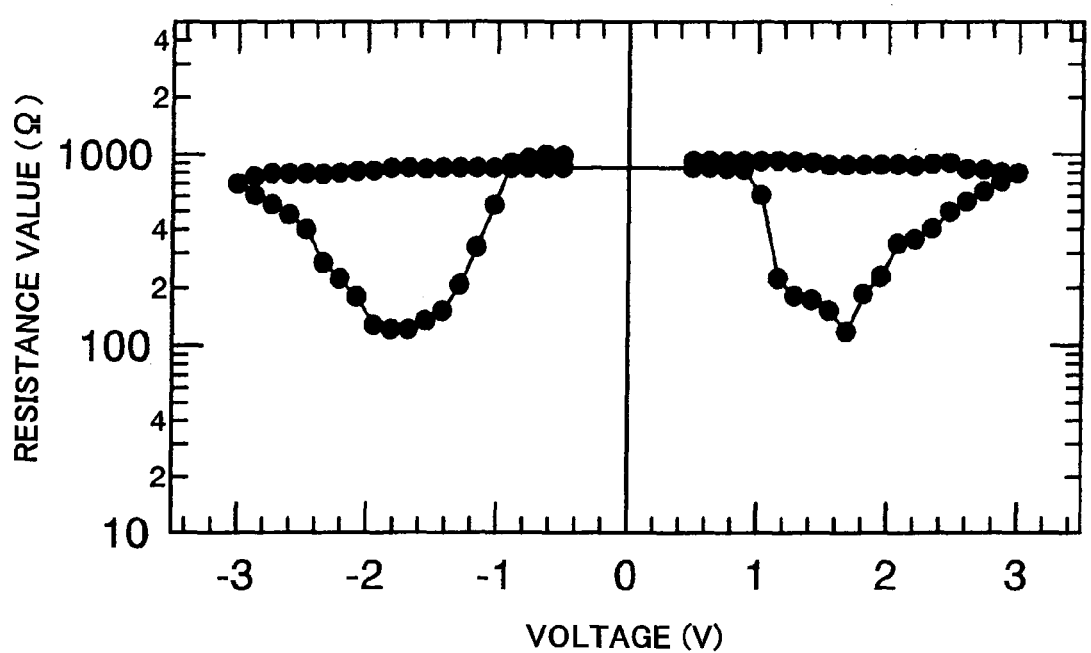
FIG. 7 is a view showing switching of a resistance value occurring when the voltage of an upper electrode with respect to a lower electrode is changed continuously between −3V and +3V, in a nonvolatile memory element according to a comparative example.

FIG. 7 is a view showing switching of the resistance value occurring when the voltage of the upper electrode with respect to the lower electrode is changed continuously between −3V and +3V, in the nonvolatile memory element according to the comparative example. As can be seen from FIG. 7, a characteristic which is laterally symmetric with respect to an axis of a voltage 0V and is like eye glasses was obtained. The nonvolatile memory element of comparative example has only two resistance value stable states which are 100Ω (about ±2V) and 1000Ω (range from −3V to +3V) and operates only as a binary nonvolatile memory element.

From the above result, it should be understood that the nonvolatile memory element of example 1 is capable of attaining three stable states since the upper and lower electrodes are made of different materials.

[Experiment on Electrode Material]

To investigate an extent to which a switching magnitude of the resistance value depends on the electrode material, an experiment was conducted. Initially, the nonvolatile memory elements similar to that of FIG. 2, in which the lower electrodes were made of W and the upper electrodes were made of platinum (Pt), iridium (Ir), gold (Au), silver (Ag), copper (Cu), tungsten (W), nickel (Ni), and tantalum nitride (TaN), respectively, were manufactured. The nonvolatile memory element was manufactured as in example 1 and the lower electrode and the upper electrode were deposited by the sputtering process. The oxygen-deficient Ta oxide forming the resistance variable layer was deposited by sputtering Ta metal in $O_2$ and Ar gases. In all of the elements, the resistance variable layers were formed to have the same composition (oxygen-deficient Ta oxide with an oxygen content of about 58%). The reason why the lower electrode layer 103 was made of W is that W is a material which is not easily oxidated and is stable, and is easily processed by, for example, dry etching in manufacture.

Figure 8:
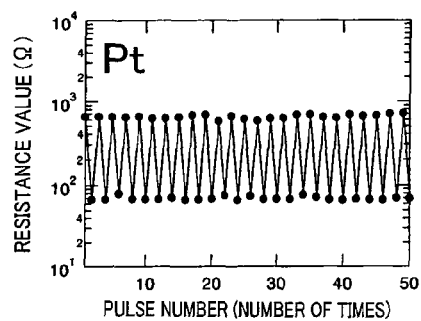
Figure 8:
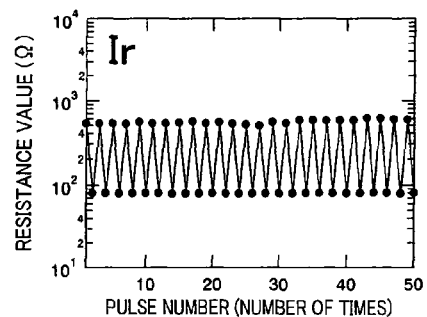
Figure 8:
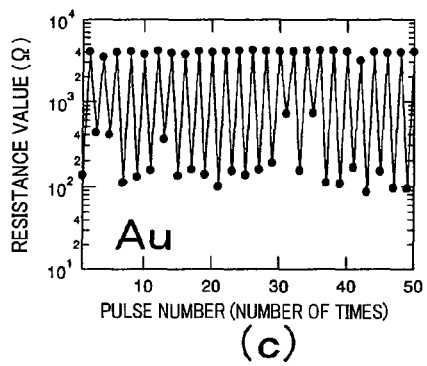
Figure 8:
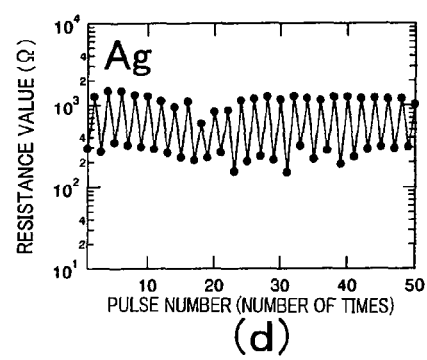
Figure 8:
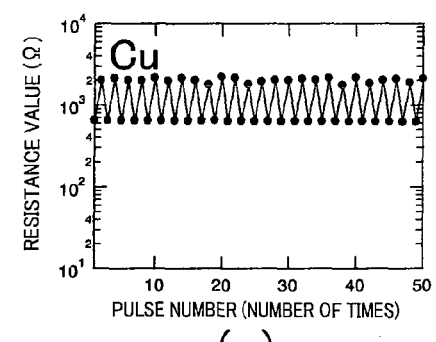
Figure 8:
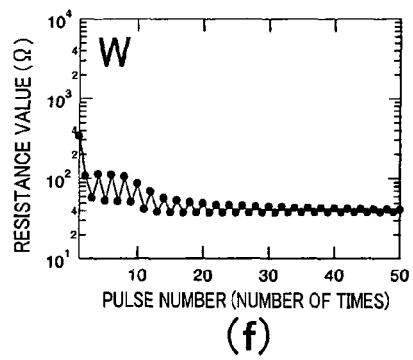
Figure 8:
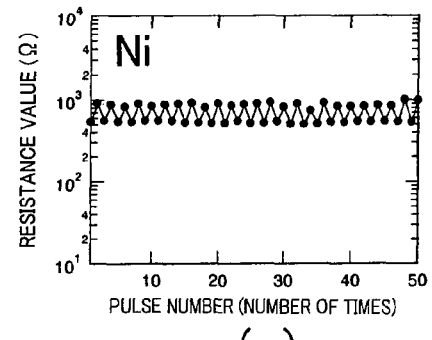
Figure 8:
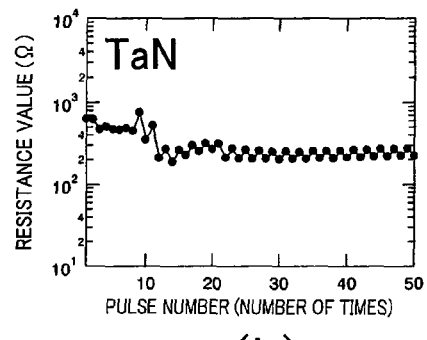

FIG. 8 is a view showing switching of the resistance value of nonvolatile memory elements, in which FIG. 8(a) shows switching of the resistance value of an element having an upper electrode made of platinum (Pt), FIG. 8(b) shows switching of the resistance value of an element having an upper electrode made of iridium (Ir), FIG. 8(c) shows switching of the resistance value of an element having an upper electrode made of gold (Au), FIG. 8(d) shows switching of the resistance value of an element having an upper electrode made of silver (Ag), FIG. 8(e) shows switching of the resistance value of an element having an upper electrode made of copper (Cu), FIG. 8(f) shows switching of a resistance value of an element having an upper electrode made of tungsten (W), FIG. 8(g) shows switching of a resistance value of an element having an upper electrode made of nickel (Ni), and FIG. 8(h) shows switching of the resistance value of an element having an upper electrode made of tantalum nitride (TaN). In FIG. 8, the element symbols indicate the materials used for the upper electrode, a horizontal axis indicates the number of electric pulse application and a vertical axis indicates the resistance value. The pulse width of the electric pulses was set to 100 nsec. For every element, an experiment was conducted so that the element switched to the high-resistance state when the electric potential of the upper electrode was higher than that of the lower electrode. That is, the experiment was conducted so that resistance switching occurred at the upper electrode side. The voltages of the electric pulses for switching the element to the high-resistance state were set to +1.8V~+2.0V and the voltages of the electric pulses for switching the element to the low-resistance state were set to −1.3V~−1.6V.

As can be seen from FIG. 8, the characteristics of the elements were different depending on the electrode materials, even though the resistance variable layers were made of the same material. That is, depending on the electrode material, there were differences in switching magnitude of the resistance value, the resistance value corresponding to the high-resistance state and the resistance value corresponding to the low-resistance state. In addition, depending on the electrode material, there were differences in the voltages for switching the resistance states and their absolute values.

From the result of this experiment, it can be seen that the resistance value corresponding to the high-resistance state at the upper electrode side is different from the resistance value corresponding to the high-resistance state at the lower electrode side, and thereby a resistance variable element operable as a three-valued element can be formed if the upper electrode and the lower electrode are made of different materials. In combinations other than the combination of Pt and W, it is desirable to make a difference between the resistance value corresponding to the high-resistance state and the resistance value corresponding to the low-resistance state such that this difference is as large as possible between the upper electrode side and the lower electrode side. Preferable combinations of the electrode materials are, for example, Pt and Au, Pt and Ag, Pt and Cu, and Pt and Ni. Or, the combinations may be, for example, Ir and Au, Ir and Ag, Ir and Cu, or Ir and Ni.

[Experiment on Material of Resistance Variable Layer]

1. X-Ray Diffraction

Figure 9:
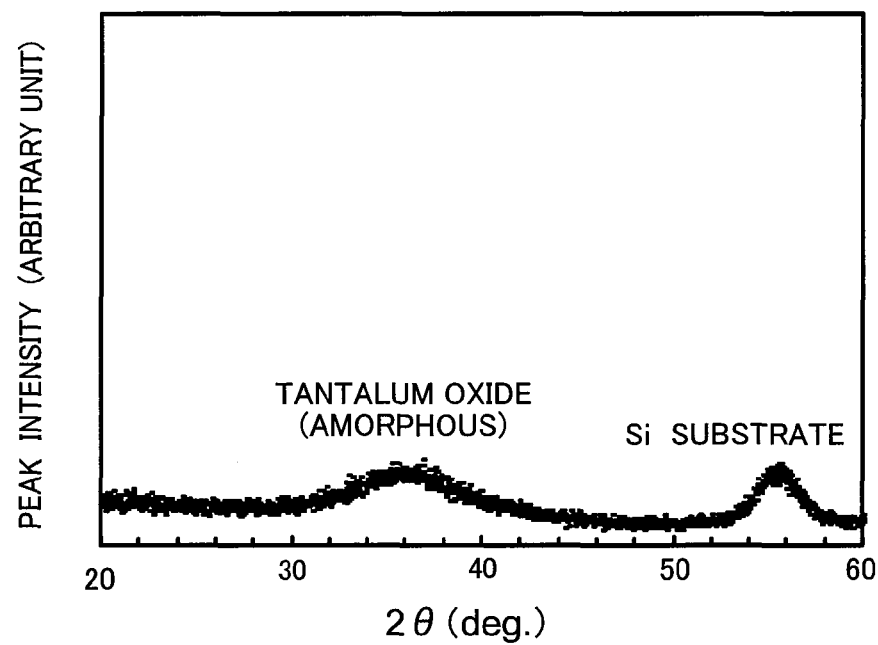
FIG. 9 is a XRD (X-ray diffraction) chart of a resistance variable layer being 40 nm in thickness and made of tantalum oxide which is deposited when a substrate temperature is set to 30 degrees centigrade, and an $O_2$ flow ratio (flow ratio of $O_2$ in a sputtering gas) is set to 0.5%.

FIG. 9 is a XRD (X-ray diffraction) chart of a resistance variable layer made of a 40 nm-thick tantalum oxide, which is obtained when a substrate temperature was set to 30° C., and $O_2$ flow ratio (flow ratio of $O_2$ to a sputtering gas) was set to 0.5%. The chart shows a result of measurement conducted using a thin film method. As can be seen from FIG. 9, a peak of metal Ta cannot be confirmed, and therefore, it may be presumed that the tantalum oxide is obtained. In addition, it may be considered that the tantalum oxide is in an amorphous state because a broad peak is confirmed in a range where $2\theta$ is 30~40 degrees. Note that the peak appearing when $2\theta$ is 56 degrees is attributed to the silicon substrate.

2. Composition

Figure 10:
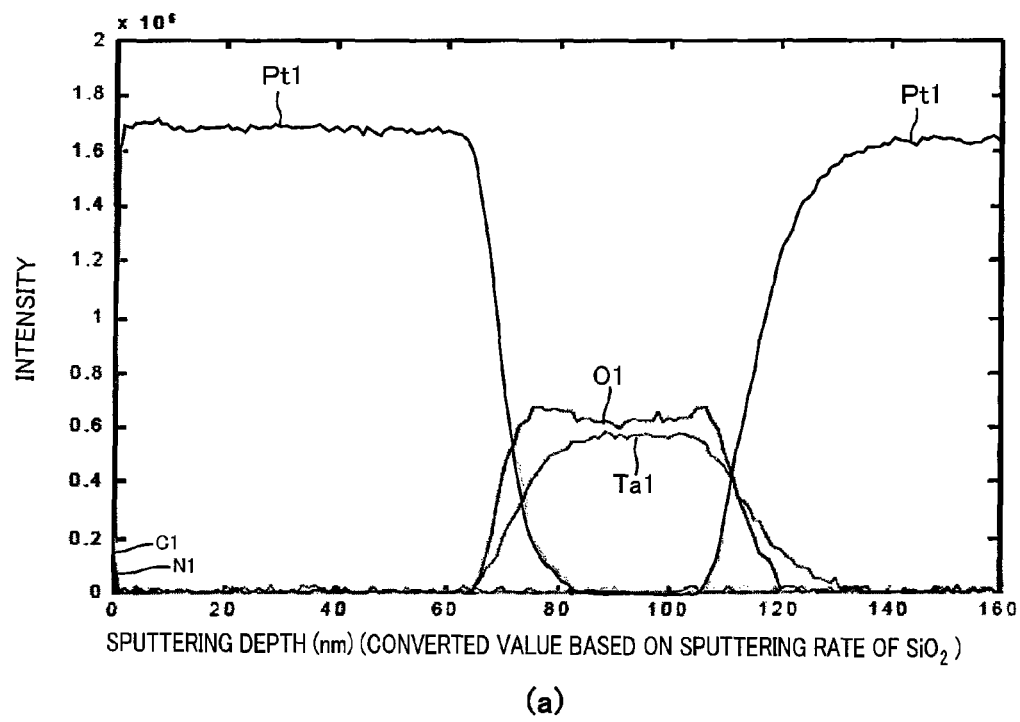
FIG. 10(a) is a view showing an Auger analysis result in a depth direction of a Ta oxide sample of a nonvolatile memory element using an oxygen-deficient Ta oxide as a material of a resistance variable layer.
FIG. 10(b) is a view showing an Auger analysis result in a depth direction of an element in which a metal Ta instead of the oxygen-deficient Ta oxide is sandwiched between platinum electrodes.
Figure 10:
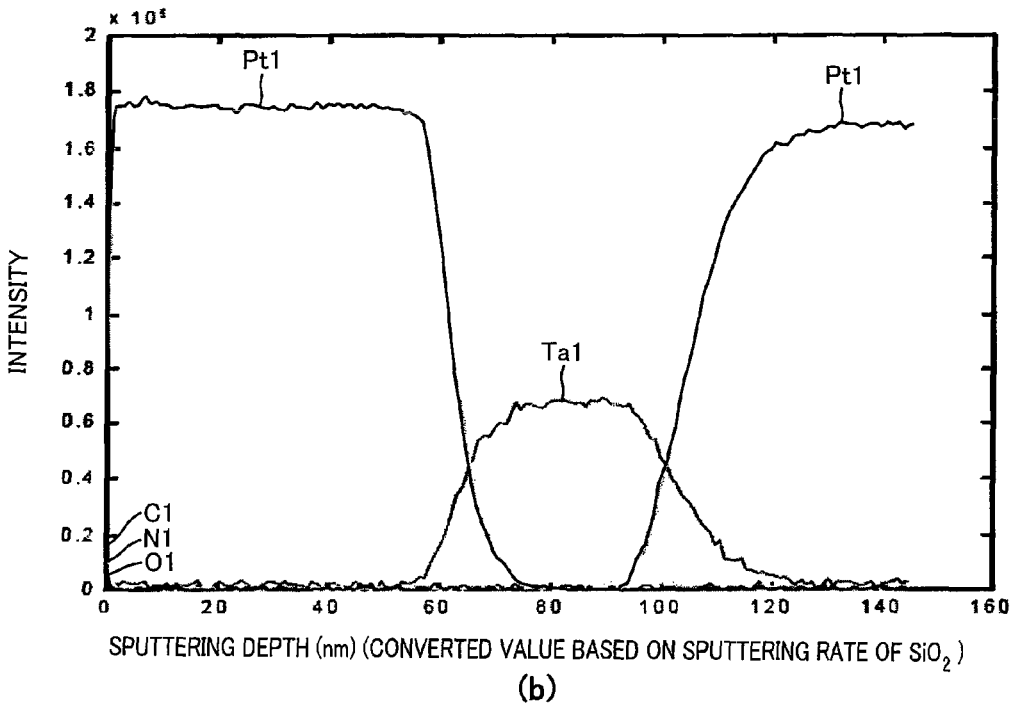

FIG. 10(*a*) is a view showing an Auger analysis result in a depth direction of a Ta oxide sample of a nonvolatile memory element using an oxygen-deficient Ta oxide as a material of a resistance variable material, and FIG. 10(*b*) is a view showing an Auger analysis result in a depth direction of an element in which a metal Ta instead of the oxygen-deficient Ta oxide is sandwiched between platinum electrodes. The metal Ta sample has a thickness of 20 nm. A 50 nm-thick Pt upper electrode is formed over the metal Ta sample.

As should be clearly understood from comparison between FIGS. 10(*a*) and 10(*b*), in the Ta oxide, tantalum has been oxidated. A result of analysis of an atom ratio of O to Ta in the sample was O/Ta=0.5/1.

Furthermore, more accurate composition analysis was conducted by a RBS (Rutherford Back Scattering) method. As a result, a composition of the sample of "O/Ta=0.5/1" atom ratio in the Auger analysis was O/Ta=1.4/1 in the RBS method. Note that the composition analysis according to the RBS method relates to an average composition of the entire resistance variable layer. Several documents (for example, Pei-Chuen Jiang and J. S. Chen, 2003, Journal of Vacuum Science A, Vol. 21, No. 3, pp. 616-622) report that the result of the Auger analysis is different from the result of the RBS analysis result as described above. According to this document, it is required that a sensitivity coefficient be compensated for each material in the Auger analysis, and the RBS analysis generally provides higher reliability than the Auger analysis.

The result of the RBS analysis corresponds to a composition of a center region in a thickness direction of the tantalum oxide in the result shown in FIG. 10(*a*). As can be seen from FIG. 10(*a*), an oxygen content increases in the vicinity of both interfaces (interfaces between the Pt layer and the tantalum oxide layer) of the tantalum oxide layer. Therefore, there is a chance that the oxygen content in the interface regions is higher than the composition analyzed by the RBS method.

3. Relation Between $O_2$ Flow Ratio and Composition

Figure 11:
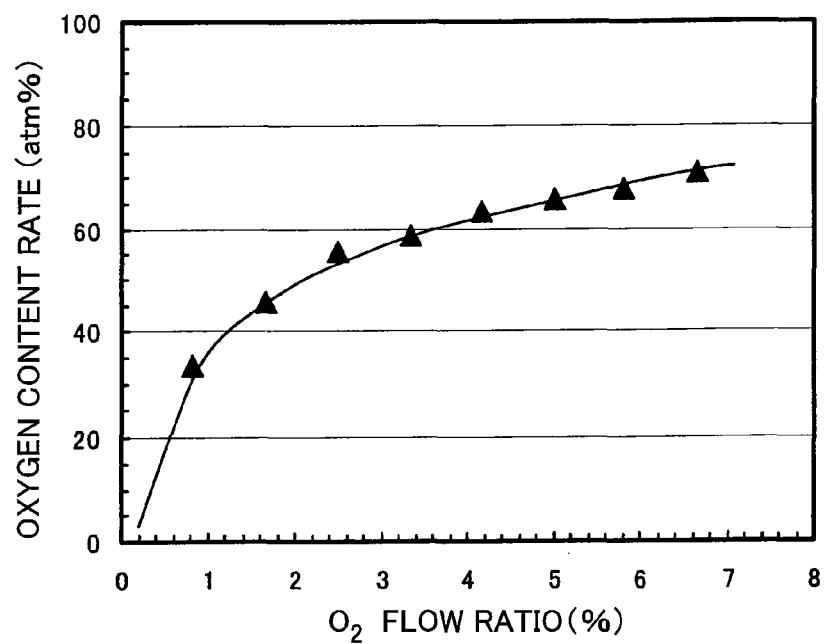
FIG. 11 is a view showing the relationship between the $O_2$ flow ratio in the sputtering gas in a manufacturing step and the oxygen content (atom ratio) of the Ta oxide layer analyzed by a RBS method.

FIG. 11 is a view showing a relationship between the $O_2$ flow ratio of the sputtering gas in a manufacturing step and the oxygen content (atom ratio) of the Ta oxide layer which is analyzed by the RBS method. It is observed that the oxygen content tends to be saturated when the $O_2$ flow ratio is 7% or higher. Nonetheless, it can be seen that the composition of the tantalum oxide layer can be controlled continuously based on the $O_2$ flow ratio. That is, when the tantalum oxide layer is formed by the reactive RF sputtering process, the oxygen content of the tantalum oxide layer can be controlled to have a desired constant value in the thickness direction of the tantalum oxide layer by controlling the $O_2$ flow ratio of the sputtering gas.

4. Relationship Between $O_2$ Flow Ratio and Resistivity

Figure 12:
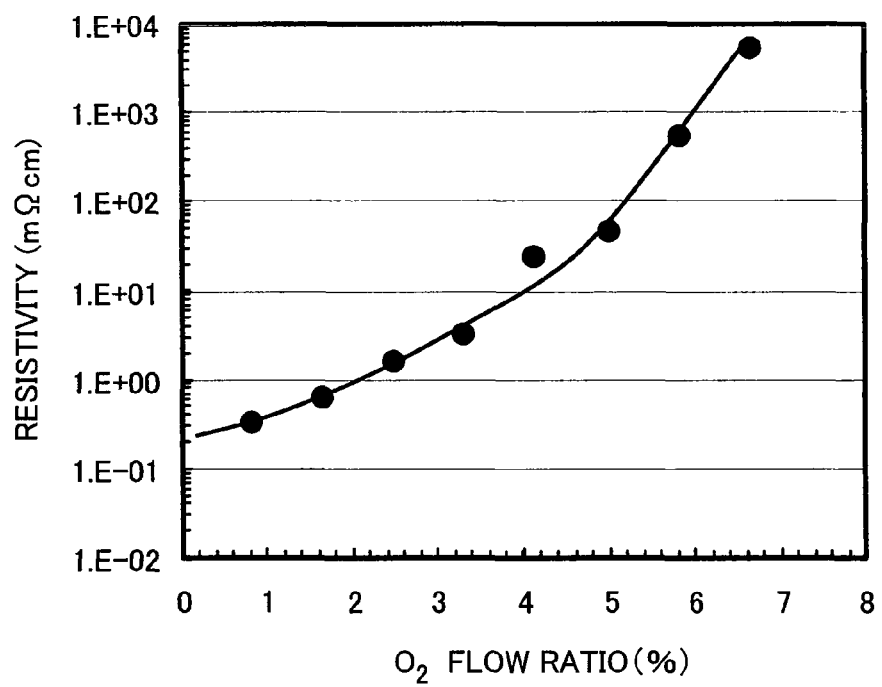
FIG. 12 is a view showing the relationship between the $O_2$ flow ratio in the sputtering gas in a manufacturing step and the resistivity of a resistance variable layer in a case where the resistance variable layer is made of Ta oxide.
Figure 13:
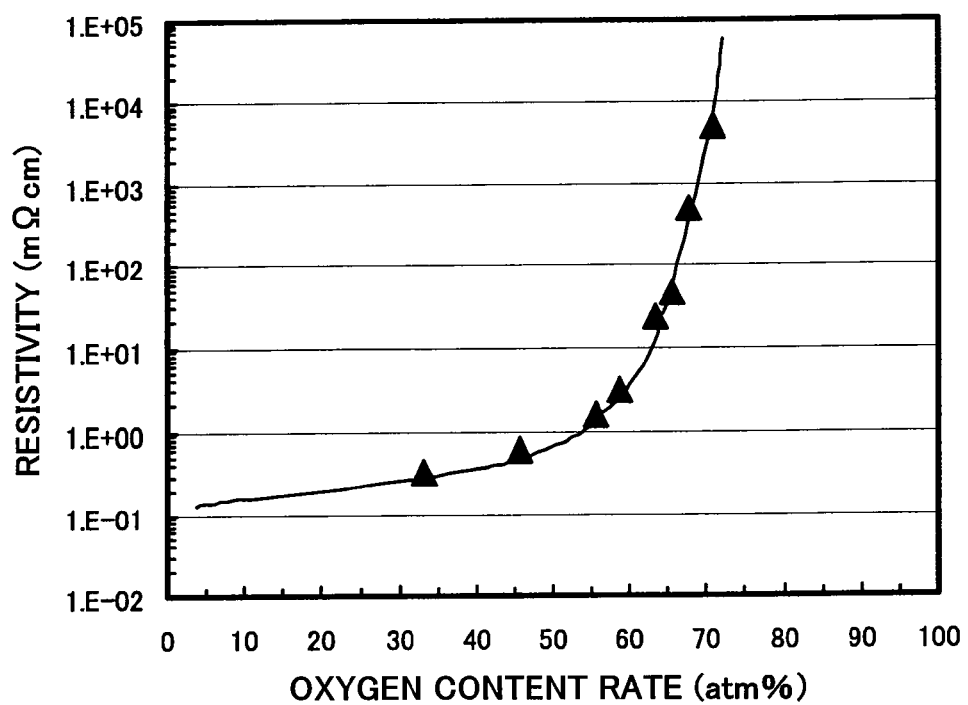
FIG. 13 is a view showing the relationship between the oxygen content (atom ratio) of the resistance variable layer analyzed by the RBS method and the resistivity of the resistance variable layer, in a case where the resistance variable layer is made of Ta oxide.

FIG. 12 is a view showing the relationship between the $O_2$ flow ratio of the sputtering gas in a manufacturing step and resistivity of the resistance variable layer, in the case where the resistance variable layer is made of Ta oxide. FIG. 13 is a view showing the relationship between the oxygen content (atom ratio, atm %) of the resistance variable layer analyzed by the RBS method and the resistivity of the resistance variable layer, in the case where the resistance variable layer is made of the Ta oxide. The resistivity described here is calculated based on measurement result of a sheet resistance value by a four-terminal method, for the sample in which only the resistance variable layer is directly formed on the substrate (silicon wafer provided with a nitride layer).

As can be seen from FIG. 12, the resistivity of the resistance variable layer changes continuously according to the value of the $O_2$ flow ratio. To be specific, as described above, the oxygen content of the tantalum oxide layer (resistance variable layer) changes continuously according to the value of the $O_2$ flow ratio. As shown in FIG. 13, the resistivity of the resistance variable layer changes continuously according to the oxygen content of the resistance variable layer. Therefore, the resistivity of the resistance variable layer can be controlled continuously based on the oxygen content of the resistance variable layer. From this, it may be considered that the oxygen content of the resistance variable layer must fall within a proper range to obtain a favorable resistance variable phenomenon in the resistance variable layer.

5. Suitable Numeric Value Range of O/Ta Ratio

The inventors measured resistivities of samples having oxygen contents shown in FIG. 13 and found a regression curve of measurement data. FIG. 13 shows the measurement data (indicated by black triangles) and a regression curve thereof.

Figure 14:
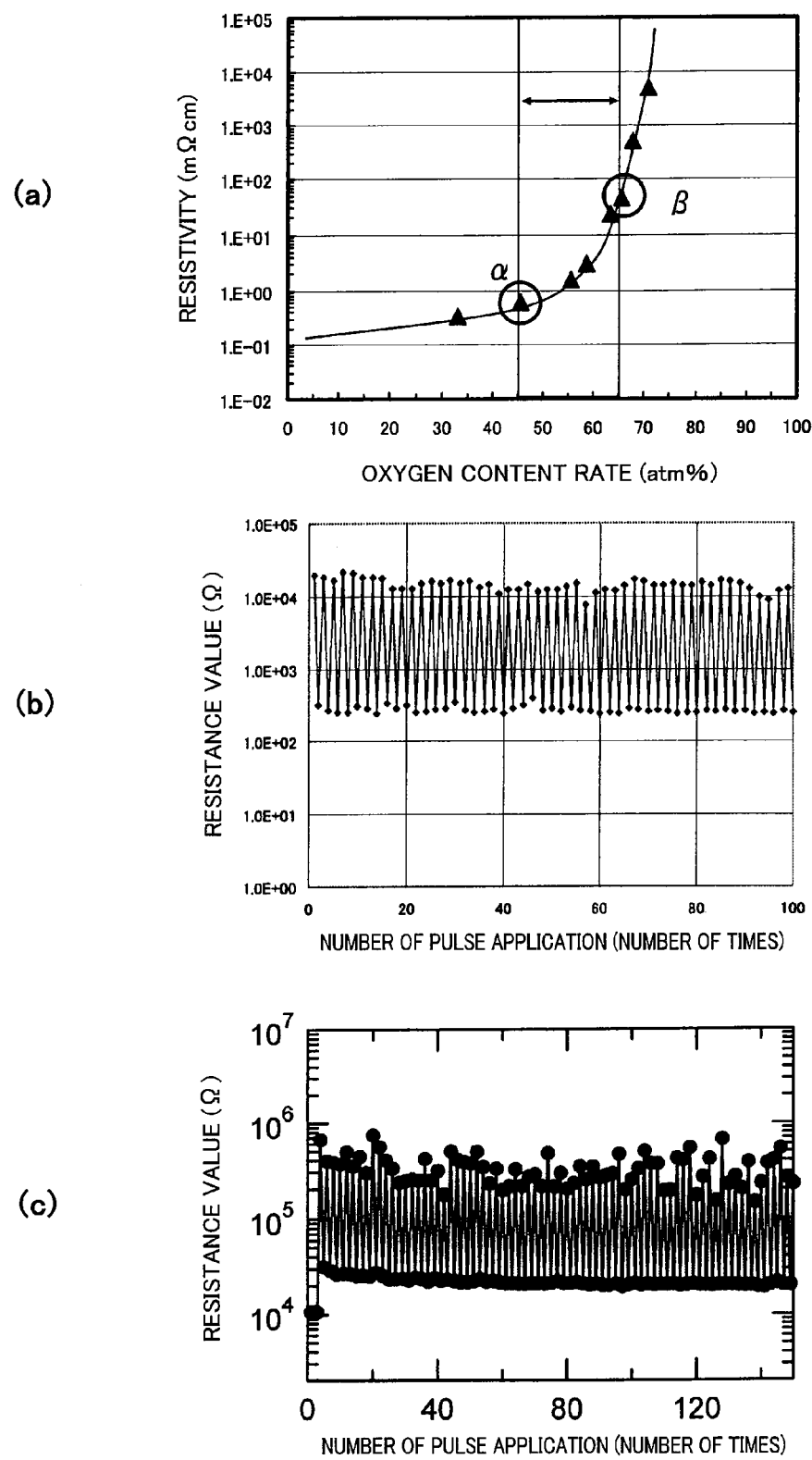

FIG. 14 is a view showing a resistance variable characteristic in a composition range in which the oxygen content of the resistance variable layer is 45~65 atm %. FIG. 14($a$) is a view showing a relationship between the oxygen content and the resistivity. FIG. 14($b$) is a view showing a relationship between the number of pulse applications and the resistance value in the case where the oxygen content is 45 atm %. FIG. 14($c$) is a view showing a relationship between the number of pulse applications and the resistance value in the case where the oxygen content is 65 atm %.

According to the measurement of the resistance variable characteristic, in a range of the oxygen content from point a (oxygen content: 45 atm %) to point β(oxygen content: 65 atm %) shown in FIG. 14($a$), the resistance value corresponding to the high-resistance state was favorably not less than five times as large as the resistance value corresponding to the low-resistance state. FIG. 14($b$) shows a resistance variable characteristic of the sample having the oxygen content at the point α (oxygen content: 45 atm %) with respect to the number of pulse applications and FIG. 14($c$) shows a resistance variable characteristic of the sample having the oxygen content at the point 13 (oxygen content: 65 atm %) with respect to the number of pulse applications. As can be seen from FIGS. 14($b$) and 14($c$), in both of the oxygen content at the point α and the oxygen content at the point β, the resistance value corresponding to the high-resistance state is favorably not less than five times as large as the resistance value corresponding to the low-resistance state. In the range of the oxygen content from the point a (oxygen content: 45 atm %) to the point β (oxygen content: 65 atm %), the resistance value corresponding to the high-resistance state is favorably not less than five times as large as the resistance value corresponding to the low-resistance state. Therefore, the composition range from α to β may be regarded as a proper composition range in which the resistance variable layer can operate stably as a memory element. Therefore, the composition range in which the oxygen content is 45~65 atm %, i.e., the range of x, $0.8 \leq x \leq 1.9$ in the case where the resistance variable layer is expressed as TaOx is a more proper composition range of the resistance variable layer (oxygen content=45 atm % corresponds to x=0.8, and the oxygen content=65 atm % corresponds to x=1.9).

Herein, a mechanism of the resistance variable phenomenon will be considered. As described above, the nonvolatile memory element including the tantalum oxide has a feature in which the electrode side to which the positive voltage is applied switches to a high resistance. From this fact, it may be considered that negatively charged oxygen ions play an important role in the resistance variable phenomenon. To be specific, when the positive voltage is applied to the upper electrode layer 105 on the basis of the lower electrode 103 in the nonvolatile memory element 100 shown in FIG. 2, oxygen inside the tantalum oxide layer 104 ionizes and travels toward the upper electrode layer 105. Thereby, a tantalum oxide layer having a high oxygen concentration and a very large resistance value is formed in the vicinity of the upper electrode 105, resulting in an increase in a resistance between the lower electrode 103 and the upper electrode 105. On the other hand, when the negative voltage is applied to the upper electrode layer 105 on the basis of the lower electrode 103, oxygen ions are released from the tantalum oxide layer with a high oxygen concentration in the vicinity of the upper electrode 105 and travel toward the tantalum oxide 104. As a result, the resistance between the lower electrode 103 and the upper electrode 105 decreases. Based on the mechanism described above, the tantalum oxide layer 104 must attain quasi-stable states. For example, $Ta_2O_5$ is a stoichiometrically stable substance, and does not easily produce oxygen ions. For this reason, if $Ta_2O_5$ is used as the tantalum oxide layer 104, resistance switching would not occur. On the other hand, if Ta is used as the resistance variable layer, no oxygen is contained in Ta and oxygen ions do not travel. In this case, resistance switching does not occur. For the reasons explained above, in the present invention, it may be presumed that, even outside the composition range ($0.8 \leq x \leq 1.9$), the resistance variable phenomenon occurs by using a Ta oxide (i.e., $0<x<2.5$ in TaOx) which is an oxygen-deficient Ta Oxide and has a smaller oxygen content than $Ta_2O_5$ (corresponding to x=2.5 in TaOx) which is an insulator.

Even in the resistance variable layer outside the above described composition range, the resistance variable phenomenon is confirmed or presumably recognized. However, as compared to the resistance variable phenomenon of the resistance variable layer within this composition range, the resistivity is smaller or larger, and therefore the resistance value corresponding to the high-resistance state may be considered to be less than five times as large as the resistance value corresponding to the low-resistance state. Therefore, if the resistance variable layer outside above described composition range is used, stable operation of the memory element would be relatively difficult.

[Imprinting Characteristics]

In the nonvolatile memory element which is vertically symmetric and including a resistance variable layer made of the oxygen-deficient Ta oxide, an imprinting characteristic of the set resistance value of the nonvolatile memory element in the case where the electric pulses with the same polarity were continuously applied between the electrodes was favorable. For example, when the negative electric pulses were applied between the electrodes of the nonvolatile memory element continuously twenty times to continuously generate the low-resistance state and then the positive and negative electric pulses were continuously applied alternately, the element stably repeated the high-resistance state or the low-resistance state. In addition, when the positive electric pulses were applied between the electrodes of the nonvolatile memory element continuously twenty times to continuously generate the high-resistance state and then the positive and negative electric pulses were continuously applied alternately, the element stably repeated the high-resistance state or the low-resistance state in the same manner. From the above result, the nonvolatile memory element including the oxygen-deficient Ta oxide has high imprinting resistance, and is expected to be capable of stable operation.

[Relationship Between Width of Electric Pulse Applied and Resistance Value]

Figure 15:
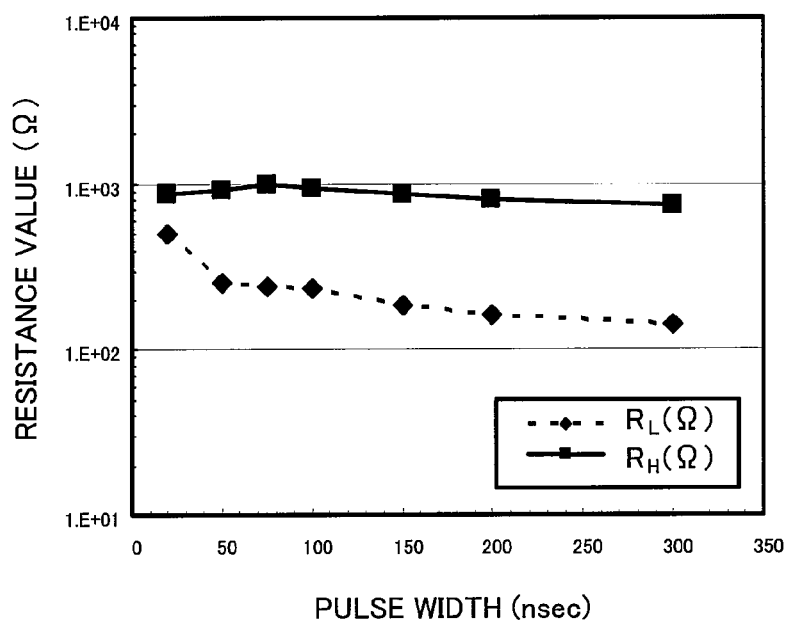
FIG. 15 is a view showing the relationship between the width of electric pulse applied between electrodes and the resistance value of a resistance variable layer in a nonvolatile memory element which is vertically symmetric and uses the oxygen-deficient Ta oxide as the material of the resistance variable material.

FIG. 15 is a view showing the relationship between a width of the electric pulses applied between electrodes and the resistance value of the resistance variable layer in the nonvolatile memory element which has a resistance variable layer made of the oxygen-deficient Ta oxide and is vertically symmetric. In FIG. 15, $R_H$ indicates the resistance value corresponding to the high-resistance state and $R_L$ indicates the resistance value corresponding to the low-resistance state. Each of $R_H$ and $R_L$ indicates an average value of the resistance values of the resistance variable layer in the case where the electric pulse with each pulse width is applied 100 times.

As shown in FIG. 15, in the case of a high-speed pulse in which the width of the electric pulse applied is 20 nsec, the resistance variable phenomenon could be confirmed. The value of $R_H$ was substantially constant when the pulse width was between 20 nsec and 300 nsec. On the other hand, the value of $R_L$ tended to increase when the pulse width was 20 nsec.

Embodiment 2

In Embodiment 1, the nonvolatile memory element is configured to be vertically asymmetric by forming the lower electrode and the upper electrode from different materials. On the other hand, in Embodiment 2, the nonvolatile memory element is configured to be vertically asymmetric, by making the material of the resistance variable layer different between the lower electrode side and the upper electrode side. In Embodiment 2, oxygen content of the oxygen-deficient transition metal oxide is made different.

[Configuration of Element]

Figure 16:
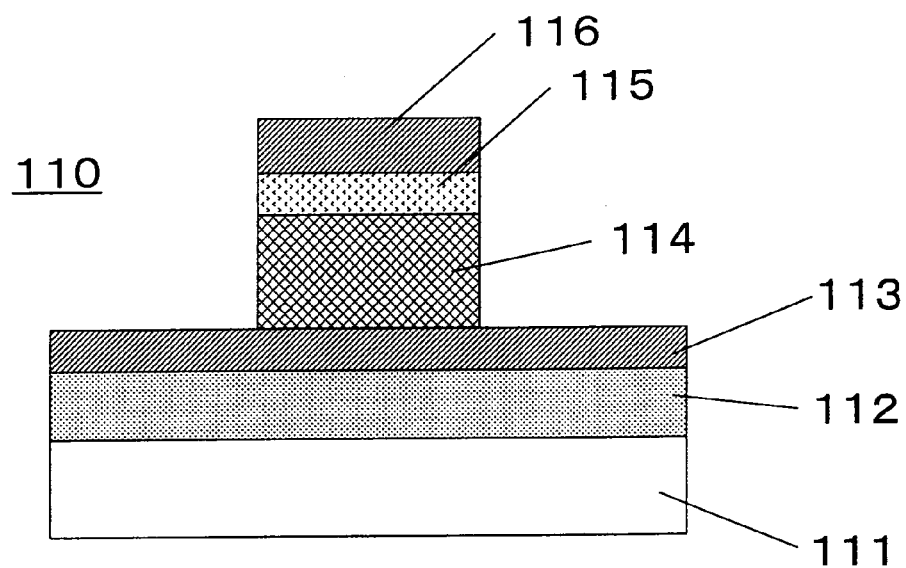
FIG. 16 is a schematic view showing an example of a cross section of a nonvolatile memory element according to Embodiment 2 of the present invention.

FIG. 16 is a schematic view showing an example of a cross section of the nonvolatile memory element according to Embodiment 2 of the present invention. As shown in FIG. 16, a nonvolatile memory element 110 of this embodiment includes a substrate 111, an oxide layer 112 formed over the substrate 111, a lower electrode layer 113 (first electrode) formed over the oxide layer 112, a first resistance variable layer 114 formed over the lower electrode layer 113, a second resistance variable layer 115 formed over the first resistance variable layer 114, and an upper electrode layer 116 (second electrode) formed over the second resistance variable layer 115. Each of the first resistance variable layer 114 and the second resistance variable layer 115 includes an oxygen-deficient transition metal oxide (desirably oxygen-deficient Ta oxide). The oxygen content of the second resistance variable layer 115 is higher than the oxygen content of the first resistance variable layer 114.

Each of the first resistance variable layer 114 and the second resistance variable layer 115 reversibly switches its resistance value in response to the interelectrode voltage. When writing data to the nonvolatile memory element 110, the voltages with predetermined conditions are applied from an external electric power supply between the lower electrode layer 113 and the upper electrode layer 116. The voltages may be applied in the form of, for example, electric pulses. The nonvolatile memory element 110 has a characteristic in which the resistance value does not switch even if the electric pulses of the same voltage are applied many times.

[Manufacturing Method of Element]

The manufacturing method of the nonvolatile memory element 110 is basically identical to the manufacturing method of the nonvolatile memory element 100 of Embodiment 1, and is manufactured by, for example, the following method.

Initially, over the substrate 111 which is made of a single crystal silicon, the oxide layer 112 is formed by thermal oxidation process. A metal thin layer is deposited over the oxide layer 112 by a sputtering process to form the lower electrode layer 113. In this embodiment, platinum (Pt) is used as, for example, the material of the lower electrode layer 113.

Then, a layer of the oxygen-deficient transition metal oxide is deposited over the lower electrode layer 113 as the resistance variable layer. The oxygen-deficient transition metal oxide may be formed by sputtering, for example, a transition metal target in Ar and $O_2$ gases. The sputtering condition may be similar to that of example 1 of Embodiment 1, for example.

Thereafter, the substrate 111 is introduced into the oxygen plasma generating device and the top surface of the substrate 111 is exposed in oxygen plasma for a specified time (e.g., 30 seconds). Through this process, the surface of the oxygen-deficient resistance variable layer is oxidated, forming the first resistance variable layer 114 with a lower oxygen content and the second resistance variable layer 115 with a higher oxygen content. Although the first resistance variable layer 114 and the second resistance variable layer 115 are schematically expressed as being distinguished clearly in FIG. 16, it may be considered that a structure in which the oxygen content continuously decreases from the surface of the second resistance variable layer 115 to the first resistance variable layer 114 is actually formed. Thereafter, a metal thin layer is deposited over the second resistance variable layer 115 by the sputtering process, to form the upper electrode layer 116. In this embodiment, platinum (Pt) may be used as the material of the upper electrode 116, for example. In this embodiment, the lower electrode layer 113 and the upper electrode layer 116 are made of the same material.

Through the above process, the nonvolatile memory element 110 is manufactured, in which the oxygen content of the portion (in the vicinity of the upper electrode or at the upper electrode side) of the resistance variable layer which is in contact with the upper electrode is different from the oxygen content of the portion (in the vicinity of the lower electrode or at the lower electrode side) of the resistance variable layer which is in contact with the lower electrode.

In Embodiment 2, the electrode materials and the resistance variable layer material may be the same as those of Embodiment 1.

It is sufficient that the concentration of the resistance variable layer is different in the vicinity of the respective electrodes. The resistance variable layer may have a structure of three or more layers or its oxygen content may be tilted in change.

Although the oxygen content of the portion of the resistance variable layer which is in contact with the upper electrode is made different from the oxygen content of the portion of the resistance variable layer which is in contact with the lower electrode, by oxidating the surface of the resistance variable layer, the treatment method of the resistance variable layer is not limited to such a method. To be specific, without oxidation, two or more kinds of oxygen-deficient Ta oxide layers having different oxygen contents may be deposited. The oxygen content of the Ta oxide desirably satisfies a relationship of $0<x<y<2.5$, when the Ta oxide included in the first resistance variable layer is expressed as $TaO_x$ and the Ta oxide included in the second resistance variable layer is expressed as $TaO_y$. In this case, the oxygen content of the Ta oxide more desirably satisfies a relationship of $0.8 \leq x \leq 1.9$. The oxygen content of the first resistance variable layer 114 may be higher than the oxygen content of the second resistance variable layer 115. That is, $x>y$ may be satisfied.

In this embodiment, the lower electrode layer 113 and the upper electrode layer 116 are directly in contact with the first resistance variable layer 114 and the second resistance variable layer 115, respectively. In this embodiment, the area of the portion of the first resistance variable layer 114 which is in contact with the lower electrode layer 113 is equal to the area of the portion of the second resistance variable layer 115 which is in contact with the upper electrode layer 116. In this embodiment, the lower electrode side and the upper electrode side are symmetric in structure except for the composition of the resistance variable layer.

The nonvolatile memory element of this embodiment exhibits a characteristic similar to that shown in FIG. 3(c).

Therefore, the nonvolatile memory element of this embodiment is capable of stably writing and reading three-valued data.

Example 3

In example 3, the nonvolatile memory element having a configuration shown in FIG. 16 was manufactured by the following method.

Initially, over a single crystal silicon substrate, a 200 nm-thick oxide layer was formed by thermal oxidation. A 200 nm-thick metal thin layer was deposited over the oxide layer by a sputtering process to form a lower electrode layer. In this example, platinum (Pt) was used as the material of the lower electrode layer.

Then, an oxygen-deficient Ta oxide was deposited over the lower electrode layer to form a 30 nm-thick layer as a resistance variable layer. The oxygen-deficient Ta oxide was deposited by sputtering a Ta target in $A_r$ and $O_2$ gases. The specific sputtering condition for depositing the resistance variable layer was such that the vacuum of degree (back pressure) within a sputtering device before starting the sputtering was set to about $7\times10^{-4}$ Pa, the power for sputtering was set to 250 W, the total gas pressure of argon gas and oxygen gas was set to 3.3 Pa, the partial pressure ratio of oxygen gas was set to 3.8%, the temperature of the substrate was set to 30 degrees centigrade, and the layer deposition time was set to seven minutes. Under the condition, the resistance variable layer being 30 nm-thick, made of oxygen-deficient Ta oxide and having an oxygen content of about 58 atm % was deposited. When the oxygen-deficient Ta oxide is expressed as $TaO_x$, x is 1.38 in the Ta oxide with an oxygen content of 58 atm %.

Thereafter, the substrate was introduced into the oxygen plasma generating device and the surface of the substrate was exposed in oxygen plasma for 30 seconds. Thereafter, a 100 nm-thick metal thin layer was deposited over the resistance variable layer by the sputtering process, to form the upper electrode layer. In this example, platinum (Pt) was used as the material of the upper electrode layer.

Through the above process, the nonvolatile memory element was manufactured, in which the oxygen-deficient Ta oxide layer having an oxygen content increasing in an upward direction is sandwiched between Pt thin layers from above and from below.

Figure 17:
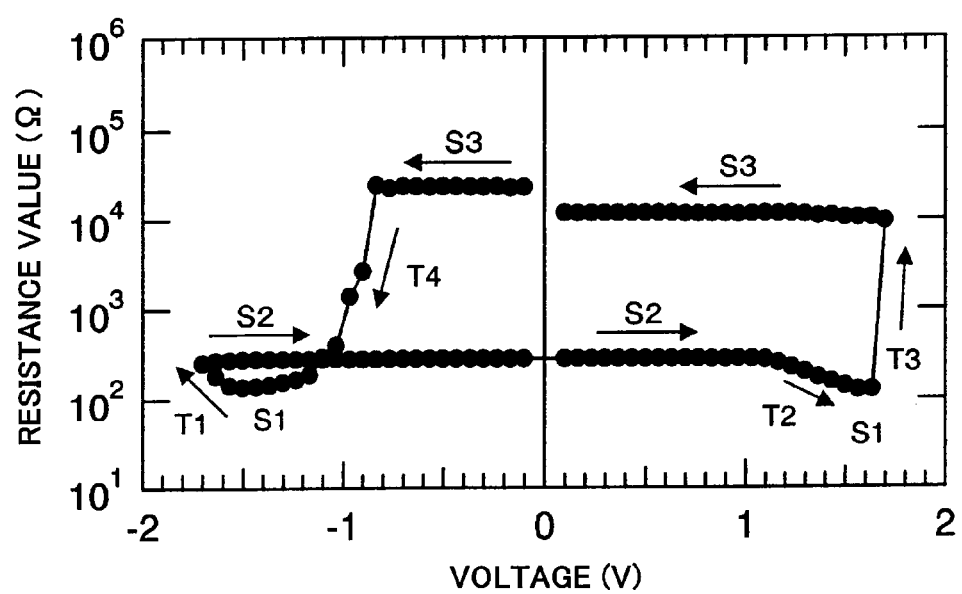
FIG. 17 is a view showing switching of a resistance value occurring when the voltage of an upper electrode with respect to a lower electrode is changed continuously between −1.8V and +1.7V, in a nonvolatile memory element according to example 3 of the present invention.

FIG. 17 is a view showing switching of a resistance value occurring when the voltage of the upper electrode with respect to the lower electrode is changed continuously between −1.8V and +1.7V, in the nonvolatile memory element according to example 3 of the present invention. The voltage application method was similar to that of example 1. Hereinafter, the electric characteristic of the nonvolatile memory element of example 3 will be described with reference to FIG. 17.

In the example shown in FIG. 17, the initial value of the resistance value was about 10000Ω. As indicated by arrows in FIG. 17, the pulse voltage was gradually decreased from 0V to −1.8V, was then gradually increased from −1.8V to +1.7V, and was finally gradually decreased from +1.7V to 0 V. The resistance value was about 10000Ω and constant when the pulse voltage was from 0V to about −0.9V (S3). When the pulse voltage was decreased from −0.9V to −1.5V, the resistance value decreased to about 100Ω (T4). The resistance value was substantially constant for some time (S1). When the voltage was further decreased, the resistance value increased to about 300Ω when the pulse voltage was about −1.8V (T1). Thereafter, the resistance value was about 300Ω and constant even though the voltage was increased from −1.8V to +1V (S2). When the voltage was further increased to +1.6V, the resistance value decreased to about 100Ω (T2) and the resistance value was substantially constant (S1). Thereafter, when the voltage was further increased, the resistance value was increased to about 10000Ω which is close to the initial value when the voltage was about +1.7V (T3). Thereafter, the resistance value was about 10000Ω and constant, even though the voltage was decreased from +1.7V to 0V.

As should be appreciated from the above, the nonvolatile memory element of example 3 has three stable states. The states are the state S1 (about 100Ω) in which the resistance value is smallest when the voltage is about +1.5V and about −1.5V, the state S2 (about 300Ω) in which the resistance value is intermediate when the voltage is from about −1.8 V to about +1V, and the state S3 (about 10000Ω) in which the resistance value is largest when the voltage is from −0.9V to +1.7V. When the state is S1, the resistance value (resistance state) does not switch when the voltage is higher than −1.5V and lower than +1.5V. When the state is S2, the resistance value (resistance state) does not switch when the voltage is lower than +1 V. When the state is S3, the resistance value (resistance state) does not switch when the voltage is higher than about −1 V. The nonvolatile memory element of example 3 is able to store three-valued data utilizing these three stable states.

[Principle of Multi-Valued Memory Utilizing Oxygen Content]

As shown in FIG. 14, in a case where the resistance variable layer is made of the oxygen-deficient Ta oxide, the resistance value of the nonvolatile memory element tends to increase, and the resistance value corresponding to the high-resistance state and the resistance value corresponding to the low-resistance state tend to increase if the oxygen content of the Ta oxide increases. That is, in the resistance variable element comprising the oxygen-deficient Ta oxide with an oxygen content of 45 atm %, the low-resistance state is about 300Ω and the high-resistance state is about $1\times10^4$Ω, as shown in FIG. 14(b). When the oxygen content increases to about 65 atm %, the low-resistance state is $3\times10^4$Ω and the high-resistance state is $3\times10^5$Ω, as shown in FIG. 14(c). In the oxygen content of 65 atm %, a switching magnitude of the resistance value is a single-digit to double-digit larger than in the oxygen content of about 45 atm %.

In this embodiment, since the second resistance variable layer 115 is formed by oxidating the first resistance variable layer 114, the oxygen concentration of the second resistance variable layer 115 is higher. For this reason, the resistance value corresponding to the high-resistance state at the upper electrode side is larger than the resistance value corresponding to the high-resistance state at the lower electrode side. That is, the relationship between the resistance value in switching of the resistance state at the lower electrode side and the voltage is similar to that shown in FIG. 3(a), while the relationship between the resistance value in switching of the resistance state at the upper electrode side and the voltage is similar to that shown in FIG. 3(b). As a result of the composition of these characteristics, the shape of FIG. 13 is very similar to the shape of FIG. 3(c). Therefore, based on a principle similar to that of Embodiment 1, a multi-valued memory is attainable.

Embodiment 3

In Embodiment 2, the nonvolatile memory element is configured to be vertically asymmetric by making the material of the resistance variable layer different between the lower electrode side and the upper electrode side, while in Embodiment 3, the nonvolatile memory element is configured to be vertically asymmetric by making the area of the portion of the resistance variable later which is contact with the lower electrode, different from the area of the portion of the resistance variable layer which is contact with the upper electrode.

[Configuration of Element]

Figure 18:
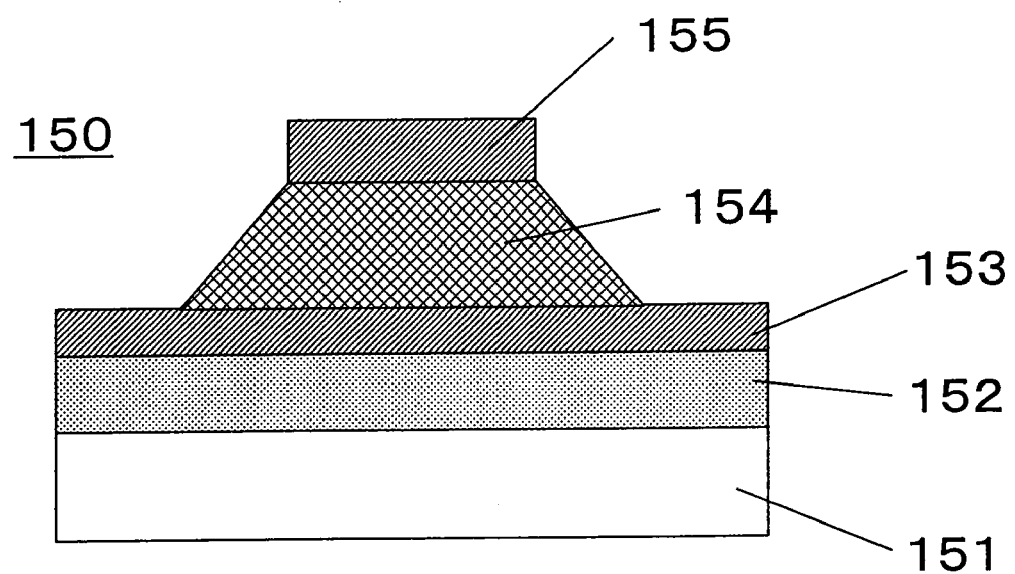
FIG. 18 is a schematic view showing an example of a cross section of a nonvolatile memory element according to Embodiment 3 of the present invention.

FIG. 18 is a schematic view showing an example of a cross section of the nonvolatile memory element according to Embodiment 3 of the present invention. As shown in FIG. 18, a nonvolatile memory element 150 of this embodiment includes a substrate 151, an oxide layer 152 formed over the substrate 151, a lower electrode layer 153 (first electrode) formed over the oxide layer 152, a resistance variable layer 154 formed over the lower electrode layer 153, and an upper electrode layer 155 (second electrode) formed over the resistance variable layer 154. The resistance variable layer 154 includes an oxygen-deficient transition metal oxide (desirably oxygen-deficient Ta oxide). The lower electrode layer 153 and the upper electrode layer 155 may be made of the same material. The resistance variable layer 154 has a taper shape in which a horizontal cross-section decreases in size in an upward direction. The area (e.g., 1.5 μm×1.5 μm=2.25 μm$^2$) of the portion of the resistance variable layer 154 which is in contact with the lower electrode layer 153 is set larger than the area (e.g., 0.5 μm×0.5 μm=0.25 μm$^2$) of the portion of the resistance variable layer 154 which is in contact with the upper electrode layer 155.

The resistance variable layer 154 is configured to reversibly switch a resistance value in response to an interelectrode voltage. When writing data to the nonvolatile memory element 150, voltages with predetermined conditions are applied from an external electric power supply between the lower electrode layer 153 and the upper electrode layer 155. The voltages may be applied in the form of, for example, electric pulses. The nonvolatile memory element 150 has a characteristic in which its resistance value does not switch even if the electric pulses of the same voltage are applied many times.

[Manufacturing Method of Element]

The manufacturing method of a nonvolatile memory element 110 is basically similar to the manufacturing method of the nonvolatile memory element 100 of Embodiment 1, and detailed description thereof is omitted. To form the resistance variable layer 154 in a taper shape, the resistance variable layer 154 may be etched by dry etching using a resist 155 with an unsharp edge portion under the condition in which an etching selectivity between the resist 155 and the resistance variable layer 154 is small.

[Electric Characteristic]

Figure 19:
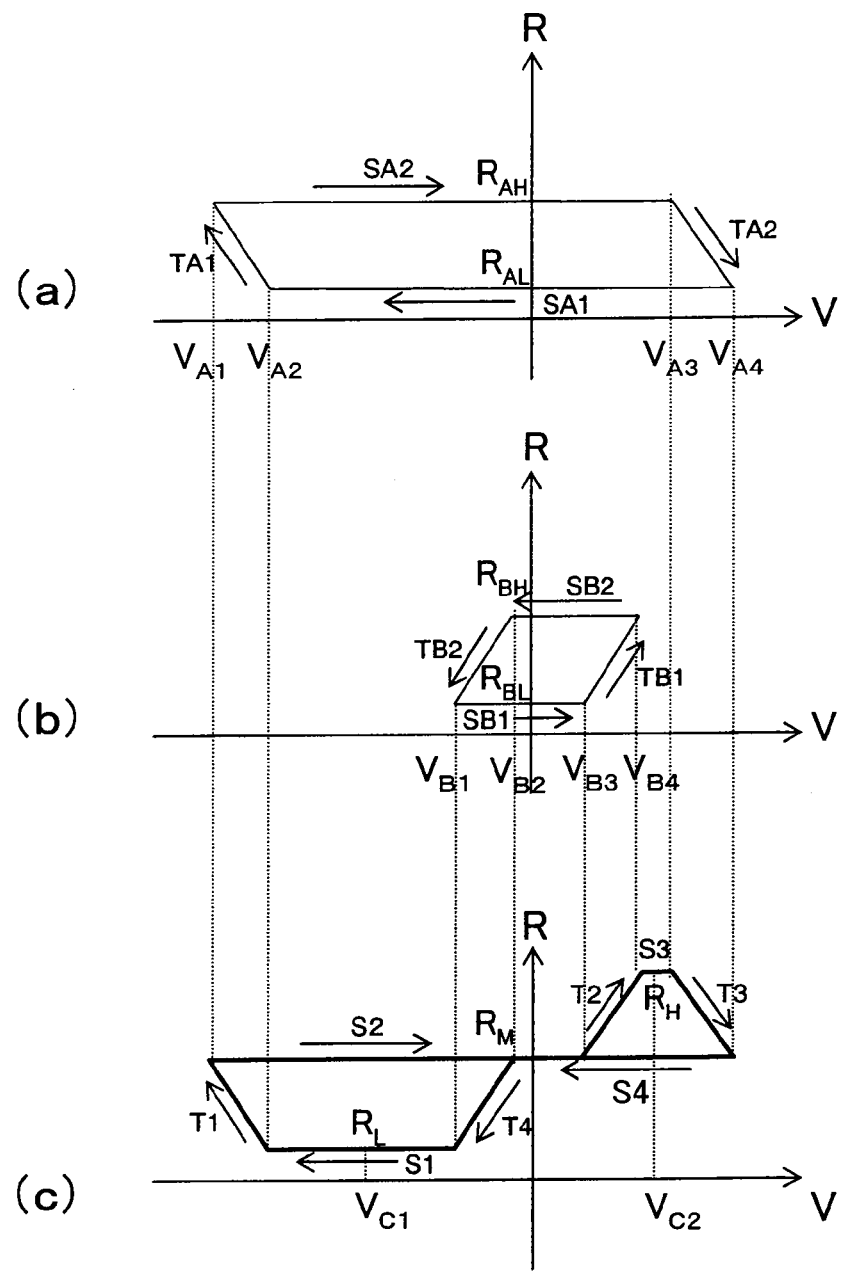

FIG. 19 is a view showing an example of a characteristic of the nonvolatile memory element according to Embodiment 3 of the present invention, in which FIG. 19(a) is a conceptual view showing switching of a resistance value occurring assuming that the upper electrode side retains a low-resistance state and does not switch when the voltage of the upper electrode with respect to the lower electrode is changed continuously between $V_{A1}$ and $V_{A4}$, FIG. 19(b) is a conceptual view showing switching of a resistance value occurring assuming that the lower electrode side retains the low-resistance state and does not switch when the voltage of the upper electrode with respect to the lower electrode is changed continuously between $V_{B1}$ and $V_{B4}$, and FIG. 19(c) is a view showing switching of a resistance value of the whole nonvolatile memory element occurring when the voltage of the upper electrode with respect to the lower electrode is changed continuously between $V_{A1}$ and $V_{A4}$. Hereinafter, the electric characteristic of the nonvolatile memory element 150 will be described with reference to FIG. 19 (also see experiment example 2 and FIG. 20).

As indicated by arrows in FIG. 19(a), assuming that the upper electrode side retains the low-resistance state and does not switch, when the resistance value is $R_{AL}$ (e.g., about 200Ω), the resistance value retains $R_{AL}$ and does not switch even though the voltage is decreased from $V_{A4}$ to $V_{A2}$ (SA1). Thereafter, when the voltage is further decreased from $V_{A2}$ to $V_{A1}$, the resistance value increases from $R_{AL}$ to $R_{AH}$ (e.g., about 1000Ω) (TA1). Thereafter, the resistance value retains $R_{AH}$ and does not switch even though the voltage is increased from $V_{A1}$ to $V_{A3}$ (SA2). Thereafter, when the voltage is further increased from $V_{A3}$ to $V_{A4}$, the resistance value decreases from $R_{AH}$ to $R_{AL}$ (TA2). In the example shown in FIG. 19(a), the element is placed into the high-resistance state when a minus voltage is applied (when the lower electrode side is at a higher electric potential). With reference to the result of experiment example 1, the resistance switches at the lower electrode side. That is, in SA1, both of the lower electrode side and the upper electrode side are in the low-resistance state, while in SA2, the lower electrode side is in the high-resistance state and the upper electrode side is in the low-resistance state.

As indicated by arrows in FIG. 19(b), assuming that the lower electrode side retains the low-resistance state and does not switch, when the resistance value is $R_{BL}$ (e.g., about 200Ω), the resistance value retains $R_{BL}$ and does not switch even though the voltage is increased from $V_{B1}$ to $V_{B3}$ (SB1). When the voltage is further increased from $V_{B3}$ to $V_{B4}$, the resistance value increases from $R_{BL}$ to $R_{BH}$ (e.g., about 1000Ω) (TB1). Thereafter, the resistance value retains $R_{BH}$ and does not switch even though the voltage is decreased from $V_{B4}$ to $V_{B2}$ (SB2). Thereafter, when the voltage is further decreased from $V_{B2}$ to $V_{B1}$, the resistance value decreases from $R_{BH}$ to $R_{BL}$ (TB2). In the example shown in FIG. 19(b), the element is placed into the high-resistance state when a plus voltage is applied (when the upper electrode side is at a higher electric potential). With reference to the result of experiment example 1, the resistance switches at the upper electrode side. That is, in SB1, both of the lower electrode side and the upper electrode side are in the low-resistance state, while in SB2, the lower electrode side is in the low-resistance state and the upper electrode side is in the high-resistance state.

$|V_{A2}|>|V_{B1}|$ (i.e., $-V_{A2}>V_{B1}$), $|V_{A3}|>|V_{B4}|$ (i.e., $-V_{A3}>V_{B4}$) $R_{AL}=R_{BL}$, and $R_{AH}=R_{BH}$. That is, the voltage for switching the resistance state is different between the lower electrode side and the upper electrode side, but a switching magnitude of the resistance value is equal between the lower electrode side and the upper electrode side. Such characteristics results from a difference in contact area of the electrode and the resistance variable layer.

As indicated by arrows in FIG. 19(c), when the resistance value is $R_L$ ($=R_{AL}=R_{BL}$), the resistance value retains $R_L$ and does not switch even though the voltage is changed between $V_{B1}$ and $V_{A2}$ (S1). When the voltage is decreased from $V_{A2}$ to $V_{A1}$, the resistance value increases from $R_L$ to $R_M$ ($=R_{AH}$) (T1). Thereafter, the resistance value retains $R_M$ and does not switch even though the voltage is increased from $V_{A1}$ to $V_{B3}$ (S2). Thereafter, when the voltage is further increased from $V_{B3}$ to $V_{B4}$, the resistance value increases from $R_M$ to $R_H$ ($=R_{AH}+R_{BH}$) (T2). Thereafter, when the voltage is increased from $V_{B4}$ to $V_{A4}$ by way of $V_{A3}$, the resistance value decreases from $R_H$ to $R_M$ ($=R_{BH}$) (T3). Thereafter, the resistance value retains $R_M$ and does not switch even though the voltage is decreased from $V_{A4}$ to $V_{B2}$ (S4). Thereafter, when the voltage is further decreased from $V_{B2}$ to $V_{B1}$, the resistance value decreases from $R_M$ to $R_L$ (T4). With reference to the result of experiment example 1 and FIGS. 19(a) and 19(b), in S1, both of the lower electrode side and the upper electrode side are in the low-resistance state, in S2, the lower electrode side is in the high-resistance state, and the upper electrode side is in the low-resistance state, in S3, both of the lower electrode side and the upper electrode side are in the high-resistance state, and in S4, the lower electrode side is in the low-resistance state and the upper electrode side is in the high-resistance state. The characteristic of FIG. 19(c) is a composition of the characteristic of FIG. 19(a) and the characteristic of FIG. 19(b). When the relationship of $R_L<R_M<R_H$ is satisfied and the interelectrode voltage is $V_{C1}$ (=$V_\alpha$) satisfying the relationship of $V_{A2}<V_{C1}<V_{B1}$, the resistance value becomes $R_L$ or $R_M$. When the relationship of $R_L<R_M<R_H$ is satisfied and the interelectrode voltage is $V_\beta$ satisfying the relationship of $V_{B2}<V_\beta<V_{B3}$, the resistance value becomes $R_M$. When the relationship of $R_L<R_M<R_H$ is satisfied and the interelectrode voltage is $V_{C2}$ (=$V_\gamma$) satisfying the relationship of $V_{B4}<V_{C2}<V_{A3}$, the resistance value becomes $R_M$ or $R_H$. In addition, when $V_{A1}$ is expressed as $V_1$, $V_{A2}$ is expressed as $V_2$, $V_{C1}$ is expressed as $V_3$, $V_{B1}$ is expressed as $V_4$, $V_{B2}$ is expressed as $V_5$, $V_{B3}$ is expressed as $V_6$, $V_{B4}$ is expressed as $V_7$, $V_{C2}$ is expressed as $V_8$, and $V_{A3}$ is expressed as $V_9$, and $V_{A4}$ is expressed as $V_{10}$, the relationship of $V_1<V_2<V_3<V_4<V_5<0<V_6<V_7<V_8<V_9<V_{10}$ is satisfied. In this embodiment, the nonvolatile memory element is configured to be vertically asymmetric by making a difference between the area of the portion of the resistance variable later which is contact with the lower electrode and the area of the portion of the resistance variable layer which is contact with the upper electrode, so as to satisfy the above conditions.

The upper electrode and the lower electrode may be inverted. In this case, the nonvolatile memory element has a characteristic formed by inverting the characteristic of FIG. 19(C) in a rightward and leftward direction.

[Method of Using Nonvolatile Memory Element 100 as Three-Valued Memory]

In the example shown in FIG. 19(c), if the voltage is set lower than $V_{A1}$, the nonvolatile memory element 150 in any of the resistance states switches to the state of S2 and its resistance value becomes $R_M$. If the voltage is set higher than $V_{A4}$, the nonvolatile memory element 150 in any of the resistance states switches to the state of S4 and its resistance value becomes $R_M$. To place the element into the state of S1, the voltage of $V_{C1}$ ($V_{A2}<V_{C1}<V_{B1}$) is applied to the element in the state of S4, while to place the element into the state of S3, the voltage of $V_{C2}$ ($V_{B4}<V_{C2}<V_{A3}$) is applied to the element in the state of S2. These four states (S1, S2, S3, S4) are states (stable states) in which the resistance values do not substantially switch regardless of a change in a voltage within a certain range. To be specific, when the element is in the state of S1, the resistance value does not substantially switch when the voltage is higher than $V_{A2}$ and lower than $V_{B1}$. When the element is in the state of S2, the resistance value does not substantially switch when the voltage is lower than $V_{B3}$. When the element is in the state of S3, the resistance value does not substantially switch when the voltage is higher than $V_{B4}$ and lower than $V_{A3}$. When the element is in the state of S4, the resistance value does not substantially switch if the voltage is higher than $V_{B2}$. In this embodiment, the electrode material and the composition of the resistance variable layer are the same between the lower electrode side and the upper electrode side, and therefore, the resistance values are substantially equal in the state S2 and the state S4. Therefore, there are three stable state resistance values. By utilizing the three resistance values, the nonvolatile memory element 100 can be used as the nonvolatile memory element capable of stably writing and reading three-valued data.

In this embodiment, modifications similar to those of Embodiment 1 and Embodiment 2 are possible.

Experiment Example 2

In experiment example 2, two kinds of nonvolatile memory elements having a configuration shown in FIG. 2 were manufactured by changing the contact area of the resistance variable layer and the upper electrode. The manufacturing method in experiment example 2 is identical to that of experiment example 1 except that the same electrode material (Pt) is used for the upper electrode and the lower electrode, and detailed description thereof is omitted. The contact area of the resistance variable layer and the upper electrode of one of two elements was 0.5 μm×0.5 μm=0.25 μm$^2$ and the contact area of the resistance variable layer and the upper electrode of the other element was 1.5 μm×1.5 μm=2.25 μm$^2$.

Figure 20:
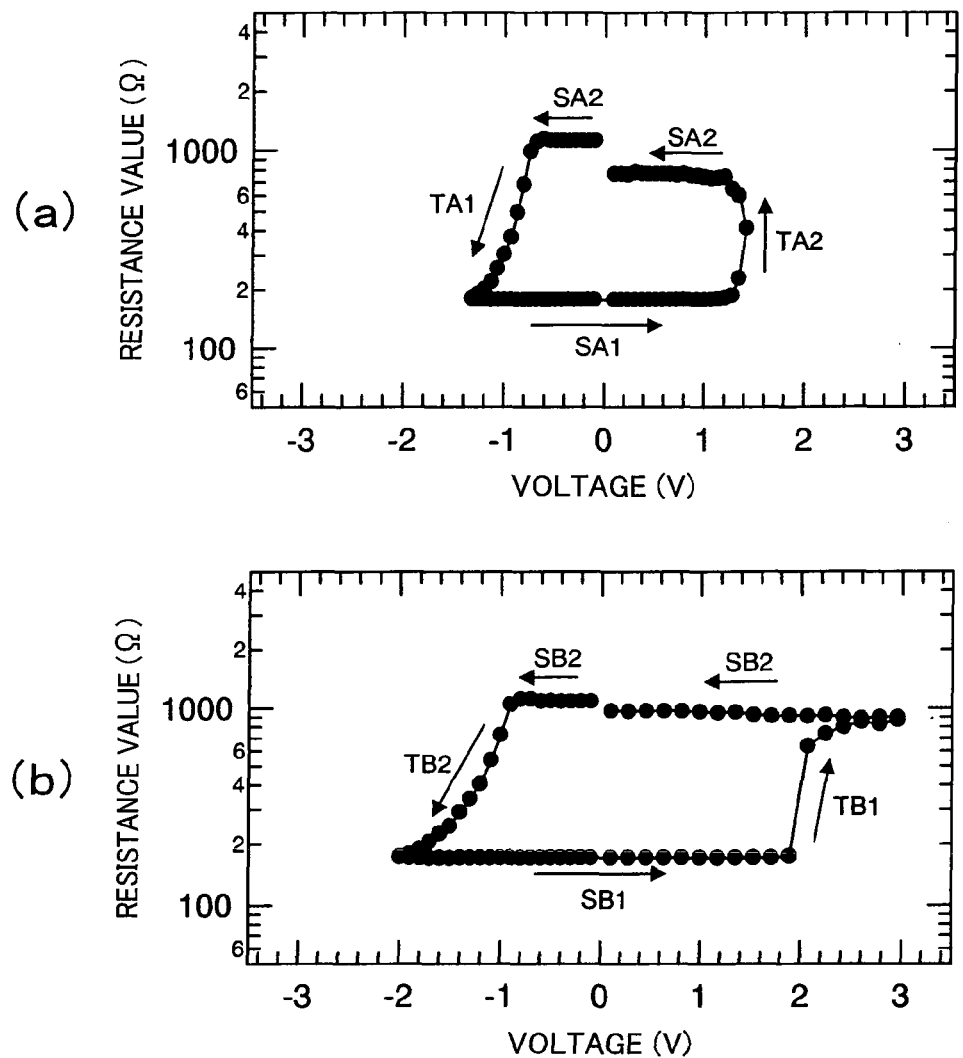

FIG. 20 is a view showing a characteristic of a nonvolatile memory element of experiment example 2 of the present invention, in which FIG. 20(a) is a view showing switching of the resistance value occurring when the voltage of the upper electrode with respect to the lower electrode is changed continuously between −1.4V and +1.4V, in a nonvolatile memory element in which the contact area of the resistance variable layer and the upper electrode is 0.25 μm$^2$. FIG. 20(b) is a view showing switching of the resistance value occurring when the voltage of the upper electrode with respect to the lower electrode is changed continuously from −2V to +3V, in a nonvolatile memory element in which the contact area of the resistance variable layer and the upper electrode is 1.25 μm$^2$. The voltage application method is identical to that of example 1. FIGS. 20(a) and 20(b) show cases (cases where the resistance state of the upper electrode side is changed) where the element switches to the high-resistance state in response to a plus voltage.

As shown in FIG. 20, it was found that when the contact area is different, the voltage range in which the resistance state switches is different. To be specific, as shown in FIG. 20(a), when the contact area was small, the resistance value switched when the voltage was about −0.8V and about +1.3V, while as shown in FIG. 21(b), when the contact area was large, the resistance value decreased when the voltage was about −1V and increased when the voltage was about +2V. From the result of this experiment, it can be seen that the absolute value of the voltage for switching the resistance state tends to increase as the contact area increases. By utilizing such a property, the characteristic shown in FIG. 19(c) is attained by making a difference between the area of the portion of the resistance variable later which is contact with the lower electrode and the area of the portion of the resistance variable layer which is contact with the upper electrode, and thus a multi-valued memory is attainable.

Embodiment 4

In Embodiment 1 to Embodiment 3, the nonvolatile memory elements are configured to be vertically asymmetric by making the electrode material, and the composition and contact area of the resistance variable layer different between the lower electrode side and the upper electrode side. In Embodiment 4, these are combined so that four stable states are utilized, thereby attaining a four-valued memory.

[Configuration of Element]

Figure 21:
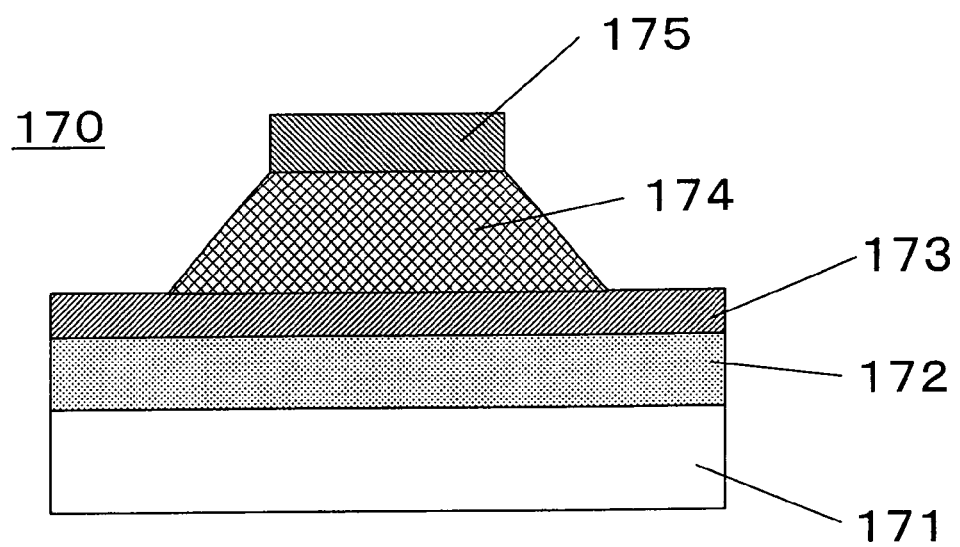
FIG. 21 is a schematic view showing an example of a cross section of a nonvolatile memory element according to Embodiment 4 of the present invention.

FIG. 21 is a schematic view showing an example of a cross section of a nonvolatile memory element according to Embodiment 4 of the present invention. As shown in FIG. 18, a nonvolatile memory element 170 of this embodiment includes a substrate 171, an oxide layer 172 formed over the substrate 171, a lower electrode layer 173 (first electrode) formed over the oxide layer 172, a resistance variable layer 174 formed over the lower electrode layer 173, and an upper electrode layer 175 (second electrode) formed over the resistance variable layer 174. The resistance variable layer 174 includes an oxygen-deficient transition metal oxide (preferably oxygen-deficient Ta oxide).

In this embodiment, the lower electrode layer 173 and the upper electrode layer 175 are made of different materials. For example, suitably, the lower electrode layer 173 is made of an electrode material (e.g., W, Ni, TaN, or the like) in which a difference between the resistance value corresponding to the high-resistance state and the resistance value corresponding to the low-resistance state is small, while the upper electrode layer 175 is made of an electrode material (e.g., Pt, Ir, Ag, Cu or the like) in which a difference between the resistance value corresponding to the high-resistance state and the resistance value corresponding to the low-resistance state is large.

The resistance variable layer 174 has a taper shape in which a horizontal cross-section decreases in size in an upward direction. The contact area (e.g., 1.5 μm×1.5 μm=2.25 μm$^2$) of the portion of the resistance variable layer 174 which is in contact with the lower electrode layer 173 is set larger than the area (e.g., 0.5 μm×0.5 μm=0.25 μm$^2$) of the portion of the resistance variable layer 174 which is in contact with the upper electrode layer 175. With such a structure, the absolute value of the voltage for causing switching of the resistance state at the lower electrode side is larger than the absolute value of the voltage for switching the resistance state at the upper electrode side.

The resistance variable layer 174 is configured to reversibly switch the resistance value in response to the interelectrode voltage. When writing data to the nonvolatile memory element 170, voltages with predetermined conditions are applied from the external electric power supply between the lower electrode layer 173 and the upper electrode layer 175. The voltages may be applied in the form of, for example, electric pulses. The nonvolatile memory element 170 preferably has a characteristic in which the resistance value does not switch so long as the voltages of the electric pulses are the same even when the electric pulses are applied many times.

[Manufacturing Method of Element]

The manufacturing method of the nonvolatile memory element 170 is identical to the manufacturing method of the nonvolatile memory element 100 of Embodiment 3 except that the electrode material is made different between the lower electrode side and the upper electrode side, and detailed description thereof is omitted

[Electric Characteristic]

Figure 22:
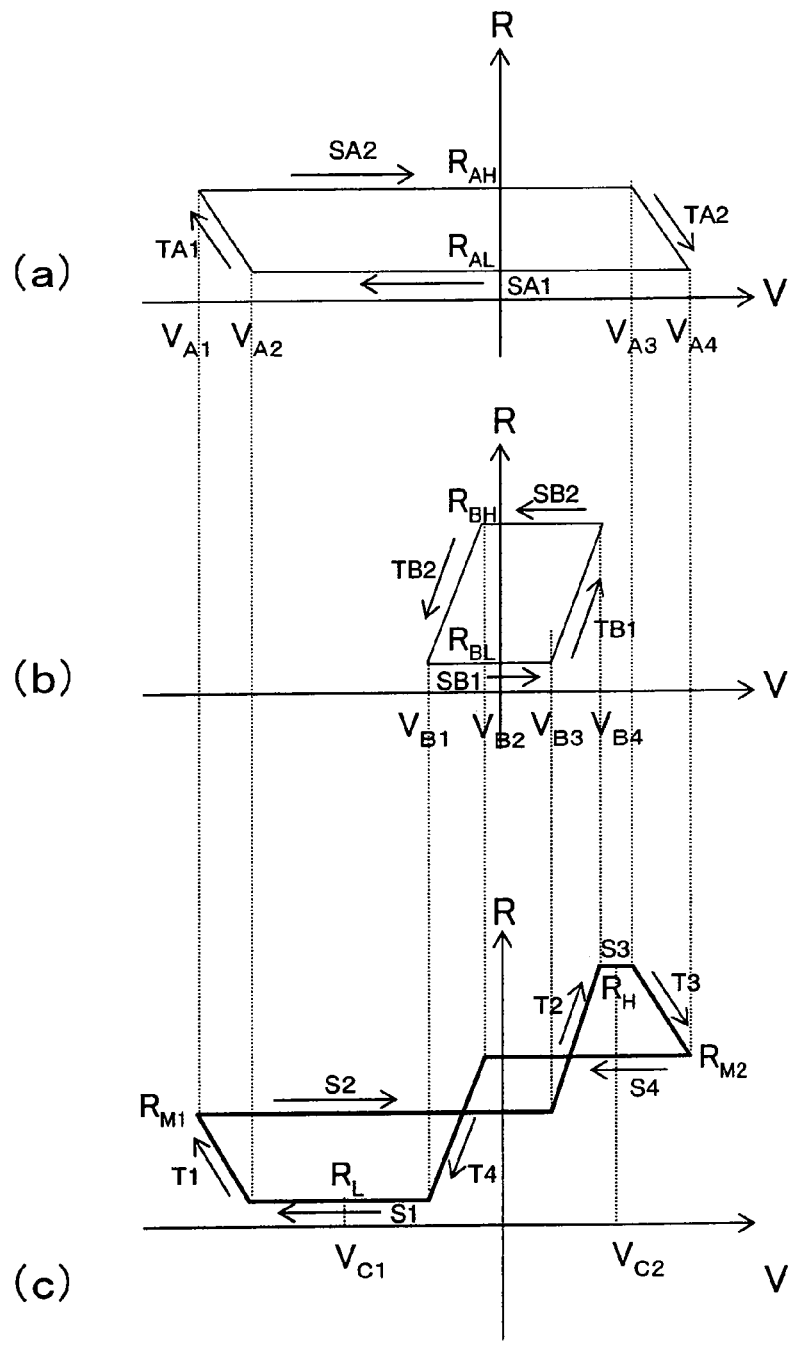

FIG. 22 is a schematic view showing an example of a characteristic of the nonvolatile memory element according to Embodiment 4 of the present invention, in which FIG. 22(a) is a conceptual view showing switching of the resistance value occurring assuming that the upper electrode side retains a low-resistance state and does not switch when the voltage of the upper electrode with respect to the lower electrode is changed continuously between $V_{A1}$ and $V_{A4}$, FIG. 22(b) is a conceptual view showing switching of a resistance value occurring assuming that the lower electrode side retains a low-resistance state and does not switch when the voltage of the upper electrode with respect to the lower electrode is changed continuously between $V_{B1}$ and $V_{B4}$, and FIG. 22(c) is a view showing switching of the resistance value of the whole nonvolatile memory element occurring when the voltage of the upper electrode with respect to the lower electrode is changed continuously between $V_{A1}$ and $V_{A4}$. Hereinafter, the electric characteristic of a nonvolatile memory element 150 will be described with reference to FIG. 22.

As indicated by arrows in FIG. 22(a), assuming that the upper electrode side retains the low-resistance state, when the resistance value is $R_{AL}$, the resistance value retains $R_{AL}$ and does not switch even though the voltage is decreased from $V_{A4}$ to $V_{A2}$ (SA1). Thereafter, when the voltage is further decreased from $V_{A2}$ to $V_{A1}$, the resistance value increases from $R_{AL}$ to $R_{AH}$ (TA1). Thereafter, the resistance value retains $R_{AH}$ and does not switch even though the voltage is increased from $V_{A1}$ to $V_{A3}$ (SA2). Thereafter, when the voltage is further increased from $V_{A3}$ to $V_{A4}$, the resistance value decreases from $R_{AH}$ to $R_{AL}$ (TA2). In the example shown in FIG. 22(a), the element is placed into the high-resistance state when a minus voltage is applied (when the lower electrode side is at a higher electric potential). With reference to the result of experiment example 1, the resistance switches at the lower electrode side. That is, in SA1, both of the lower electrode side and the upper electrode side are in the low-resistance state, while in SA2, the lower electrode side is in the high-resistance state and the upper electrode side is in the low-resistance state.

As indicated by arrows in FIG. 22(b), assuming that the lower electrode side retains the low-resistance state and does not switch, when the resistance value is $R_{BL}$, the resistance value retains $R_{BL}$ and does not switch even though the voltage is increased from $V_{B1}$ to $V_{B3}$ (SB1). When the voltage is further increased from $V_{B3}$ to $V_{B4}$, the resistance value increases from $R_{BL}$ to $R_{BH}$ (TB1). Thereafter, the resistance value retains $R_{BH}$ and does not switch even though the voltage is decreased from $V_{B4}$ to $V_{B2}$ (SB2). Thereafter, when the voltage is further decreased from $V_{B2}$ to $V_{B1}$, the resistance value decreases from $R_{BH}$ to $R_{BL}$ (TB2). In the example shown in FIG. 22(b), the element is placed into the high-resistance state when a plus voltage is applied (when the upper electrode side is at a higher electric potential). Therefore, with reference to the result of experiment example 1, the resistance switches at the upper electrode side. That is, in SB1, both of the lower electrode side and the upper electrode side are in the low-resistance state, while in SB2, the lower electrode side is in the low-resistance state and the upper electrode side is in the high-resistance state.

$|V_{A2}|>|V_{B1}|$ (i.e., $-V_{A2}>V_{B1}$), $|V_{A3}|>|V_{B4}|$ (i.e., $-V_{A3}>V_{B4}$) $R_{AL}=R_{BL}$, and $R_{AH}<R_{BH}$. That is, the voltage for switching the resistance state is different between the lower electrode side and the upper electrode side, and a switching magnitude of the resistance value is also different between the lower electrode side and the upper electrode side. Such a characteristic results from differences in the electrode material and contact area of the electrode and the resistance variable layer.

As indicated by arrows in FIG. 22(c), when the resistance value is $R_L$ (=$R_{AL}$=$R_{BL}$), the resistance value retains $R_L$ and does not switch even though the voltage is changed between $V_{B1}$ and $V_{A2}$ (S1). When the voltage is decreased from $V_{A2}$ to $V_{A1}$, the resistance value increases from $R_L$ to $R_{M1}$ (=$R_{AH}$) (T1). Thereafter, the resistance value retains $R_{M1}$ and does not switch even though the voltage is increased from $V_{A1}$ to $V_{B3}$ (S2). Thereafter, when the voltage is further increased from $V_{B3}$ to $V_{B4}$, the resistance value increases from $R_{M1}$ to $R_H$ (=$R_{AH}$+$R_{BH}$) (T2). Thereafter, when the voltage is increased from $V_{B4}$ to $V_{A4}$ by way of $V_{A3}$, the resistance value decreases from $R_H$ to $R_{M2}$ (T3). Thereafter, the resistance value retains $R_{M2}$ and does not switch even though the voltage is decreased from $V_{A4}$ to $V_{B2}$ (S4). Thereafter, when the voltage is further decreased from $V_{B2}$ to $V_{B1}$, the resistance value decreases from $R_{M2}$ to $R_L$ (T4). With reference to the result of experiment example 1 and FIGS. 22(a) and 22(b), in S1, both of the lower electrode side and the upper electrode side are in the low-resistance state, in S2, the lower electrode side is in the high-resistance state, and the upper electrode side is in the low-resistance state, in S3, both of the lower electrode side and the upper electrode side are in the high-resistance state, and in S4, the lower electrode side is in the low-resistance state and the upper electrode side is in the high-resistance state. The characteristic of FIG. 22(c) is a composition of the characteristic of FIG. 22(a) and the characteristic of FIG. 22(b). When the relationship of $R_L < R_{M1} < R_{M2} < R_H$ is satisfied and the interelectrode voltage is $V_{C1}(V_\alpha)$ satisfying the relationship of $V_{A2} < V_{C1} < V_{B1}$, the resistance value becomes $R_L$ or $R_{M1}$. When the relationship of $R_L < R_{M1} < R_{M2} < R_H$ is satisfied and the interelectrode voltage is $V_\beta$ satisfying the relationship of $V_{B2} < V_\beta < V_{B3}$, the resistance value becomes $R_{M1}$ or $R_{M2}$. When the relationship of $R_L < R_{M1} < R_{M2} < R_H$ is satisfied and the interelectrode voltage is $V_{C2}$ (=$V_\gamma$) satisfying the relationship of $V_{B4} < V_{C2} < V_{A3}$, the resistance value becomes $R_{M2}$ or $R_H$. In addition, when $V_{A1}$ is expressed as $V_1$, $V_{A2}$ is expressed as $V_2$, $V_{C1}$ is expressed as $V_3$, $V_{B1}$ is expressed as $V_4$, $V_{B2}$ is expressed as $V_5$, $V_{B3}$ is expressed as $V_6$, $V_{B4}$ is expressed as $V_7$, $V_{C2}$ is expressed as $V_8$, $V_{A3}$ is expressed as $V_9$, and $V_{A4}$ is expressed as $V_{10}$, the relationship of $V_1 < V_2 < V_3 < V_4 < V_5 < 0 < V_6 < V_7 < V_8 < V_9 < V_{10}$ is satisfied.

The upper electrode and the lower electrode may be inverted. In this case, the nonvolatile memory element has a characteristic formed by inverting the characteristic of FIG. 22(c) in a rightward and leftward direction.

[Method of Using Nonvolatile Memory Element 100 as Four-Valued Memory]

In the example shown in FIG. 22(c), if the voltage is set lower than $V_{A1}$, the nonvolatile memory element 170 in any of the resistance states switches to the state of S2 and its resistance value becomes $R_{M1}$. If the voltage is set higher than $V_{A4}$, the nonvolatile memory element 170 in any of the resistance states switches to the state of S4 and its resistance value becomes $R_{M2}$. To place the element to into the state of S1, the voltage of $V_{C1}$($V_{A2} < V_{C1} < V_{B1}$) is applied to the element in the state of S4, while to place the element into the state of S3, the voltage of $V_{C2}$($V_{B4} < V_{C2} < V_{A3}$) is applied to the element in the state of S2. These four states (S1, S2, S3, S4) are states (stable states) in which the resistance values do not substantially switch regardless of a change in a voltage within a certain range. To be specific, when the element is in the state of S1, the resistance value does not substantially switch when the voltage is higher than $V_{A2}$ and lower than $V_{B1}$. When the element is in the state of S2, the resistance value does not substantially switch when the voltage is lower than $V_{B3}$. When the element is in the state of S3, the resistance value does not substantially switch when the voltage is higher than $V_{B4}$ and lower than $V_{A3}$. When the element is in the state of S4, the resistance value does not substantially switch if the voltage is higher than $V_{B2}$. In this embodiment, since the electrode material is different between the lower electrode side and the upper electrode side, the resistance value corresponding to the state of S2 and the resistance value corresponding to the state of S4 are different. Therefore, there are four stable state resistance values. By utilizing the four resistance values, the nonvolatile memory element 170 can be used as the nonvolatile memory element capable of stably writing and reading four-valued data.

In this embodiment, modifications similar to those of Embodiment 1 and embodiment 2 are possible.

[Modification]

Figure 23:
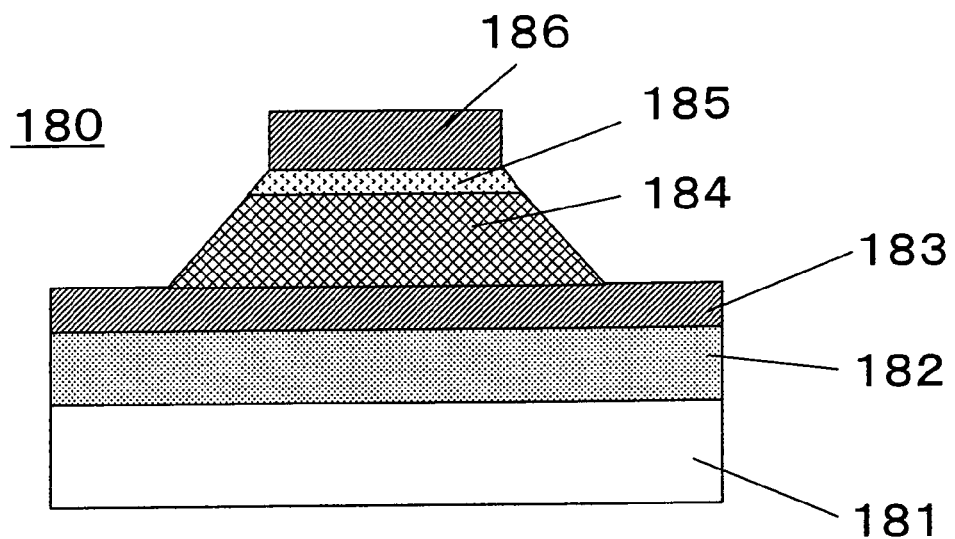
FIG. 23 is a schematic view showing an example of a cross section of a nonvolatile memory element according to modification of Embodiment 4 of the present invention.

FIG. 23 is a schematic view showing an example of a cross section of the nonvolatile memory element according to modification of Embodiment 4 of the present invention. As shown in FIG. 23, a nonvolatile memory element 180 of this embodiment includes a substrate 181, an oxide layer 182 formed over the substrate 181, a lower electrode layer 183 (first electrode) formed over the oxide layer 182, a first resistance variable layer 184 formed over the lower electrode layer 183, a second resistance variable layer 185 formed over the first resistance variable layer 184, and an upper electrode layer 175 (second electrode) formed over the second resistance variable layer 185.

In this modification, the lower electrode layer 183 and the first resistance variable layer 184 are directly in contact with each other, the first resistance variable layer 184 and the second resistance variable layer 185 are directly in contact with each other, and the second resistance variable layer 185 and the upper electrode layer 175 are directly in contact with each other. Alternatively, other layers may be disposed between these layers.

In this embodiment, the lower electrode layer 183 and the upper electrode layer 186 are formed of the same electrode material.

Each of the first resistance variable layer 184 and the second resistance variable layer 185 includes an oxygen-deficient transition metal oxide (preferably oxygen-deficient Ta oxide). The oxygen content of the second resistance variable layer 185 is higher than the oxygen content of the first resistance variable layer 184. With such a configuration, a switching magnitude of the resistance value occurring when the resistance state at the lower electrode side switches is smaller than a switching magnitude of the resistance value occurring when the resistance state at the upper electrode side switches. As the method of controlling the oxygen content of the resistance variable layer, a method similar to that of Embodiment 2 may be used.

The first resistance variable layer 184 and the second resistance variable layer 185 have a taper shape in which a horizontal cross-section decreases in size in an upward direction. The area (e.g., 1.5 μm×1.5 μm=2.25 μm²) of the portion of the first resistance variable layer 184 which is in contact with the lower electrode layer 183 is set larger than the area (e.g., 1.5 μm×1.5 μm=2.25 μm²) of the portion of the second resistance variable layer 185 which is in contact with the portion of the upper electrode layer 186. With such a structure, the absolute value of the voltage for causing switching of the resistance state at the lower electrode side is larger than the absolute value of the voltage for causing switching of the resistance state at the upper electrode side. As a method for forming the resistance variable layer in a taper shape, a method similar to that of Embodiment 3 may be used.

By making the voltage for switching the resistance state and the switching magnitude of the resistance value different between the lower electrode side and the upper electrode side, the nonvolatile memory element 180 has a characteristic similar to that shown in FIG. 22 (c). Therefore, the nonvolatile memory element 180 is capable of stably writing and reading four-valued data by utilizing four stable states.

In this modification, the lower electrode layer 183 and the upper electrode layer 186 may be made of different electrode materials.

Embodiment 5

The above described nonvolatile memory elements according to Embodiment 1 to Embodiment 4 are applicable to nonvolatile semiconductor devices having various configurations. A semiconductor device according to Embodiment 5 is a nonvolatile memory device which includes the nonvolatile memory elements according to Embodiment 1 and is so-called a cross-point memory device in which an active layer intervenes at an intersection (three-dimensional cross point) between a word line and a bit line.

Configuration of Semiconductor Device According to Embodiment 5

Figure 24:
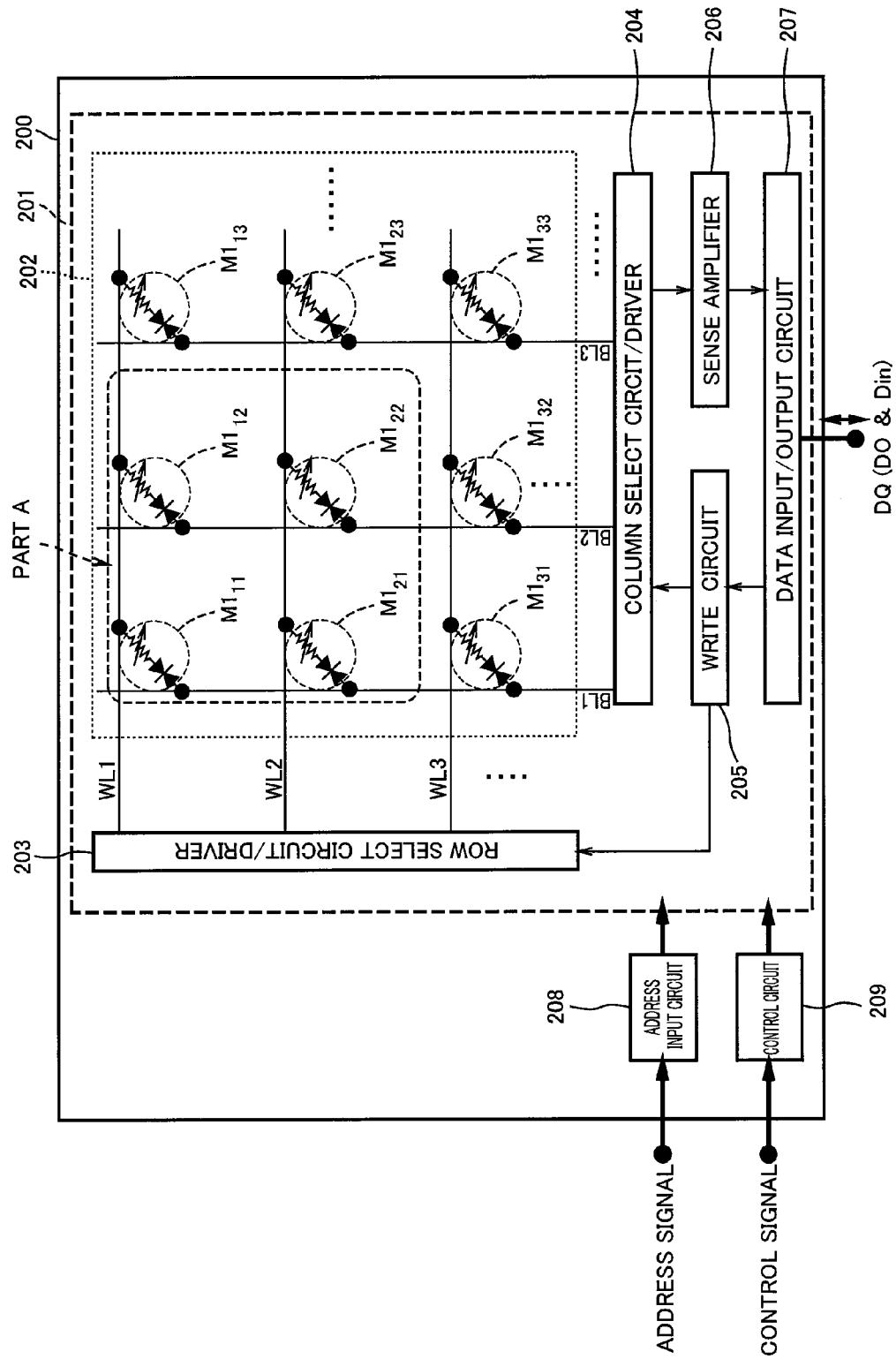
FIG. 24 is a block diagram showing a configuration of a nonvolatile memory device according to Embodiment 5 of the present invention.
Figure 25:
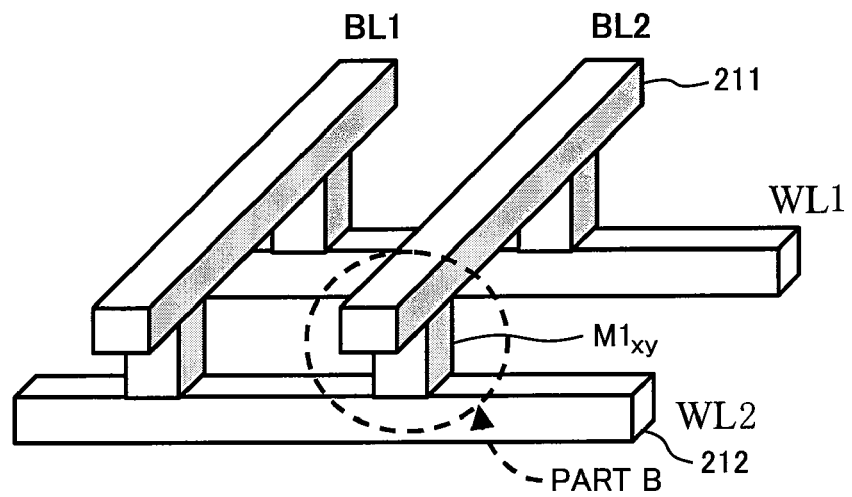
FIG. 25 is a perspective view showing a configuration of part A (configuration of four cells) in FIG. 24.

FIG. 24 is a block diagram showing a configuration of a nonvolatile memory device according to Embodiment 5 of the present invention. FIG. 25 is a perspective view showing a configuration (configuration corresponding to 4 cells) in part A of FIG. 24.

As shown in FIG. 24, a nonvolatile memory device 200 according to this embodiment includes a memory main section 201 on a semiconductor substrate. The memory main section 201 includes a memory array 202, a row select circuit/driver 203, a column select circuit/driver 204, a write circuit 205 for writing data, a sense amplifier 206 which detects an amount of a current flowing in a selected bit line and determines the data as "2", "1" or "0," and a data input/output circuit 207 which executes input/output processing of input/output data via a terminal DQ. The nonvolatile memory device 200 further includes an address input circuit 208 which receives an address signal externally input, and a control circuit 209 for controlling the operation of the memory main section 201, based on a control signal externally input.

As shown in FIGS. 24 and 25, the memory array 202 includes on a semiconductor substrate, plural (m) (m: natural number) word lines WL1, WL2, WL3, . . . , WLm (first electrode wires: hereinafter expressed as "word lines WL1~WLm") which are formed within a plane (first plane) parallel to the main surface of the semiconductor substrate to extend in parallel with each other, and plural (n) (n: natural number) bit lines BL1, BL2, BL3, . . . , BLn (second electrode wires: hereinafter expressed as "bit lines BL1~BLn") which are formed above the plural word lines WL1~WLm, . . . , so as to extend in parallel with each other within a plane (second plane) parallel to the main surface of the semiconductor substrate and so as to three-dimensionally cross the plural word lines WL1~WLm.

Further, plural memory cells $M1_{11}$, $M1_{12}$, $M1_{13}$, . . . , $M1_{1n}$, $M1_{21}$, $M1_{22}$, $M1_{23}$, . . . , $M1_{2n}$, $M1_{31}$, $M1_{32}$, $M1_{33}$, . . . , $M1_{3n}$, . . . , $M1_{mn}$ (hereinafter expressed as "memory cells $M1_{11}$~$M1_{mn}$") are arranged in matrix of m rows and n columns so as to respectively correspond to the three-dimensional cross points of the plural word lines WL1~WLm and the plural bit lines BL1~BLn. Each subscript indicates the position of each memory cell. To be specific, when the memory cell is expressed as $M1_{xy}$, x indicates the number of the row to which the associated memory cell belongs, and y indicates the number of column to which the associated memory cell belongs.

The memory cells $M1_{11}$~$M1_{mn}$ correspond to the nonvolatile memory elements according to Embodiment 1, and each of them has a resistance variable layer including tantalum oxide. Each of the nonvolatile memory elements switches a resistance value (inter-electrode-wire resistance value) between the associated word line and the associated bit line in response to a voltage (inter-electrode-wire voltage) applied between the associated word line and the associated bit line. The inter-electrode-wire voltage corresponds to the interelectrode voltage in Embodiment 1 to Embodiment 4. The inter-electrode-wire resistance value corresponds to the interelectrode resistance value in Embodiment 1 to Embodiment 4. The nonvolatile memory element has a configuration similar to those of Embodiment 1 to Embodiment 4. The nonvolatile memory element has three or four stable states and serves as a three-valued or four-valued memory. Whether or not other electrode is provided between the electrode wire and the resistance variable layer may be determined as desired. If other electrode is not provided between the electrode wire and the resistance variable layer, the electrode wire itself serves as the electrode. In this embodiment, it should be noted that each of memory cells $M1_{11}$~$M1_{mn}$ includes a current suppressing element as described later.

The memory cells $M1_{11}$~$M1_{mn}$ in FIG. 24 are identified by reference symbol $M1_{xy}$ in FIG. 25.

The address input circuit 208 receives an address signal from an external circuit (not shown), and outputs a row address signal and a column address signal to the row select circuit/driver 203 and to the column select circuit/driver 204, respectively, based on the address signal. The address signal is a signal indicating the address of a specified memory cell to be selected from among the plural memory cells $M1_{11}$~$M1_{mn}$. The row address signal is a signal indicating a row address in the address indicated by the address signal, and the column address signal is a signal indicating a column address in the address indicated by the address signal.

In a write cycle of data, the control circuit 209 outputs to the write circuit 205, a write signal for causing application of a write voltage, according to the data Din input to the data input/output circuit 207. In a read cycle of data, the control circuit 209 outputs to the column select circuit/driver 204, a read signal for causing application of a read voltage.

The row select circuit/driver 203 receives the row address signal output from the address input circuit 208, selects one from among the plural word lines WL1~WLm based on the row address signal and applies a predetermined voltage to the selected word line.

The column select circuit/driver 204 receives a column address signal output from the address input circuit 208, selects one from among the plural bit lines BL1~BLn based on the column address signal and applies the write voltage or the read voltage to the selected bit line.

Receiving the write signal output from the control circuit 209, the write circuit 205 outputs to the row select circuit/driver 203, a signal for causing application of a voltage to the selected word line, and outputs to the column select circuit/driver 204 a signal for causing application of a write voltage to the selected bit line.

In the read cycle of data, the sense amplifier 206 detects an amount of a current flowing in the selected bit line which is a read target, and determines the data as "2", "1" or "0." The resulting output data DO is output to the external circuit via the data input/output circuit 207.

Configuration of Nonvolatile Memory Element Included in Nonvolatile Memory Device According to Embodiment 5

Figure 26:
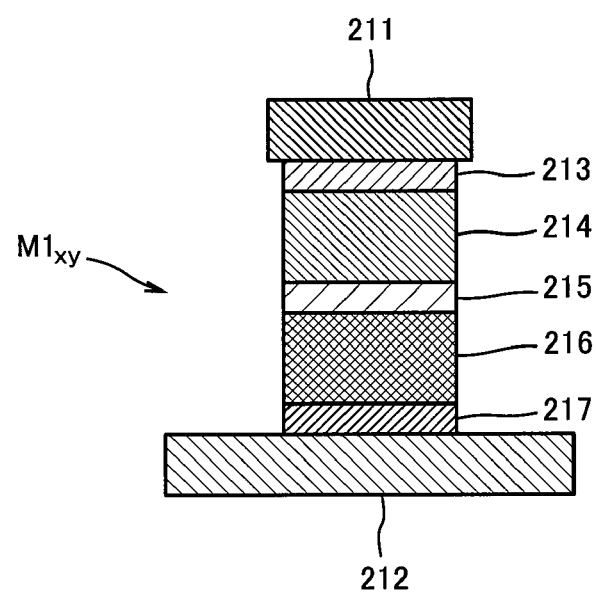
FIG. 26 is a cross-sectional view showing a configuration of a part B in FIG. 25, and a configuration of a nonvolatile memory element included in a nonvolatile memory device according to Embodiment 5 of the present invention.

FIG. 26 is a cross-sectional view showing a configuration of the nonvolatile memory element included in the nonvolatile memory device according to Embodiment 5 of the present invention. In FIG. 26, a configuration of part B in FIG. 25 is shown.

As shown in FIG. 26, a nonvolatile memory element $M1_{xy}$ included in the nonvolatile memory device according to this embodiment intervenes between a lower wire 212 (corresponding to the word line WL1 in FIG. 25) which is a copper wire and an upper wire 211 (corresponding to the bit line BL1 in FIG. 25) which is a copper wire, and includes a lower electrode 217, a current suppressing element 216, an inner electrode 215, a resistance variable layer 214, and an upper electrode 213 which are laminated in this order.

The inner electrode 215, the resistance variable layer 214, and the upper electrode 213 correspond to the lower electrode layer, the resistance variable layer, and the upper electrode layer in the nonvolatile memory elements according to Embodiment 1 to Embodiment 4 shown in FIGS. 2, 16, 18, 21 and 23, respectively. Therefore, the resistance variable layer 214 may be formed in a method similar to those in Embodiment 1 to Embodiment 4.

The current suppressing element 216 is connected in series to the resistance variable layer 214 via the inner electrode 215 made of TaN. The current suppressing element 216 is electrically connected to the resistance variable layer 214. The current suppressing element 216 is an element which is typically a MIM (Metal-Insulator-Metal) diode or a MSM (Metal-Semiconductor-Metal) diode, and exhibits a nonlinear current characteristic with respect to a voltage. The current suppressing element 216 has a bidirectional current characteristic with respect to a voltage, and is placed in a conductive state under a predetermined threshold voltage Vf (e.g., not lower than +1V or not higher than −1V on the basis of one electrode as a reference).

Tantalum and tantalum oxide are materials generally used in a semiconductor process, and may be highly compatible with the semiconductor process. Therefore, they can be easily incorporated into the existing semiconductor manufacturing process.

Configuration of Modification of Nonvolatile Memory Element Included in Nonvolatile Memory Device According to Embodiment 5

The configuration of the nonvolatile memory element included in the nonvolatile memory device according to this embodiment is not limited to that shown in FIG. 26, but may have a configuration shown below.

FIGS. 27(a) to 27(d) are cross-sectional views showing configurations of modifications of the nonvolatile memory element included in the nonvolatile memory device according to Embodiment 5 of the present invention.

Figure 27:
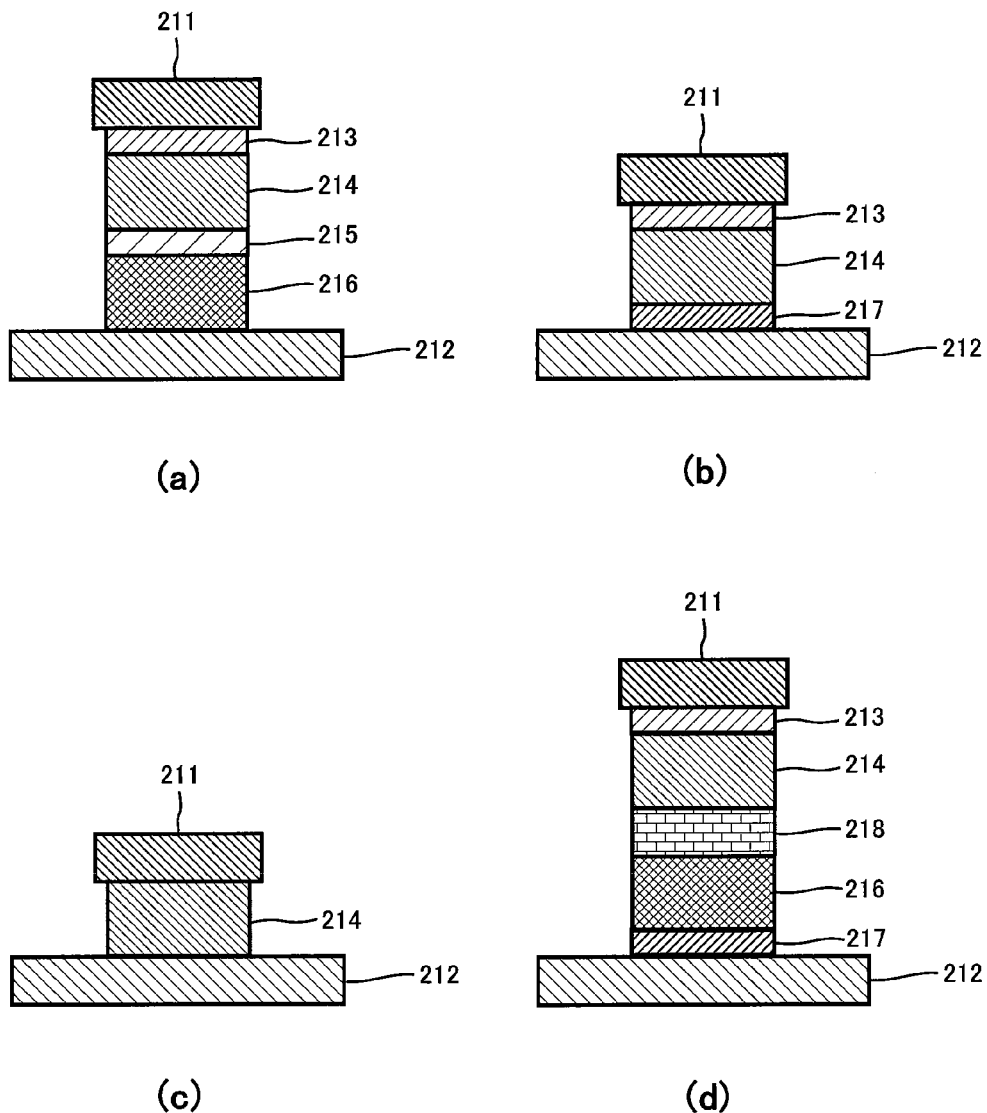
FIGS. 27(a) to 27(d) are cross-sectional views showing configurations of modifications of the nonvolatile memory element included in a nonvolatile memory device according to Embodiment 5 of the present invention.

FIG. 27(a) shows a configuration in which the lower electrode is omitted, unlike the configuration of FIG. 26. The configuration in which the upper electrode is omitted may be provided, although not shown.

FIG. 27(b) shows a configuration in which the inner electrode and the current suppressing element are omitted, unlike the configuration of FIG. 26. FIG. 27(c) shows a configuration in which the upper electrode and the lower electrode are omitted.

FIG. 27(d) shows a configuration in which the inner electrode is omitted but an ohmic resistance layer 218 is provided, unlike the configuration of FIG. 26.

In the above modifications, in the configuration in which the upper electrode is omitted, the upper wire 211 serves as the upper electrode of the nonvolatile memory element, while in the configuration in which the lower electrode is omitted, the lower wire 212 serves as the lower electrode of the nonvolatile memory element.

The upper layer and lower layer of the resistance variable layer 214 correspond to the lower electrode layer, the resistance variable layer, and the upper electrode layer in the nonvolatile memory elements in Embodiments 1 to 4 shown in FIGS. 2, 16, 18, 21, and 23. For example, in the configuration in FIG. 27(c), the upper wire 211 and the lower wire 212 correspond to the upper electrode layer and the lower electrode layer of the nonvolatile memory element, respectively. In the configuration of FIG. 27(d), the ohmic resistance layer 218 corresponds to the lower electrode layer of the nonvolatile memory element.

When the memory cells are fewer in number, a bypass current flowing to an unselected memory cell is lessened. In that case, the above described current suppressing element may be dispensed with.

As should be understood from the above, for the nonvolatile memory element included in the nonvolatile memory device according to this embodiment, various configurations may be used.

[Example of Configuration of Nonvolatile Memory Device Having Multi-Layer Structure]

The memory arrays of the nonvolatile memory device according to this embodiment shown in FIGS. 24 and 25 may be three-dimensionally stacked to attain a nonvolatile memory device having a multi-layer structure.

Figure 28:
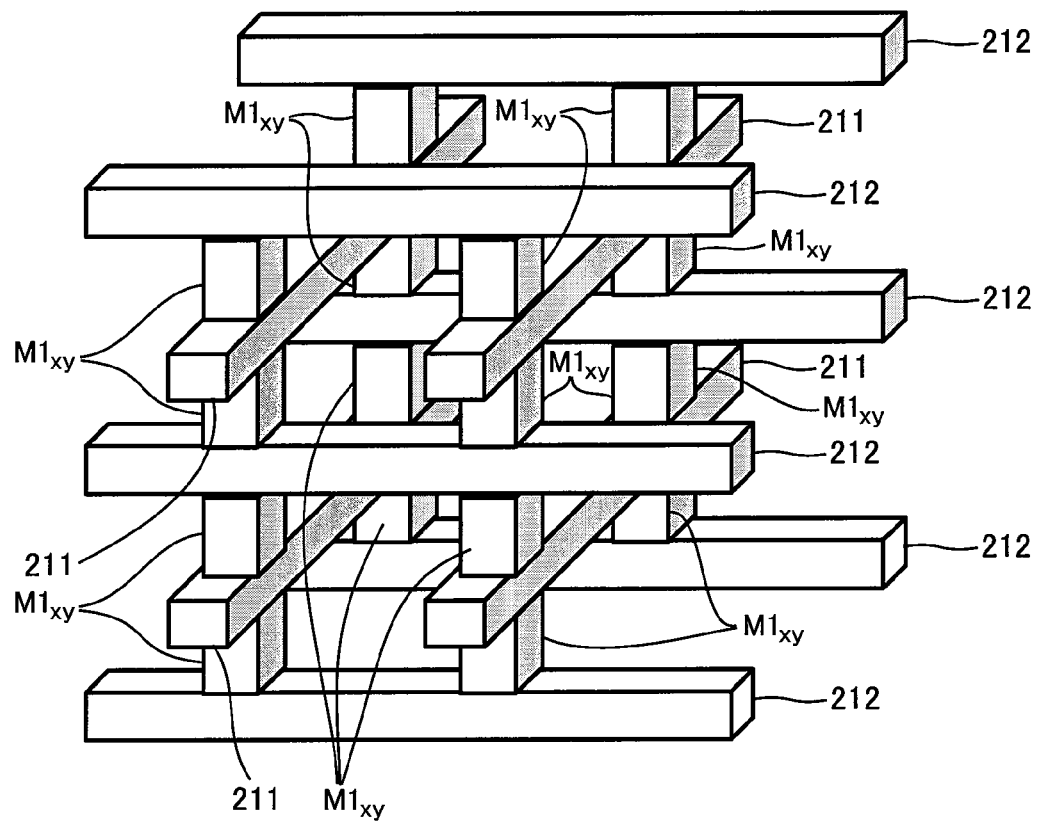
FIG. 28 is a perspective view showing a configuration of a memory array included in a multi-layered nonvolatile memory device of the present invention.

FIG. 28 is a perspective view showing a configuration of a memory array included in the nonvolatile memory device having the multi-layer structure of the present invention. As shown in FIG. 28, the nonvolatile memory device includes a multi-layer memory array having plural layers of stacked memory arrays each including plural lower wires 212 formed on a semiconductor substrate (not shown), to extend in parallel with each other, plural upper wires 211 formed above the plural lower wires 212 so as to extend in parallel with each other within a plane parallel to a main surface of the semiconductor substrate and so as to three-dimensionally cross the plural lower wires 212, and plural memory cells $M1_{xy}$ arranged in matrix to respectively correspond to three-dimensional cross points of the plural lower wires 212 and the plural upper wires 211.

In the example shown in FIG. 28, five wire layers are formed and four layers of the nonvolatile memory elements arranged at the three-dimensional cross points are formed. Of course, the number of these layers may be increased or decreased as desired.

By providing the multi-layer memory array configured as described above, a nonvolatile memory having a super-large capacity is attainable.

The resistance variable layer of the present invention can be formed at a low temperature. Therefore, transistors or wire material such as silicide formed in a lower layer step are not affected even when a layer structure is formed in a wiring step illustrated in this embodiment. As a result, a multi-layer memory array is easily attainable. That is, a nonvolatile memory device having a multi-layer structure is easily attainable by using the resistance variable layer comprising the tantalum oxide of the present invention.

In this embodiment, only the cross-point structure formed by integration on the semiconductor substrate is explained. Alternatively, the cross-point structure may be formed on a more inexpensive substrate such as a plastic substrate, in place of the semiconductor substrate, and may be applied to a memory device which has a layer structure formed by an assembling method using bumps or the like.

Embodiment 6

A nonvolatile memory device according to Embodiment 6 is a nonvolatile memory device which includes the nonvolatile memory element according to Embodiment 1 to Embodiment 4, and is of a one transistor/one nonvolatile memory section type.

Configuration of Nonvolatile Memory Device According to Embodiment 6

Figure 29:
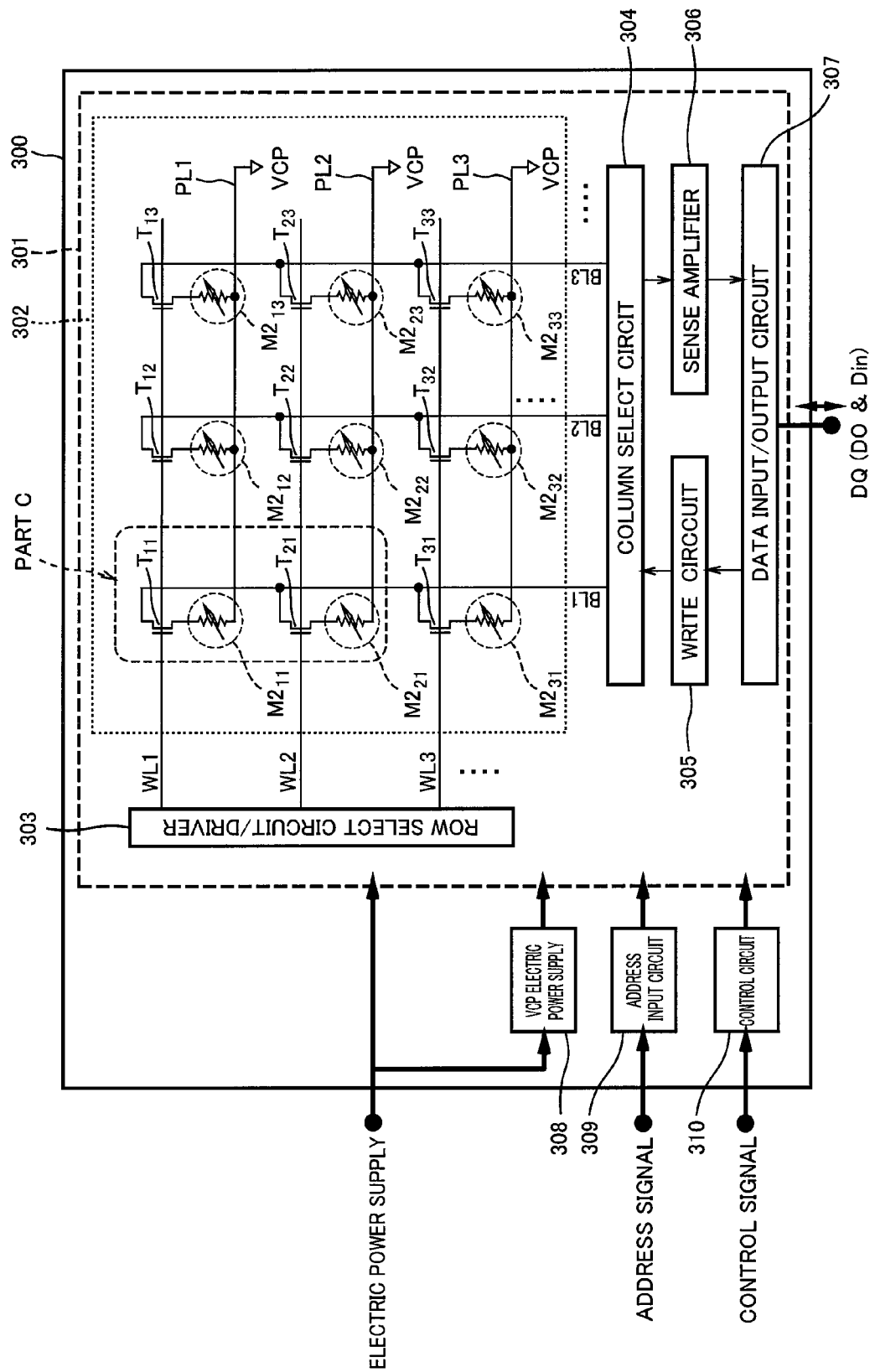
FIG. 29 is a block diagram showing a configuration of a nonvolatile memory device according to Embodiment 6 of the present invention.
Figure 30:
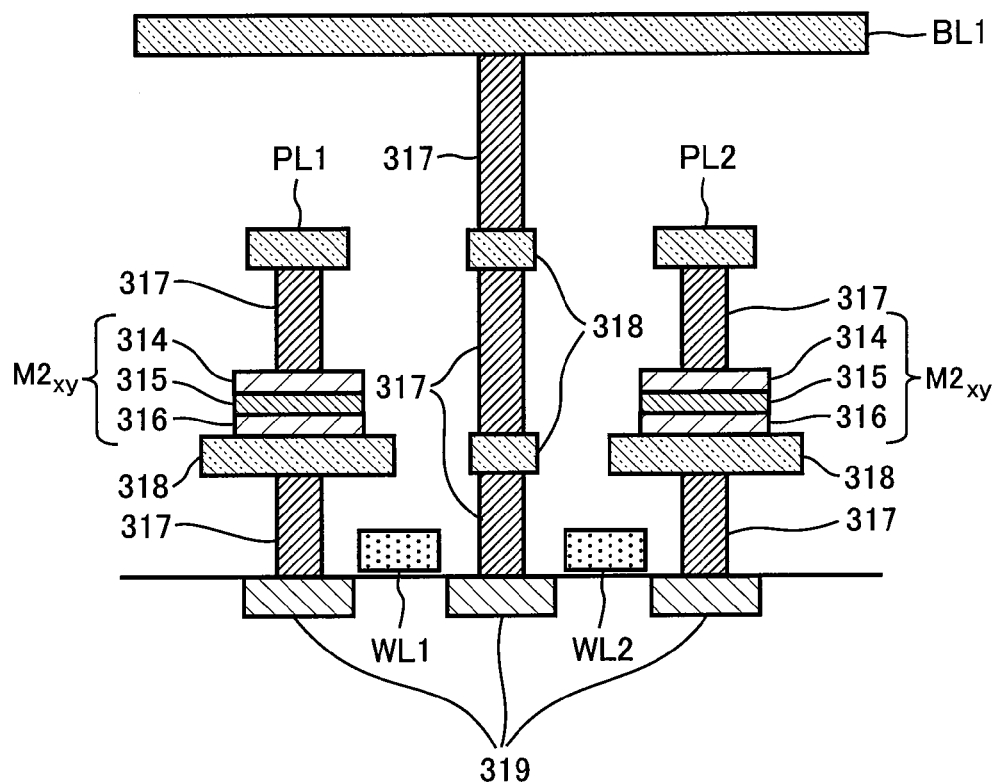
FIG. 30 is a cross-sectional view showing a configuration of part C (configuration of two cells) in FIG. 29.

FIG. 29 is a block diagram showing a configuration of a nonvolatile memory device according to Embodiment 6 of the present invention. FIG. 30 is a cross-sectional view showing a configuration (configuration corresponding to 2 cells) in part C of FIG. 29.

As shown in FIG. 29, a nonvolatile memory device 300 according to this embodiment includes a memory main section 301 on a semiconductor substrate. The memory main section 301 includes a memory array 302, a row select circuit/driver 303, a column select circuit 304, a write circuit 305 for writing data, a sense amplifier 306 which detects an amount of a current flowing in a selected bit line and determines the data as "2", "1" or "0," and a data input/output circuit 307 which executes input/output processing of input/output data via the terminal DQ. The nonvolatile memory device 300 further includes a cell plate electric power supply (VCR electric power supply) 308, an address input circuit 309 which receives an address signal externally input, and a control circuit 310 for controlling the operation of the memory main section 301, based on the control signal externally input.

The memory array 302 includes on a semiconductor substrate, plural (m): (m: natural number) word lines WL1, WL2, WL3, . . . WLm (first electrode wires: hereinafter expressed as "word lines WL1~WLm") which are formed to extend in parallel with each other within a plane (first plane) parallel to the main surface of the semiconductor substrate and plural (n) (n: natural number) bit lines BL1, BL2, BL3, . . . , BLn (second electrode wires: hereinafter expressed as "bit lines BL1~BLn") which are provided above the plural word lines WL1~WLm and arranged to extend in parallel with each other within a plane (second plane) parallel to the main surface of the semiconductor substrate and to three-dimensionally cross the plural word lines WL1~WLm, plural transistors $T_{11}$, $T_{12}$, $T_{13}$, . . . , $T_{1n}$, $T_{21}$, $T_{22}$, $T_{23}$, . . . , $T_{2n}$, $T_{31}$, $T_{32}$, $T_{33}$, . . . , $T_{3n}$, . . . , $T_{mn}$ (hereinafter expressed as "transistors $T_{11}$~$T_{mn}$") provided to respectively correspond to cross points (matrix of m rows and n columns) of the word lines WL1~WLm and the bit lines BL1~BLn, and plural memory cells $M2_{11}$, $M2_{12}$, $M2_{13}$, . . . $M2_{1n}$, $M2_{21}$, $M2_{22}$, $M2_{23}$, . . . , $M2_{2n}$, $M2_{31}$, $M2_{32}$, $N2_{33}$ . . . , $M2_{3n}$, . . . , $M2_{mn}$ (hereinafter expressed as "memory cells $M2_{11}$~$M2_{mn}$") provided to respectively correspond to the transistors $T_{11}$~$T_{mn}$ such that one memory cell corresponds to one transistor. Each subscript indicates the position of the associated transistor or the associated memory cell. To be specific, when the transistor and the memory cell are expressed as $T_{xy}$ and $M2_{xy}$, x indicates the number of the row to which the associated memory cell belongs and y indicates the number of column to which the associated memory cell belongs.

The memory array 302 further includes plural (m) plate lines PL1, PL2, PL3, . . . PLm (hereinafter expressed as "PL1~PLm") which are arranged to extend in parallel with the word lines WL1~WLm.

As shown in FIG. 30, the bit line BL1 is provided above the word lines WL1 and WL2, and the plate lines PL1 and PL2 are provided between the word lines WL1 and WL2 and the bit line BL1.

Each of the memory cells $M2_{11}$~$M2_{mn}$ corresponds to the nonvolatile memory element according to Embodiment 1, and includes a resistance variable layer including tantalum oxide. To be specific, the nonvolatile memory element $M2_{xy}$ in FIG. 30 corresponds to the memory cells $M2_{11}$~$M2_{mn}$ in FIG. 29, and consists of the upper electrode 314, the resistance variable layer 315 including tantalum oxide, and the lower electrode 316.

In FIG. 30, 317 denotes a plug layer, 318 denotes a metal wire layer, and 319 denotes source/drain regions.

As shown in FIG. 29, the drains of the transistors $T_{11}$, $T_{21}$, $T_{31}$, . . . , $T_{m1}$ are connected to the bit line BL1, the drains of the transistors $T_{12}$, $T_{22}$, $T_{32}$, . . . , $T_{m2}$ are connected to the bit line BL2, and the drains of the transistors $T_{13}$, $T_{23}$, $T_{33}$, . . . , $T_{m3}$ are connected to the bit line BL3.

The gates of the transistors $T_{11}$, $T_{12}$, $T_{13}$, . . . , $T_{1n}$ are connected to the word line WL1, the gates of the transistors $T_{21}$, $T_{22}$, $T_{23}$, . . . , $T_{3n}$ are connected to the word line WL2, and the gates of the transistors $T_{31}$, $T_{32}$, $T_{33}$, . . . , $T_{3n}$ are connected to the word line WL3.

The sources of the transistors $T_{11}$~$T_{mn}$ are connected to the memory cells $M2_{11}$~$M2_{mn}$, . . . , respectively.

The memory cells $M2_{11}$, $M2_{12}$, $M2_{13}$, . . . , $M2_{1n}$ are connected to the plate line PL1, the memory cells $M2_{21}$, $M2_{22}$, $M2_{23}$, . . . , $M2_{2n}$ are connected to the plate line PL2, and the memory cells $M2_{31}$, $M2_{32}$, $M2_{33}$, . . . $M2_{3n}$ are connected to the plate line PL3.

The address input circuit 309 receives an address signal from an external circuit (not shown), and outputs a row address signal and a column address signal to the row select circuit/driver 303 and to the column select circuit 304, respectively, based on the address signal. The address signal is a signal indicating the address of a specified memory cell to be selected from among the plural memory cells $M2_{11}$~$M2_{mn}$. The row address signal is a signal indicating a row address in the address indicated by the address signal, and the column address signal is a signal indicating a column address in the address indicated by the address signal.

In a write cycle of data, the control circuit 310 outputs to the write circuit 305, a write signal for causing application of a write voltage, according to the data Din input to the data input/output circuit 307. On the other hand, in a read cycle of data, the control circuit 310 outputs to the column select circuit 304, a read signal for causing application of a read voltage.

The row select circuit/driver 303 receives the row address signal output from the address input circuit 309, selects one from among the plural word lines WL1~WLm according to the row address signal, and applies a predetermined voltage to the selected word line.

The column select circuit 304 receives a column address signal output from the address input circuit 309, selects one from among the plural bit lines BL1~BLn . . . according to the column address signal, and applies the write voltage or the read voltage to the selected bit line.

Receiving the write signal output from the control circuit 310, the write circuit 305 outputs to the column select circuit 304, a signal for causing application of the write voltage to the selected bit line.

In the read cycle of data, the sense amplifier 306 detects an amount of a current flowing in the selected bit line which is a read target, and determines the data as "2", "1" or "0." The resulting output data DO is output to the external circuit via the data input/output circuit 307.

In Embodiment 6 using the configuration of one transistor/one nonvolatile memory section, a storage capacity is smaller than that of the configuration using the cross-point nonvolatile memory section in Embodiment 5. However, since Embodiment 6 may dispense with the current suppressing element such as the diode, it has an advantage that it is easily combined with the CMOS process, and operation control therefor is easy.

As in Embodiment 5, the resistance variable layer of the present invention can be formed at a low temperature. Therefore, it is advantageous that transistors and wire material such as silicide formed in a lower layer step are not affected even when a layer structure is formed in a wiring step as illustrated in this embodiment.

Furthermore, as in Embodiment 5, since the film deposition of tantalum and tantalum oxide are easily incorporated into the existing semiconductor manufacturing process, the nonvolatile memory device of this embodiment can be easily manufactured.

Embodiment 7

A nonvolatile semiconductor device according to Embodiment 7 is a nonvolatile semiconductor device which includes the nonvolatile memory element according to Embodiment 1 to Embodiment 4 having a programming function and a logic circuit for executing predetermined calculation.

[Configuration of Nonvolatile Semiconductor Device]

Figure 31:
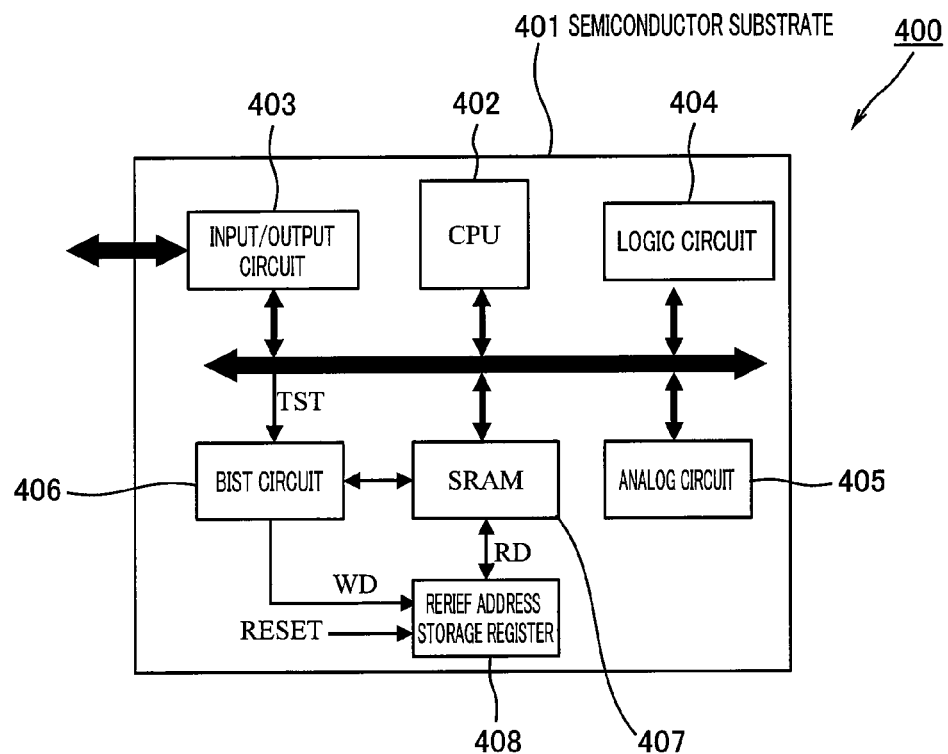
FIG. 31 is a block diagram showing a configuration of a nonvolatile semiconductor device according to Embodiment 7 of the present invention.

FIG. 31 is a block diagram showing a configuration of a nonvolatile semiconductor device according to Embodiment 7 of the present invention.

As shown in FIG. 31, a nonvolatile semiconductor device 400 according to this embodiment includes, on a semiconductor substrate 401, a CPU 402, an input/output circuit 403 for inputting/outputting data to/from an external circuit, a logic circuit 404 for executing predetermined calculation, an analog circuit 405 for processing an analog signal, a BIST (Built In Self Test) circuit 406 for performing self diagnosis, a SRAM 407, and a relief address storage register 408 which is connected to the BIST circuit 406 and to the SRAM 407 and serves to store specific address data.

Figure 32:
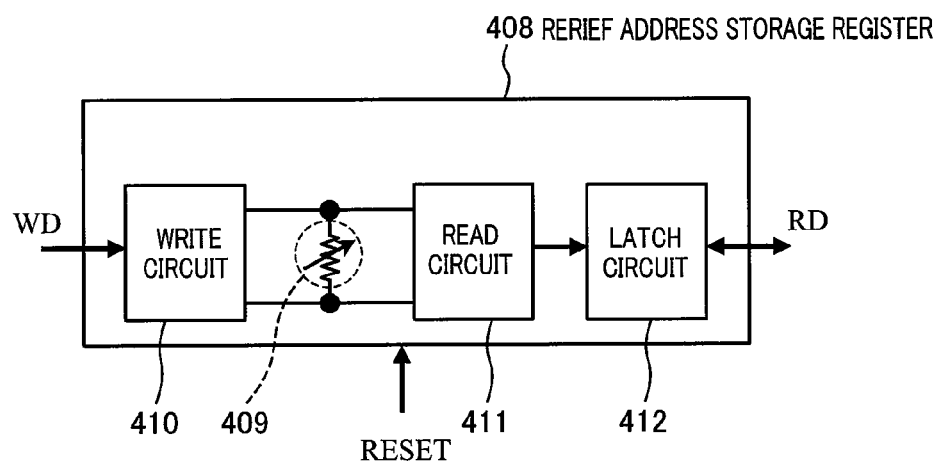
FIG. 32 is a block diagram showing a configuration of a relief address storage register included in a nonvolatile semiconductor device according to Embodiment 7 of the present invention.
Figure 33:
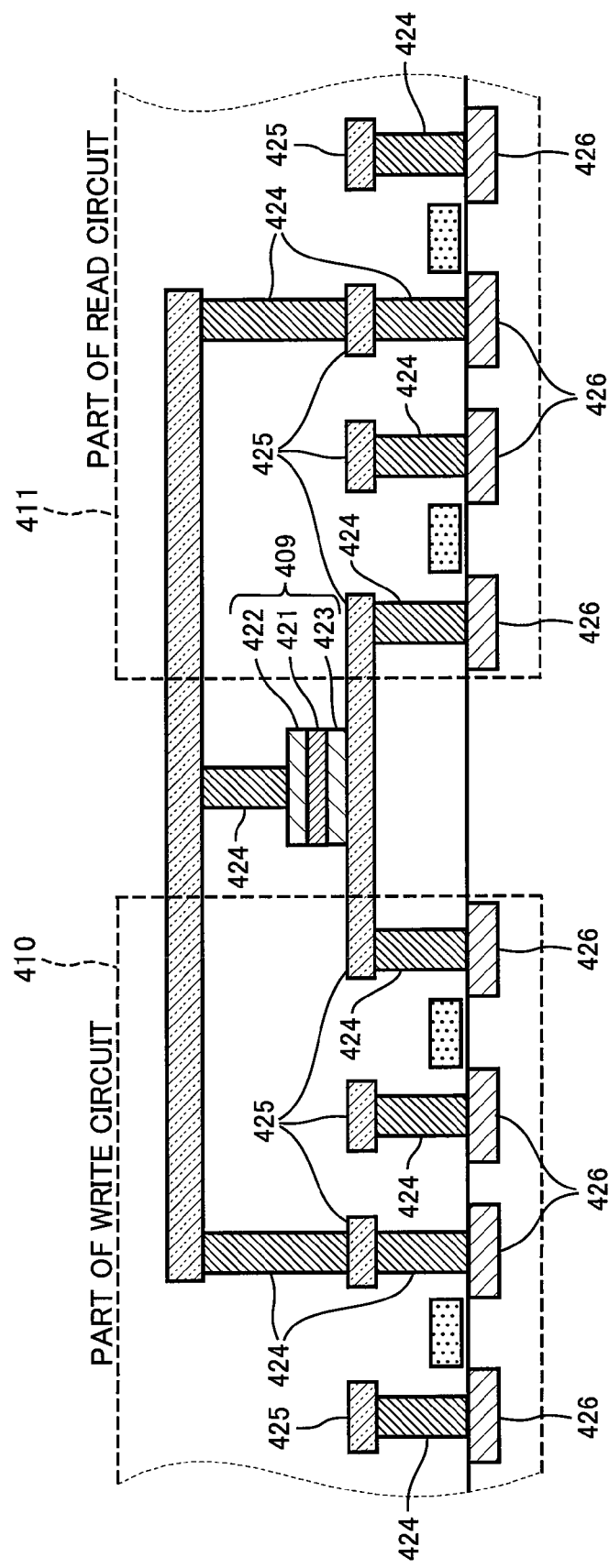
FIG. 33 is a cross-sectional view showing the configuration of the relief address resister.

FIG. 32 is a block diagram showing a configuration of a relief address storage register included in the nonvolatile semiconductor device according to Embodiment 7 of the present invention. FIG. 33 is a cross-sectional view showing a configuration of the relief address storage register.

As shown in FIGS. 32 and 33, the relief address storage register 408 includes a nonvolatile memory element 409 corresponding to the nonvolatile memory element according to Embodiment 1, a write circuit 410 for writing specific address data to the nonvolatile memory element 409, a read circuit 411 for reading the address data written in the nonvolatile memory element 409, and a latch circuit 412.

The nonvolatile memory element 409 is connected to a switch portion to the write circuit 410 side and a switch portion to the read circuit 411 side, and has a structure in which a resistance variable layer 421 is sandwiched between an upper electrode 422 and a lower electrode 423. The nonvolatile memory element 409 corresponds to the nonvolatile memory element according to Embodiment 1.

In FIG. 33, 424 denotes a plug layer, 425 denotes a metal wire layer, and 426 denotes a source/drain layer.

Whereas in this embodiment, two-layer wires are provided and the nonvolatile memory element is provided between the first wire and the second wire, multi-layer wires of three or more layers may alternately be provided and the nonvolatile memory element may be disposed between desired wires, for example. In further alternative, the nonvolatile memory element may be disposed between plural wires as desired.

[Example of Operation of Nonvolatile Semiconductor Device]

Subsequently, an example of the operation of the nonvolatile semiconductor device according to this embodiment configured as described above will be described.

Hereinafter, a case where the address data is written to the relief address storage register 408 will be described. The BIST circuit 406 inspects a memory block in the SRAM 407, upon reception of a diagnosis command signal TST.

The memory block is inspected during inspection in a manufacturing process of LSI, and during various diagnostic processes carried out in the case where the LSI is mounted to an actual system.

If a faulty cell is detected as a result of inspection of the memory block, the BIST circuit 406 outputs write data command signal WD to the relief address storage register 408. Receiving the write data command signal WD, the relief address storage register 408 stores therein address data corresponding to the faulty cell.

The address data is stored by switching the resistance state of the resistance variable layer in the associated register to the high-resistance state or to the low-resistance state, according to the address data. The switching of the resistance variable layer to the high-resistance state or to the low-resistance state is performed as in Embodiment 1.

In this way, the address data is written to the relief address storage register 408. When the SRAM 407 is accessed, the address data written in the relief address storage register 408 is read simultaneously. The address data is read by detecting an output current value corresponding to the resistance state of the resistance variable layer as in Embodiment 1.

When the address data read from the relief address storage register 408 matches the address data of an access target, backup memory cells for redundancy provided within the SRAM 407 is accessed, so that data is read or written.

The self diagnosis performed as described above eliminates a need for an expensive LSI tester provided externally, in inspection in the manufacturing process. In addition, Embodiment 7 has an advantage that at Speed test can be conducted. Furthermore, Embodiment 7 has an advantage that since faulty cells due to deterioration with a time can be relieved as well as faulty cells in the inspection, a high quality can be maintained for a long period of time.

The nonvolatile semiconductor device according to this embodiment is applicable to a case where data is written only once in the manufacturing process and to a case where data is rewritten repeatedly after shipment of products.

[Method of Manufacturing Nonvolatile Semiconductor Device]

Subsequently, a manufacturing method of the nonvolatile semiconductor device according to this embodiment as configured described above will be described.

Figure 34:
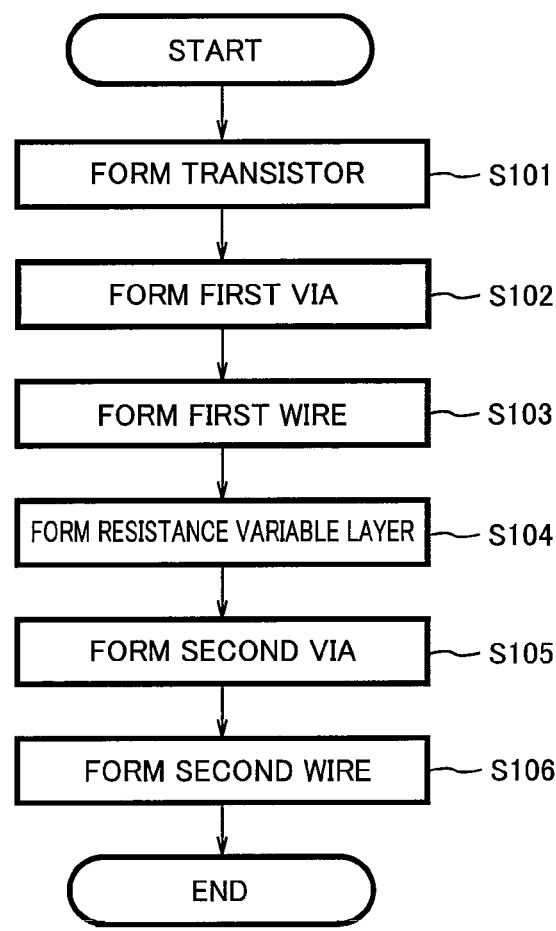
FIG. 34 is a flowchart showing a main flow of a manufacturing step of the nonvolatile semiconductor device according to Embodiment 7 of the present invention.
Figure 35:
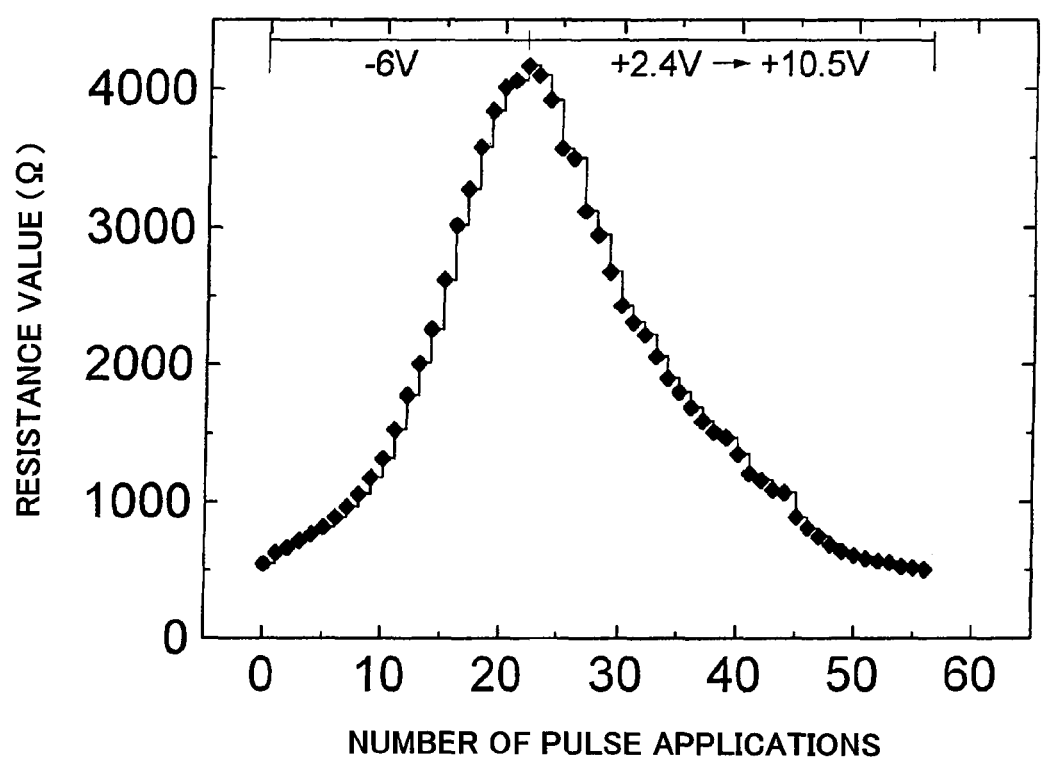
FIG. 35 is a view showing an example of resistance switching of an element including PCMO in response to an electric pulse, which is disclosed in Patent document 2.
Figure 36:
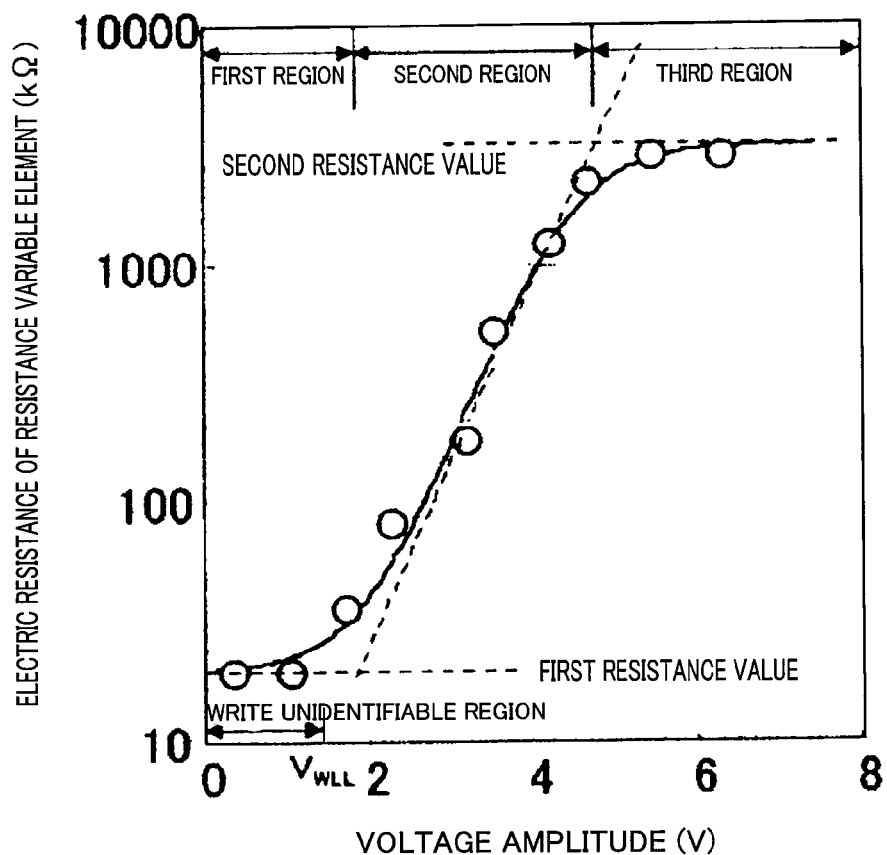
FIG. 36 is a view showing the relationship between the resistance value of the nonvolatile memory element including PCMO, or the like, the applied voltage and the resistance value, which is disclosed in Patent document 3.
Figure 37:
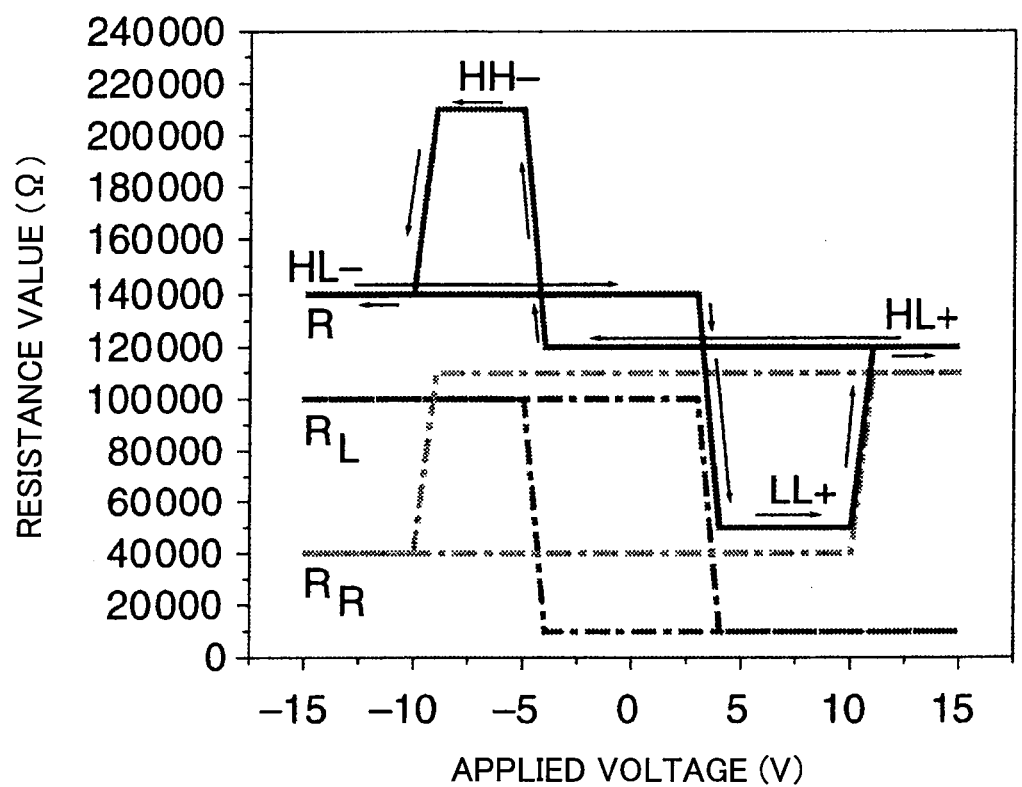
FIG. 37 is a view showing the relationship between the voltage and resistance associated with an element of Non-patent document 4.

FIG. 34 is a flowchart showing a main flow of a manufacturing process of the nonvolatile semiconductor device according to Embodiment 7 of the present invention.

Initially, a transistor is formed on the semiconductor substrate (S101). Then, a first via is formed (S102), and a first wire is formed thereon (S103).

Then, the resistance variable layer is formed on the first wire formed in S103 (S104). The resistance variable layer is formed as described in Embodiment 1.

Then, a second via is formed on the resistance variable layer (S105), and further, a second wire is formed thereon (S106).

As described above, the manufacturing method of the nonvolatile semiconductor device of this embodiment is such that the step of forming the electrodes and the resistance variable layer is added to the manufacturing process of the COMS process. Therefore, the nonvolatile semiconductor device can be easily manufactured by utilizing the existing CMOS process. In addition, since additional steps are fewer and the layer thickness of the resistance variable layer is relatively small, the time of the process can be shortened.

As in Embodiment 5, the resistance variable layer of the present invention can be formed at a low temperature. Therefore, it is advantageous that transistors and wire material such as silicide formed in a lower layer step are not affected even when a layer structure is formed in a wiring step illustrated in this embodiment.

Since the electrode portion can be formed with 1 μm square or smaller and other circuits can be formed using the CMOS process, a small-sized nonvolatile switch circuit is easily attainable.

Instead of using the nonvolatile memory element including the resistance variable layer including tantalum oxide in Embodiment 1, it may be presumed that the nonvolatile semiconductor device is attainable by using a known flash memory nonvolatile memory element or a known FeRAM memory nonvolatile memory element. In these cases, however, a special process step and material become necessary, which makes it difficult that these nonvolatile memory elements are compatible with the COMS process. For this reason, a cost problem arises, and the manufacturing steps significantly increases, which is not practical. Further, a problem arises, that these nonvolatile memory elements are difficult to use as the programming element, because write and read of data are complicated in these memory elements.

As a configuration which is compatible with the CMOS process, there is provided a memory cell called a CMOS nonvolatile memory cell, which operates equivalently to the flash memory cell by floating the gate wires in the COMS process. However, such a configuration arises problems that area of the element section increases and control of its operation is complicated.

The configuration using an electric fuse element such as a silicide fuse element may be compatible with the CMOS process. In this case, problems that rewrite of the data cannot be performed, and the area of the element section increases arise.

The wires may be trimmed by a known laser. In this case, however, problems will arise in which such a method is limited only in a manufacturing process, miniaturization is limited by a mechanical precision of a laser trimmer, or there is a limitation on layout, because the wires must be positioned as an uppermost layer.

Whereas the nonvolatile memory element in Embodiment 1 is used as the relief address storage register of the SRAM in this embodiment, the following examples may be alternatively used. For example, the nonvolatile memory element in Embodiment 1 may be used as the relief address storage register for faulty cells in DRAM, ROM, or the nonvolatile memory devices according to Embodiment 5 and Embodiment 6.

The nonvolatile memory element may be applied to a nonvolatile switch for switching a faulty logic circuit or a backup logic circuit. Furthermore, the nonvolatile memory element may be used as a register for adjusting a voltage in an analog circuit and for adjusting timing in the analog circuit, a register for modifying a ROM of post-manufacture, a nonvolatile switch element for reconfigurable logic and EPGA, and a nonvolatile register.

Other Embodiment

The nonvolatile semiconductor device according to Embodiment 7 may be configured to include the nonvolatile memory device according to Embodiment 5, that is, to integrate on one semiconductor substrate the cross-point nonvolatile memory device according to Embodiment 5 and the LSI having the CPU or the like according to Embodiment 7.

In this case, the cross-point nonvolatile memory device according to Embodiment 5 and the LSI having the CPU or the like according to Embodiment 7 may be formed on different semiconductor substrates, and thereafter may be molded into one package.

The nonvolatile semiconductor device according to Embodiment 7 may be configured to include the nonvolatile memory device according to Embodiment 6, that is, to integrate on one semiconductor substrate the nonvolatile memory device having the one transistor/one nonvolatile memory section configuration according to Embodiment 6 and the LSI having the CPU or the like according to Embodiment 7.

In this case, also, the nonvolatile memory device having the one transistor/one nonvolatile memory section configuration according to Embodiment 6 and the LSI having the CPU or the like according to Embodiment 7 may be formed on different semiconductor substrates, and thereafter may be molded into one package.

The nonvolatile memory elements used in Embodiment 5 to Embodiment 7 are not limited to those in Embodiment 1 but may be those in Embodiment 2 to Embodiment 4.

The nonvolatile memory element of the present invention is not necessarily limited to the configurations shown in Embodiment 1 to Embodiment 4, but may have other configuration. The configuration (1) in which the electrode material is made different between the lower electrode side and the upper electrode side, the configuration (2) in which the contact area of the electrode and the resistance variable layer is made different between the lower electrode side and the upper electrode side, and the configuration (3) in which the oxygen content of the resistance variable layer is made different between the lower electrode side and the upper electrode side may be combined as desired. Alternatively, other constituents may be used to form a vertically asymmetric structure. For example, the material of the resistance variable layer may be made different between the lower electrode side and the upper electrode side, or the shape of the electrode may be made different between the lower electrode side and the upper electrode side. Any method may be used to form an asymmetric structure between the lower electrode side and the upper electrode side so long as the absolute value of the voltage for switching the resistance state or a switching magnitude of the resistance value is made different between the lower electrode side and the upper electrode side.

INDUSTRIAL APPLICABILITY

A nonvolatile memory element, a nonvolatile memory device, and a nonvolatile semiconductor device of the present invention are useful as a nonvolatile memory element capable of stably writing and reading multi-valued data, a nonvolatile memory device and nonvolatile semiconductor device incorporating the nonvolatile memory element.

| EXPLANATION OF REFERENCE NUMELALS | |
|---|---|
| 10 | element |
| 11, 12, 13, 14 | electrodes |
| 15 | resistance variable layer |
| 100, 110, 150, 170, 180 | nonvolatile memory elements |
| 101, 111, 151, 171, 181 | substrates |
| 102, 112, 152, 172, 182 | oxide layers |
| 103, 113, 153, 173, 183 | lower electrode layers |
| 104, 154, 174 | resistance variable layers |

EXPLANATION OF REFERENCE NUMELALS

| | |
|---|---|
| 114, 184 | first resistance variable layers |
| 115, 185 | second resistance variable layers |
| 105, 116, 155, 175, 186 | upper electrode layers |
| 110 | nonvolatile memory element |
| 150 | nonvolatile memory element |
| 151 | substrate |
| 152 | oxide layer |
| 200 | nonvolatile memory device |
| 201 | memory main section |
| 202 | memory array |
| 203 | row select circuit/driver |
| 204 | column select circuit/driver |
| 205 | write circuit |
| 206 | sense amplifier |
| 207 | data input/output circuit |
| 208 | address input circuit |
| 209 | control circuit |
| 211 | upper wire |
| 212 | lower wire |
| 213 | upper electrode |
| 214 | resistance variable layer |
| 215 | inner electrode |
| 216 | current suppressing element |
| 217 | lower electrode |
| 218 | ohmic resistance layer |
| 300 | nonvolatile memory device |
| 301 | memory main section |
| 302 | memory array |
| 303 | row select circuit/driver |
| 304 | column select circuit |
| 305 | write circuit |
| 306 | sense amplifier |
| 307 | data input/output circuit |
| 308 | cell plate electric power supply |
| 309 | address input circuit |
| 310 | control circuit |
| 314 | upper electrode |
| 315 | resistance variable layer |
| 316 | lower electrode |
| 400 | nonvolatile semiconductor device |
| 401 | semiconductor substrate |
| 402 | CPU |
| 403 | input/output circuit |
| 404 | logic circuit |
| 405 | analog circuit |
| 406 | BIST circuit |
| 407 | SRAM |
| 408 | relief address storage register |
| 409 | nonvolatile memory element |
| 410 | write circuit |
| 411 | read circuit |
| 412 | latch circuit |
| WL1~WLm | word lines |
| BL1~BLn | bit lines |
| M1$_{11}$~M1$_{mn}$ | memory cells (nonvolatile memory elements) |
| M2$_{11}$~M2$_{mn}$ | memory cells (nonvolatile memory elements) |
| T$_{11}$~T$_{mn}$ | transistors |

The invention claimed is:

1. A nonvolatile memory element comprising:
a first electrode;
a second electrode; and
a resistance variable layer which is provided between the first electrode and the second electrode, and is configured to reversibly switch an interelectrode resistance value which is a resistance value between the first electrode and the second electrode, in response to an interelectrode voltage which is an electric potential of the second electrode on the basis of the first electrode;
wherein the resistance variable layer includes an oxygen-deficient transition metal oxide;
wherein the first electrode side and the second electrode side have an asymmetric structure; and
wherein a portion of the resistance variable layer which is located at the first electrode side and a portion of the resistance variable layer which is located at the second electrode side are each configured to be selectively placed into one of a low-resistance state and a high-resistance state, so as to attain a stable state in three or more different interelectrode resistance values, the stable state being a state in which the interelectrode resistance value is invariable regardless of a change in the interelectrode voltage within a specified range.

2. The nonvolatile memory element according to claim 1, wherein the oxygen-deficient transition metal oxide has an amorphous structure.

3. The nonvolatile memory element according to claim 1, wherein the first electrode side and the second electrode side have an asymmetric structure such that the first electrode and the second electrode are made of different materials.

4. The nonvolatile memory element according to claim 1, wherein the first electrode side and the second electrode side have an asymmetric structure such that an oxygen content of a portion of the resistance variable layer which is located in the vicinity of the first electrode is different from an oxygen content of a portion of the resistance variable layer which is located in the vicinity of the second electrode.

5. The nonvolatile memory element according to claim 1, wherein the first electrode side and the second electrode side have an asymmetric structure such that an area of a portion of the resistance variable layer which is in contact with the first electrode is different from an area of a portion of the resistance variable layer which is in contact with the second electrode.

6. A nonvolatile memory device comprising:
the nonvolatile memory element according to claim 1; and
a controller configured to control the interelectrode voltage;
wherein the controller is configured to make the interelectrode voltage different based on the interelectrode resistance value such that the interelectrode resistance value conforms to one of at least three resistance values, to store data more than binary data in a single nonvolatile memory element.

7. The nonvolatile memory element according to claim 1, wherein each of the first electrode and the second electrode includes a material selected from a group consisting of Pt, Ir, Au, Ag, Cu, W, Ni, and TaN.

8. The nonvolatile memory element according to claim 7, wherein one of the first electrode and the second electrode includes W and the other of the first electrode and the second electrode includes Pt.

9. The nonvolatile memory element according to claim 1, wherein the oxygen-deficient transition metal oxide is a tantalum oxide.

10. The nonvolatile memory element according to claim 1, wherein the oxygen-deficient transition metal oxide included in the resistance variable layer is a tantalum oxide and is configured to satisfy $0<x<2.5$ when the tantalum oxide is expressed as TaOx.

11. The nonvolatile memory element according to claim 1, wherein the oxygen-deficient transition metal oxide included in the resistance variable layer is a tantalum oxide and is configured to satisfy $0.8 \leq x \leq 1.9$ when the tantalum oxide is expressed as TaOx.

12. The nonvolatile memory element according to claim 1, wherein in $V_\alpha$, $V_\beta$, $V_\gamma$, $R_L$, $R_M$, and $R_H$ satisfying $V_\alpha < V_\beta < V_\gamma$, $V_\alpha < 0$, $V_\gamma > 0$, and $R_L < R_M < R_H$, the interelectrode resistance value becomes $R_L$ or $R_M$ when the interelectrode voltage is set to $V_\alpha$, the interelectrode resistance value becomes $R_M$ or $R_H$ when the interelectrode voltage is set to $V_\beta$, and the interelectrode resistance value becomes $R_L$ or $R_H$ when the interelectrode voltage is set to $V_\gamma$.

13. The nonvolatile memory element according to claim 12, wherein the first electrode and the second electrode are made of different materials.

14. The nonvolatile memory element according to claim 12, wherein an oxygen content of a portion of the resistance variable layer which is located in the vicinity of the first electrode is different from an oxygen content of a portion of the resistance variable layer which is located in the vicinity of the second electrode.

15. The nonvolatile memory element according to claim 12, wherein the oxygen-deficient transition metal oxide is a tantalum oxide.

16. The nonvolatile memory element according to claim 12, wherein the oxygen-deficient transition metal oxide is a tantalum oxide and is configured to satisfy $0 < x < 2.5$ when the tantalum oxide is expressed as $TaO_x$.

17. The nonvolatile memory element according to claim 12, wherein the oxygen-deficient transition metal oxide is a tantalum oxide and is configured to satisfy $0.8 \leq x \leq 1.9$ when the tantalum oxide is expressed as $TaO_x$.

18. The nonvolatile memory element according to claim 1, wherein in $V_1$, $V_2$, $V_3$, $V_4$, $V_5$, $V_6$, $V_7$, $V_8$, $V_9$, $V_{10}$, $R_L$, $R_M$, and $R_H$ satisfying $V_1 < V_2 < V_3 < V_4 < V_5 < 0 < V_6 < V_7 < V_8 < V_9 < V_{10}$ and $R_L < R_M < R_H$, the interelectrode resistance value becomes $R_M$ when the interelectrode voltage is set to $V_1$, then, the interelectrode resistance value decreases when the interelectrode voltage is set higher than $V_6$ and lower than $V_7$, then, the interelectrode resistance value becomes $R_L$ when the interelectrode voltage is set to $V_8$, then, the interelectrode resistance value increases when the interelectrode voltage is set higher than $V_9$ and lower than $V_{10}$, then, the interelectrode resistance value becomes $R_H$ when the interelectrode voltage is set to $V_{10}$, then, the interelectrode resistance value decreases when the interelectrode voltage is set lower than $V_5$ and higher than $V_4$, then, the interelectrode resistance value becomes $R_L$ when the interelectrode voltage is set to $V_3$, and then, the interelectrode resistance value increases when the interelectrode voltage is set lower than $V_2$ and higher than $V_1$.

19. The nonvolatile memory element according to claim 1, wherein in $V_\alpha$, $V_\beta$, $V_\gamma$, $R_L$, $R_M$, and $R_H$ satisfying $V_\alpha < V_\beta < V_\gamma$, $V_\alpha < 0$, $V_\gamma > 0$, and $R_L < R_M < R_H$, the interelectrode resistance value becomes $R_L$ or $R_H$ when the interelectrode voltage is set to $V_\alpha$, the interelectrode resistance value becomes $R_M$ or $R_H$ when the interelectrode voltage is set to $V_\beta$, and the interelectrode resistance value becomes $R_L$ or $R_M$ when the interelectrode voltage is set to $V_\gamma$.

20. The nonvolatile memory element according to claim 1, wherein in $V_1$, $V_2$, $V_3$, $V_4$, $V_5$, $V_6$, $V_7$, $V_8$, $V_9$, $V_{10}$, $R_L$, $R_M$, and $R_H$ satisfying $V_1 < V_2 < V_3 < V_4 < V_5 < 0 < V_6 < V_7 < V_8 < V_9 < V_{10}$, and $R_L < R_M < R_H$, the interelectrode resistance value becomes $R_H$ when the interelectrode voltage is set to $V_1$, then, the interelectrode resistance value decreases when the interelectrode voltage is set higher than $V_6$ and lower than $V_7$, then, the interelectrode resistance value becomes $R_L$ when the interelectrode voltage is set to $V_8$, then, the interelectrode resistance value increases when the interelectrode voltage is set higher than $V_9$ and lower than $V_{10}$, then, the interelectrode resistance value becomes $R_M$ when the interelectrode voltage is set to $V_{10}$, then, the interelectrode resistance value decreases when the interelectrode voltage is set lower than $V_5$ and higher than $V_4$, then, the interelectrode resistance value becomes $R_L$ when the interelectrode voltage is set to $V_3$, and then, the interelectrode resistance value increases when the interelectrode voltage is set lower than $V_2$ and higher than $V_1$.

21. The nonvolatile memory element according to claim 1, wherein in $V_\alpha$, $V_\beta$, $V_\gamma$, $R_L$, $R_M$, and $R_H$ satisfying $V_\alpha < V_\beta < V_\gamma$, $V_\alpha < 0$, $V_\gamma > 0$, and $R_L < R_M < R_H$, the interelectrode resistance value becomes $R_L$ or $R_M$ when the interelectrode voltage is set to $V_\alpha$, the interelectrode resistance value becomes $R_M$ when the interelectrode voltage is set to $V_\beta$, and the interelectrode resistance value becomes $R_M$ or $R_H$ when the interelectrode voltage is set to $V_\gamma$.

22. The nonvolatile memory element according to claim 21, wherein an area of a portion of the resistance variable layer which is in contact with the first electrode is different from an area of a portion of the resistance variable layer which is in contact with the second electrode.

23. The nonvolatile memory element according to claim 1, wherein in $V_1$, $V_2$, $V_3$, $V_4$, $V_5$, $V_6$, $V_7$, $V_8$, $V_9$, $V_{10}$, $R_L$, $R_M$, and $R_H$ satisfying $V_1 < V_2 < V_3 < V_4 < V_5 < 0 < V_6 < V_7 < V_8 < V_9 < V_{10}$, and $R_L < R_M < R_H$, the interelectrode resistance value becomes $R_M$ when the interelectrode voltage is set to $V_1$, then, the interelectrode resistance value increases when the interelectrode voltage is set higher than $V_6$ and lower than $V_7$, then, the interelectrode resistance value becomes $R_H$ when the interelectrode voltage is set to $V_8$, then, the interelectrode resistance value decreases when the interelectrode voltage is set higher than $V_9$ and lower than $V_{10}$, then, the interelectrode resistance value becomes $R_M$ when the interelectrode voltage is set to $V_{10}$, then, the interelectrode resistance value decreases when the interelectrode voltage is set lower than $V_5$ and higher than $V_4$, then, the interelectrode resistance value becomes $R_L$ when the interelectrode voltage is set to $V_3$, and then, the interelectrode resistance value increases when the interelectrode voltage is set lower than $V_2$ and higher than $V_1$.

24. The nonvolatile memory element according to claim 1, wherein in $V_\alpha$, $V_\beta$, $V_\gamma$, $R_L$, $R_M$, and $R_H$ satisfying $V_\alpha < V_\beta < V_\gamma$, $V_\alpha < 0$, $V_\gamma > 0$, and $R_L < R_M < R_H$, the interelectrode resistance value becomes $R_M$ or $R_H$ when the interelectrode voltage is set to $V_\alpha$, the interelectrode resistance value becomes $R_M$ when the interelectrode voltage is set to $V_\beta$, and the interelectrode resistance value becomes $R_L$ or $R_M$ when the interelectrode voltage is set to $V_\gamma$.

25. The nonvolatile memory element according to claim 1, wherein in $V_1, V_2, V_3, V_4, V_5, V_6, V_7, V_8, V_9, V_{10}, R_L, R_M$, and $R_H$ satisfying $V_1 < V_2 < V_3 < V_4 < V_5 < 0 < V_6 < V_7 < V_8 < V_9 < V_{10}$, and $R_L < R_M < R_H$, the interelectrode resistance value becomes $R_M$ when the interelectrode voltage is set to $V_1$, then, the interelectrode resistance value decreases when the interelectrode voltage is set higher than $V_6$ and lower than $V_7$, then, the interelectrode resistance value becomes $R_L$ when the interelectrode voltage is set to $V_8$, then, the interelectrode resistance value increases when the interelectrode voltage is set higher than $V_9$ and lower than $V_{10}$, then, the interelectrode resistance value becomes $R_M$ when the interelectrode voltage is set to $V_{10}$, then, the interelectrode resistance value increases when the interelectrode voltage is set lower than $V_5$ and higher than $V_4$, then, the interelectrode resistance value becomes $R_H$ when the interelectrode voltage is set to $V_3$, and then, the interelectrode resistance value decreases when the interelectrode voltage is set lower than $V_2$ and higher than $V_1$.

26. The nonvolatile memory element according to claim 1, wherein in $V_\alpha$, $V_\beta$, $V_\gamma$, $R_L$, $R_{M1}$, $R_{M2}$ and $R_H$ satisfying $V_\alpha < V_\beta < V_\gamma$, $V_\alpha < 0$, $V_\gamma > 0$, and $R_L < R_{M1} < R_{M2} < R_H$, the interelectrode resistance value becomes $R_L$ or $R_{M1}$ when the interelectrode voltage is set to $V_\alpha$, the interelectrode resistance value becomes $R_{M1}$ or $R_{M2}$ when the interelectrode voltage is set to $V_\beta$, and the interelectrode resistance value becomes $R_{M2}$ or $R_H$ when the interelectrode voltage is set to $V_\gamma$.

27. The nonvolatile memory element according to claim 26, wherein the first electrode and the second electrode are made of different materials, and an area of a portion of the resistance variable layer which is in contact with the first electrode is different from an area of a portion of the resistance variable layer which is in contact with the second electrode.

28. The nonvolatile memory element according to claim 26, wherein an oxygen content of a portion of the resistance variable layer which is located in the vicinity of the first electrode is different from an oxygen content of a portion of the resistance variable layer which is located in the vicinity of the second electrode, and an area of a portion of the resistance variable layer which is in contact with the first electrode is different from an area of a portion of the resistance variable layer which is in contact with the second electrode.

29. The nonvolatile memory element according to claim 1, wherein in $V_1, V_2, V_3, V_4, V_5, V_6, V_7, V_8, V_9, V_{10}, R_L, R_{M1}, R_{M2}$, and $R_H$ satisfying $V_1 < V_2 < V_3 < V_4 < V_5 < 0 < V_6 < V_7 < V_8 < V_9 < V_{10}$, and $R_L < R_{M1} < R_{M2} < R_H$, the interelectrode resistance value becomes $R_{M1}$ when the interelectrode voltage is set to $V_1$, then, the interelectrode resistance value increases when the interelectrode voltage is set higher than $V_6$ and lower than $V_7$, then, the interelectrode resistance value becomes $R_H$ when the interelectrode voltage is set to $V_8$, then, the interelectrode resistance value decreases when the interelectrode voltage is set higher than $V_9$ and lower than $V_{10}$, then, the interelectrode resistance value becomes $R_{M2}$ when the interelectrode voltage is set to $V_{10}$, then, the interelectrode resistance value decreases when the interelectrode voltage is set lower than $V_5$ and higher than $V_4$, then, the interelectrode resistance value becomes $R_L$ when the interelectrode voltage is set to $V_3$, and then, the interelectrode resistance value increases when the interelectrode voltage is set lower than $V_2$ and higher than $V_1$.

30. The nonvolatile memory element according to claim 1, wherein in $V_\alpha$, $V_\beta$, $V_\gamma$, $R_L$, $R_{M1}$, $R_{M2}$ and $R_H$ satisfying $V_\alpha < V_\beta < V_\gamma$, $V_\alpha < 0$, $V_\gamma > 0$, and $R_L < R_{M1} < R_{M2} < R_H$, the interelectrode resistance value becomes $R_{M2}$ or $R_H$ when the interelectrode voltage is set to $V_\alpha$, the interelectrode resistance value becomes $R_{M1}$ or $R_{M2}$ when the interelectrode voltage is set to $V_\beta$, and the interelectrode resistance value becomes $R_L$ or $R_{M1}$ when the interelectrode voltage is set to $V_\gamma$.

31. The nonvolatile memory element according to claim 1, wherein in $V_1, V_2, V_3, V_4, V_5, V_6, V_7, V_8, V_9, V_{10}, R_L, R_{M1}, R_{M2}$ and $R_H$ satisfying $V_1 < V_2 < V_3 < V_4 < V_5 < 0 < V_6 < V_7 < V_8 < V_9 < V_{10}$, and $R_L < R_{M1} < R_{M2} < R_H$, the interelectrode resistance value becomes $R_{M2}$ when the interelectrode voltage is set to $V_1$, then, the interelectrode resistance value decreases when the interelectrode voltage is set higher than $V_6$ and lower than $V_7$, then, the interelectrode resistance value becomes $R_L$ when the interelectrode voltage is set to $V_8$, then, the interelectrode resistance value increases when the interelectrode voltage is set higher than $V_9$ and lower than $V_{10}$, then, the interelectrode resistance value becomes $R_{M1}$ when the interelectrode voltage is set to $V_{10}$, then, the interelectrode resistance value increases when the interelectrode voltage is set lower than $V_5$ and higher than $V_4$, then, the interelectrode resistance value becomes $R_H$ when the interelectrode voltage is set to $V_3$, and then, the interelectrode resistance value decreases when the interelectrode voltage is set lower than $V_2$ and higher than $V_1$.

32. A nonvolatile memory device comprising:

a memory array including plural first electrode wires formed to extend in parallel with each other on a first plane, plural second electrode wires formed so as to extend in parallel with each other on a second plane parallel to the first plane and so as to three-dimensionally cross the plural first electrode wires, and nonvolatile memory elements arranged so as to respectively correspond to three-dimensional cross points between the plural first electrode wires and the plural second electrode wires;

wherein each of the nonvolatile memory elements includes a resistance variable layer which is provided between the first electrode wire and the second electrode wire, and is configured to reversibly switch an inter-electrode-wire resistance value which is a resistance value between the first electrode wire and the second electrode wire, in response to an inter-electrode-wire voltage which is an electric potential of the second electrode wire on the basis of the first electrode wire;

wherein the resistance variable layer includes an oxygen-deficient transition metal oxide;

wherein the nonvolatile memory element has an asymmetric structure at the first electrode wire side and at the second electrode wire side; and wherein the nonvolatile memory element is configured to attain a stable state in three or more different inter-electrode-wire resistance values, the stable state being a state in which the inter-electrode-wire resistance value is invariable regardless of a change in the inter-electrode-wire voltage within a specified range.

33. The nonvolatile memory device according to claim 32, wherein each of the nonvolatile memory elements includes a first electrode connected to the first electrode wire and a second electrode connected to the second electrode wire; and wherein the resistance variable layer is provided between the first electrode and the second electrode and is configured to reversibly switch an interelectrode resistance value which is a resistance value between the first electrode and the second electrode, in response to an interelectrode voltage which is an electric potential of the second electrode on the basis of the first electrode.

34. The nonvolatile memory device according to claim 32, wherein each of the nonvolatile memory elements includes a current suppressing element between the first electrode wire and the second electrode wire; and wherein the current suppressing element is electrically connected to the resistance variable layer.

35. The nonvolatile memory device according to claim 32, comprising a multi-layer memory array in which plural layers of the memory array are stacked.

36. The nonvolatile memory device according to claim 32, wherein the oxygen-deficient transition metal oxide is a tantalum oxide.

37. The nonvolatile memory device according to claim 32, wherein the oxygen-deficient transition metal oxide is a tantalum oxide and is configured to satisfy 0<x<2.5 when the tantalum oxide is expressed as TaOx.

38. The nonvolatile memory device according to claim 32, wherein the oxygen-deficient transition metal oxide is a tantalum oxide and is configured to satisfy $0.8 \leq x \leq 1.9$ when the tantalum oxide is expressed as TaOx.

39. A nonvolatile memory device comprising:
a semiconductor substrate;
plural word lines and plural bit lines which are provided on the semiconductor substrate such that the plural word lines and the plural bit lines are arranged to cross each other;
plural transistors provided to respectively correspond to cross points between the plural word lines and the plural bit lines; and
plural nonvolatile memory elements provided to respectively correspond to the plural transistors such that one nonvolatile memory element corresponds to one transistor;
wherein each of the nonvolatile memory elements includes a first electrode, a second electrode, and a resistance variable layer which is provided between the first electrode and the second electrode and is configured to reversibly switch an interelectrode resistance value which is a resistance value between the first electrode and the second electrode, in response to an interelectrode voltage which is an electric potential of the second electrode on the basis of the first electrode;

wherein the resistance variable layer includes an oxygen-deficient transition metal oxide;

wherein the nonvolatile memory element has an asymmetric structure at the first electrode wire side and at the second electrode wire side; and wherein the nonvolatile memory element is configured to attain a stable state in three or more different interelectrode resistance values, the stable state being a state in which the interelectrode resistance value is invariable regardless of a change in the interelectrode voltage within a specified range.

40. A nonvolatile semiconductor device comprising:
a semiconductor substrate;
a logic circuit provided on the semiconductor substrate, for executing predetermined calculation; and
a nonvolatile memory element provided on the semiconductor substrate and having a programming function;
wherein the nonvolatile memory element includes a first electrode, a second electrode, and a resistance variable layer which is provided between the first electrode and the second electrode and is configured to reversibly switch an interelectrode resistance value which is a resistance value between the first electrode and the second electrode, in response to an interelectrode voltage which is an electric potential of the second electrode on the basis of the first electrode;

wherein the resistance variable layer includes an oxygen-deficient transition metal oxide;

wherein the nonvolatile memory element has an asymmetric structure at the first electrode wire side and at the second electrode wire side; and wherein the nonvolatile memory element is configured to attain a stable state in three or more different interelectrode resistance values, the stable state being a state in which the interelectrode resistance value is invariable, regardless of a change in the interelectrode voltage within a specified range.

41. A nonvolatile semiconductor device comprising:
the nonvolatile semiconductor device according to claim 40; and
the nonvolatile memory device according to claim 32.

42. The nonvolatile semiconductor device according to claim 40, wherein the oxygen-deficient transition metal oxide is a tantalum oxide.

43. The nonvolatile semiconductor device according to claim 40, wherein the oxygen-deficient transition metal oxide is a tantalum oxide and is configured to satisfy 0<x<2.5 when the tantalum oxide is expressed as TaOx.

44. The nonvolatile semiconductor device according to claim 40, wherein the oxygen-deficient transition metal oxide is a tantalum oxide and is configured to satisfy $0.8 \leq x \leq 1.9$ when the tantalum oxide is expressed as TaOx.

* * * * *